US007510760B2

(12) United States Patent
Malshe et al.

(10) Patent No.: US 7,510,760 B2
(45) Date of Patent: Mar. 31, 2009

(54) NANOPARTICLE COMPOSITIONS, COATINGS AND ARTICLES MADE THEREFROM, METHODS OF MAKING AND USING SAID COMPOSITIONS, COATINGS AND ARTICLES

(75) Inventors: Ajay P. Malshe, Fayetteville, AR (US); Wenping Jiang, Fayetteville, AR (US); William D. Brown, Fayetteville, AR (US)

(73) Assignee: Boardof Trustees of the University of Arkansas, Little Rock, AK (US)

( * ) Notice: Subject to any disclaimer, the term of this patent is extended or adjusted under 35 U.S.C. 154(b) by 0 days.

(21) Appl. No.: 11/074,597

(22) Filed: Mar. 7, 2005

(65) Prior Publication Data

US 2006/0199013 A1   Sep. 7, 2006

(51) Int. Cl.
*B32B 9/00* (2006.01)
(52) U.S. Cl. .................. 428/212; 51/307; 51/309; 428/408; 428/697; 428/698; 428/699; 428/701; 428/702
(58) Field of Classification Search ............... 428/212, 428/408, 697, 698, 699, 701, 702, 704; 51/307, 51/309
See application file for complete search history.

(56) References Cited

U.S. PATENT DOCUMENTS

| 4,334,928 | A | | 6/1982 | Hara et al. |
| 4,877,677 | A | * | 10/1989 | Hirochi et al. ............... 428/408 |
| 5,129,918 | A | | 7/1992 | Chattopadhay |
| 5,328,875 | A | | 7/1994 | Ueda et al. |
| 5,389,118 | A | | 2/1995 | Hinterman et al. |
| 5,391,422 | A | * | 2/1995 | Omori et al. ................ 428/408 |
| 5,466,642 | A | | 11/1995 | Tajima et al. |
| 5,503,913 | A | | 4/1996 | Konig et al. |
| 5,766,783 | A | | 6/1998 | Utsumi et al. |
| 5,830,813 | A | | 11/1998 | Yao et al. |
| 5,834,689 | A | | 11/1998 | Cook |
| 5,882,777 | A | | 3/1999 | Kukino et al. |
| 5,889,219 | A | * | 3/1999 | Moriguchi et al. ............ 75/236 |
| 5,897,751 | A | | 4/1999 | Makowiccki et al. |

(Continued)

OTHER PUBLICATIONS

Jiang, W. et al., "Cubic boron nitride (cBN) based nanocomposite coatings on cutting inserts with chip breakers for hard turning applications," Surface & Coatings Technology (2005) 200:1849-1854.
Malshe, A.P. et al., "Nanostructured coatings for machining and wear-resistant applications," JOM (2002) 28-30.
Russell, W.C. et al., "CBN-TiN composite coating using a novel combinatorial method—structure and performance in metal cutting," J. Mfg. Sci. Eng. (2003) 125:431-434.
Yedave, S.N. et al., "Novel composite CBN-TiN coating: synthesis and performance analysis," J. Mfg. Processes (2003) 5(2):154-162.

*Primary Examiner*—Archene Turner
(74) *Attorney, Agent, or Firm*—Michael Best & Friedrich LLP

(57) ABSTRACT

Compositions comprising nanoparticles, microparticles, and combinations thereof, the particles may be overcoated particles. Composite coatings and coated articles made therefrom, the coatings comprising mono or multi layers having a textured outer surface morphology, the layers may be continuous and/or discontinuous and may comprise different particle phases. Methods of making and using said compositions, coatings and coated articles.

21 Claims, 28 Drawing Sheets

SEM picture of cBN-TiCN coated insert

U.S. PATENT DOCUMENTS

| | | |
|---|---|---|
| 5,928,771 A | 7/1999 | DeWald, Jr. et al. |
| 6,196,910 B1 * | 3/2001 | Johnson et al. .............. 451/540 |
| 6,258,139 B1 * | 7/2001 | Jensen ........................ 428/698 |
| 6,258,237 B1 | 7/2001 | Gal-Or et al. |
| 6,372,012 B1 * | 4/2002 | Majagi et al. ................. 75/236 |
| 6,410,086 B1 * | 6/2002 | Brandon et al. .......... 427/248.1 |
| 6,484,826 B1 * | 11/2002 | Anderson et al. ........... 175/428 |
| 6,540,800 B2 * | 4/2003 | Sherman et al. ............... 51/309 |
| 6,607,782 B1 | 8/2003 | Malshe et al. |
| 6,933,049 B2 * | 8/2005 | Wan et al. .................... 428/408 |

* cited by examiner

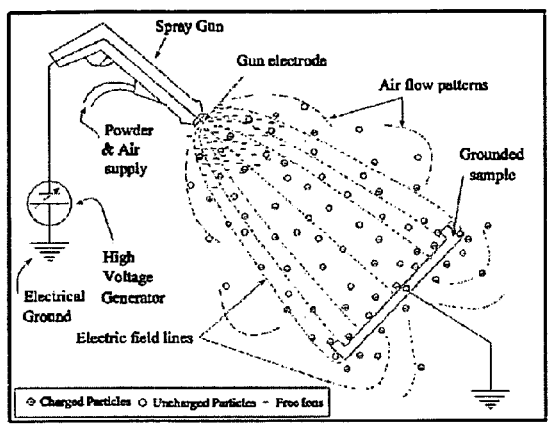
Figure 1: A schematic of ESC process
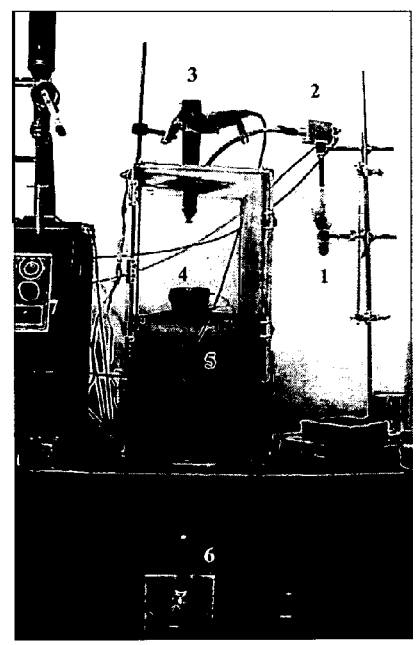
Figure 2: ESC setup used in this Phase I study

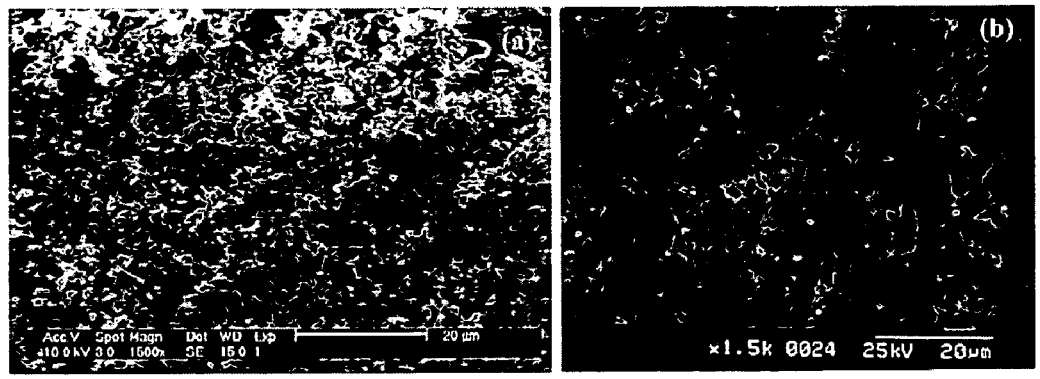

Figure 3: ESC deposited CBN on CNMA 432 (H21) for the creation of controlled surface morphology (a) submicron CBN deposited at -60 $kV$; (b) micron CBN deposition followed by submicron CBN deposition (in mass ratio of 1:0.75) at -60 $kV$.

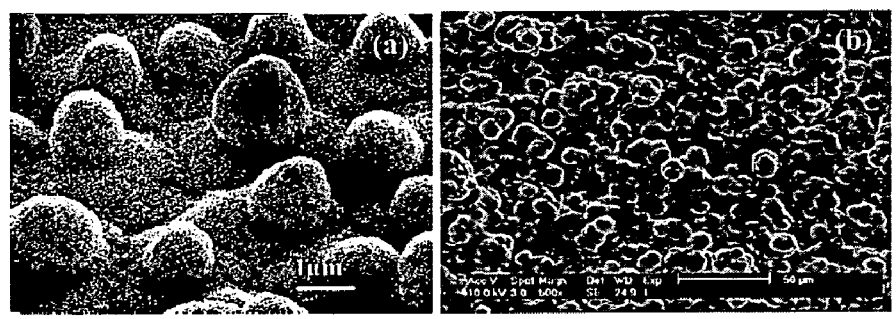

Figure 4: SEM pictures showing the similarity of the surface morphology of the synthesized hard coating (CBN-TiN) to that of lotus leaf: (a) surface morphology of lotus leaf; (b) surface morphology of the synthesized CBN-TiN coating.

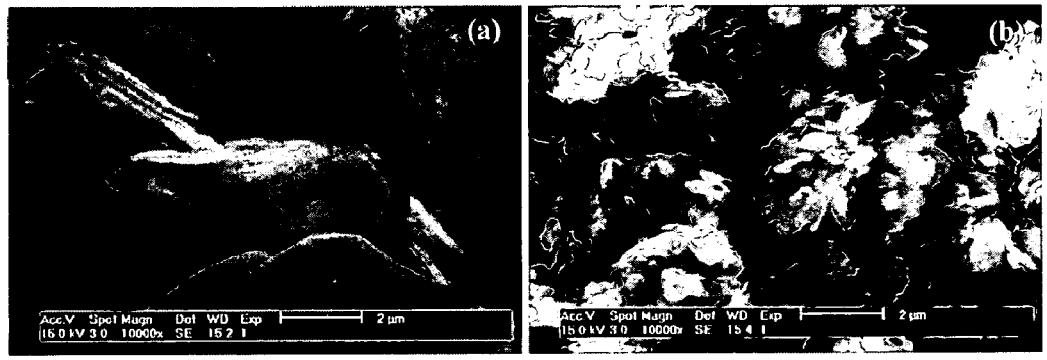
Figure 5: SEM pictures showing (a) as-purchased submicron MoS2 particles, and (b) ball-milled MoS2 nanoparticles.
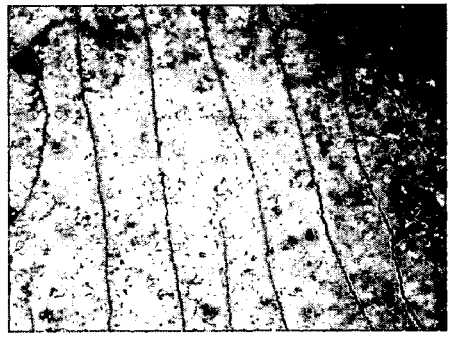
Figure 6: Optical micrograph showing the cracks formed in thick deposition (>25 µm) at each deposition cycle (black spots are $MoS_2$)

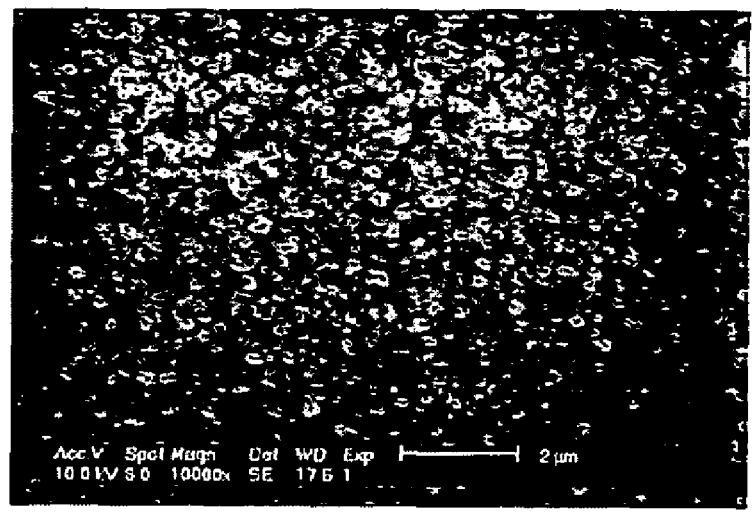
Figure 7: SEM picture showing the ESC deposition of MoS2-PTFE on CNMA 432 tool insert at optimized condition (thickness less than 12 μm).
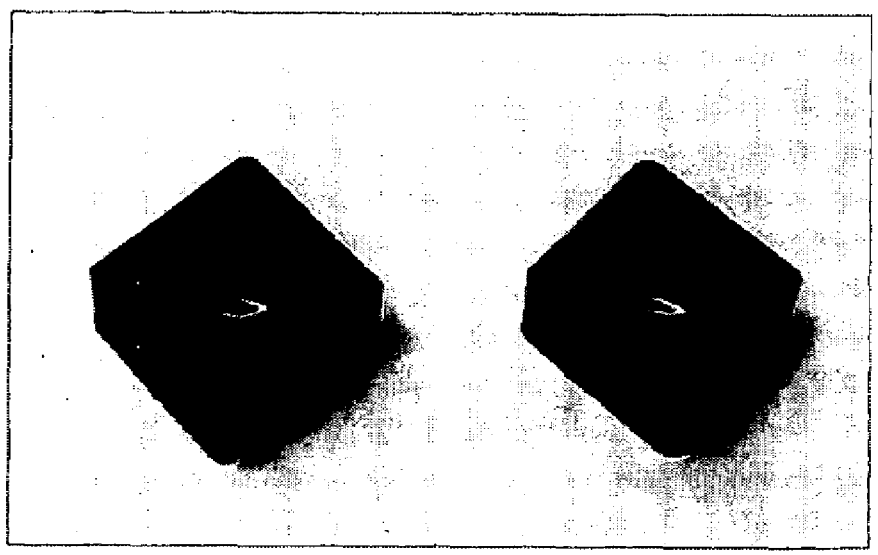
Figure 8: Picture showing nano MoS2-PTFE deposited on CBN-TiN (with controlled surface morphology) coated tool inserts.

Figure 9: Optical micrograph showing the exposed domes and lubricants in the receptacles after plasma etching for 5 minutes.

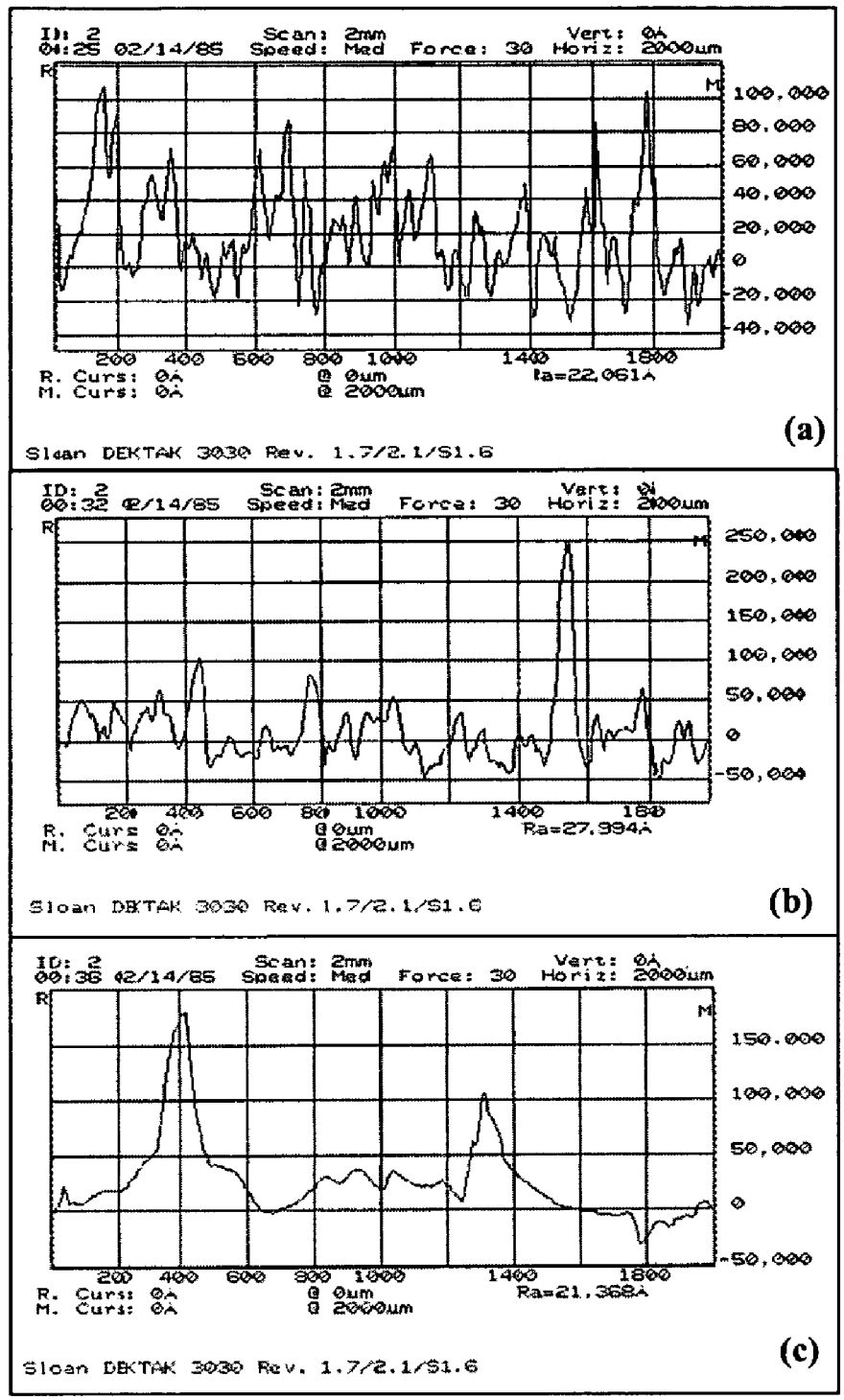
Figure 10: Surface roughness profile for (a) CBN-TiN coated tool with controlled surface morphology, (b) MoS$_2$-PTFE deposited on CBN-TiN, and (c) plasma etched MoS$_2$-PTFE/CBN-TiN.

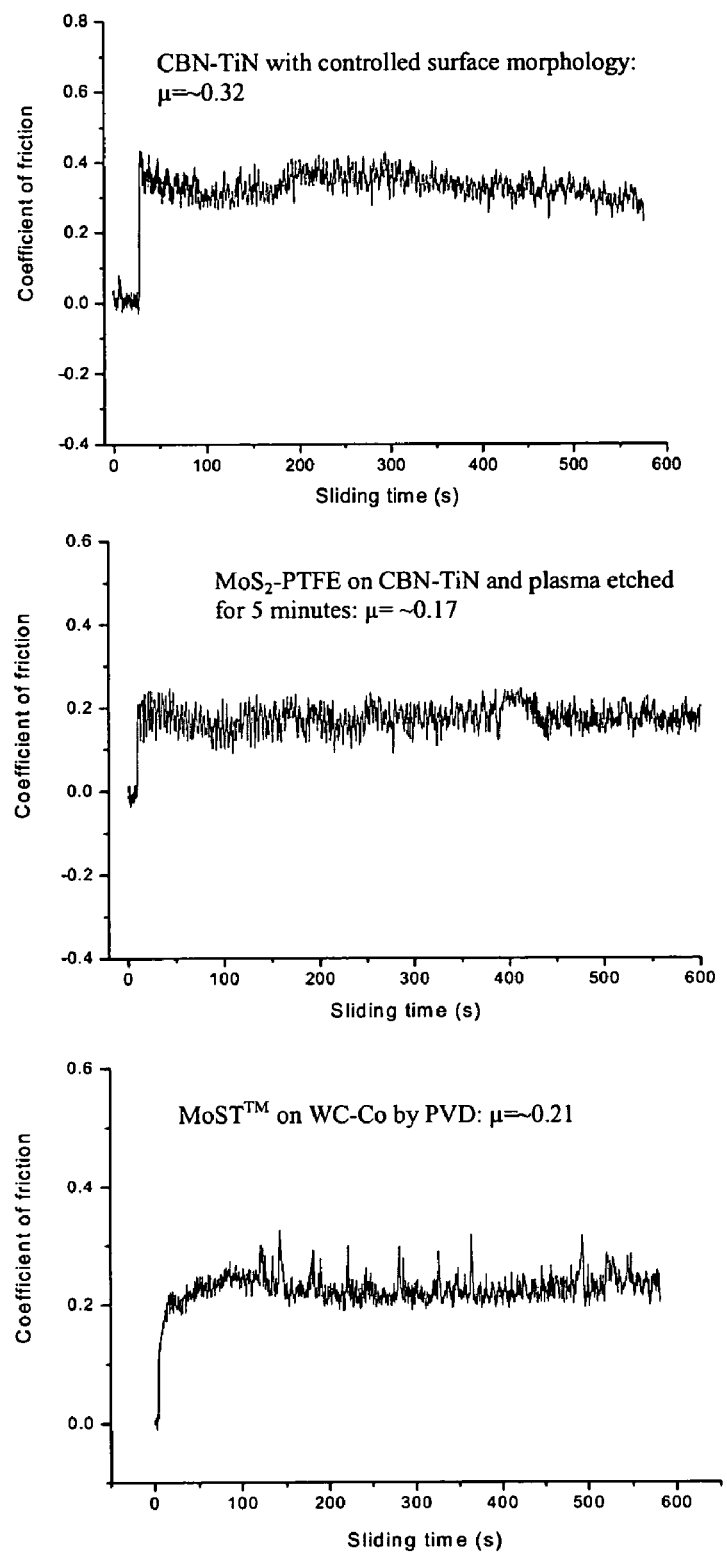
Figure 11: Coefficient of friction of different coatings (listed in the legend) on WC-Co (CNMA 432, HA) against 52100 hardened ball.

Figure 12. Surface Morphology of CBN-TiN coated tool insert
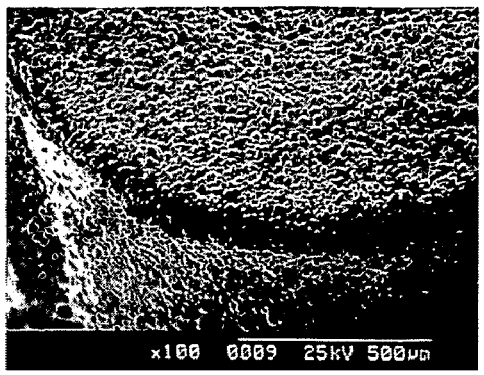
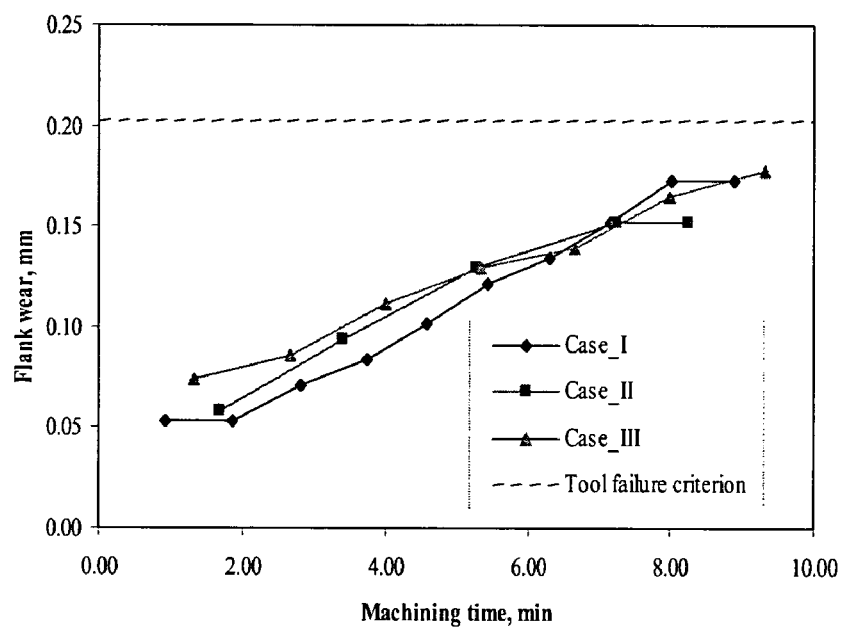
Figure 13. Flank wear progression of CBN-TiN coated carbide tool inserts (SNMG 432 VC29, V=100 m/min, f=0.2 mm/rev, DOC=0.508mm. Each curve is for s single tip).

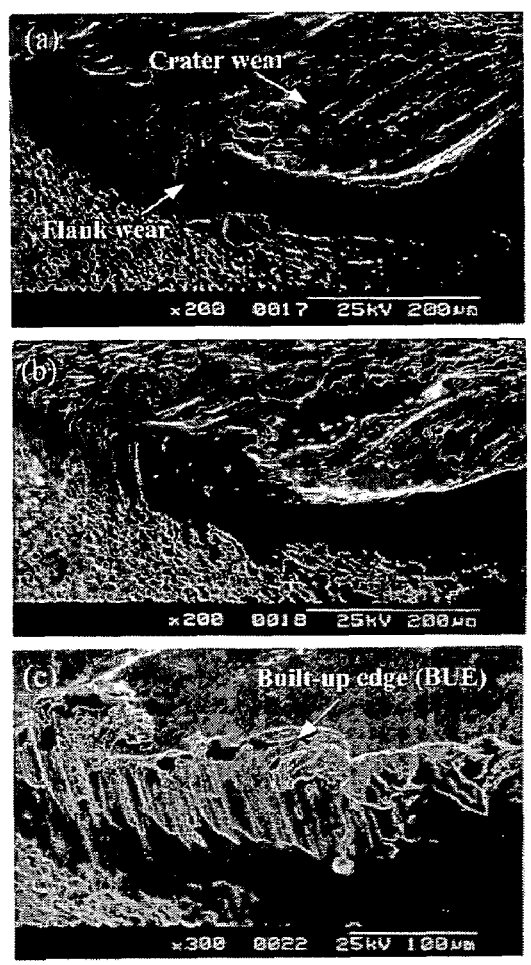
Figure 14. SEM micrographs of the worn CBN-TiN coated tool inserts (a) case I (b) case II (c) case III.

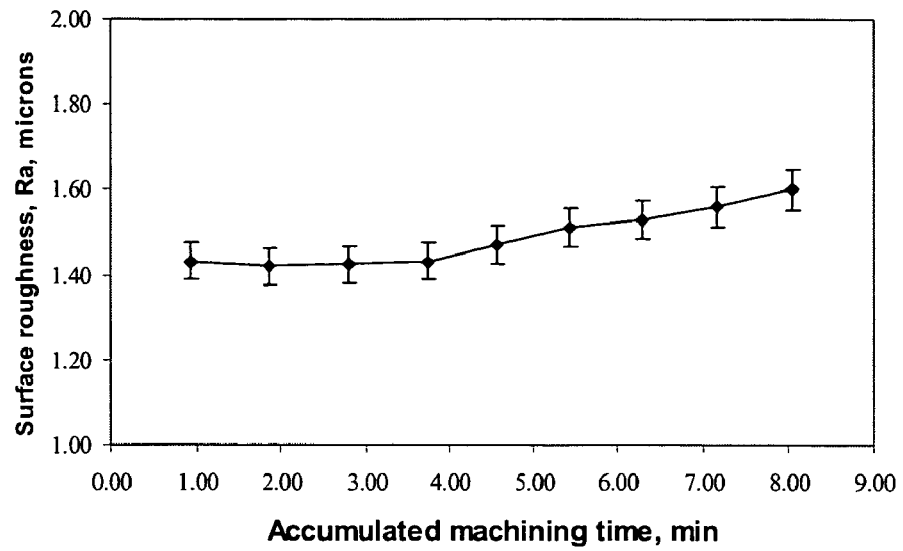
Figure 15. Surface roughness (Ra) of the workpiece machined using the CBN-TiN coated tool inserts.
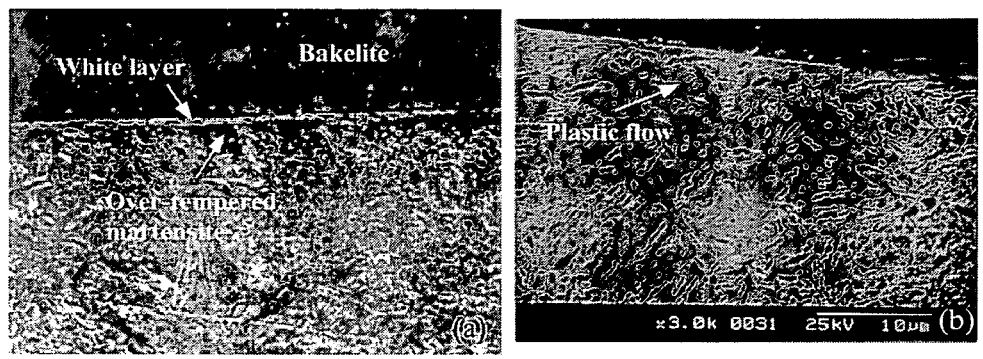
Figure 16. Micrographs showing (a) microstructure of surface layer of the machined AISI 4340 steel bar (1000×, 5% natal etchant), and (b) plastic flow observed in the sub-surface.

Figure 17. Load-displacement curves for bulk AISI 4340 and white layer
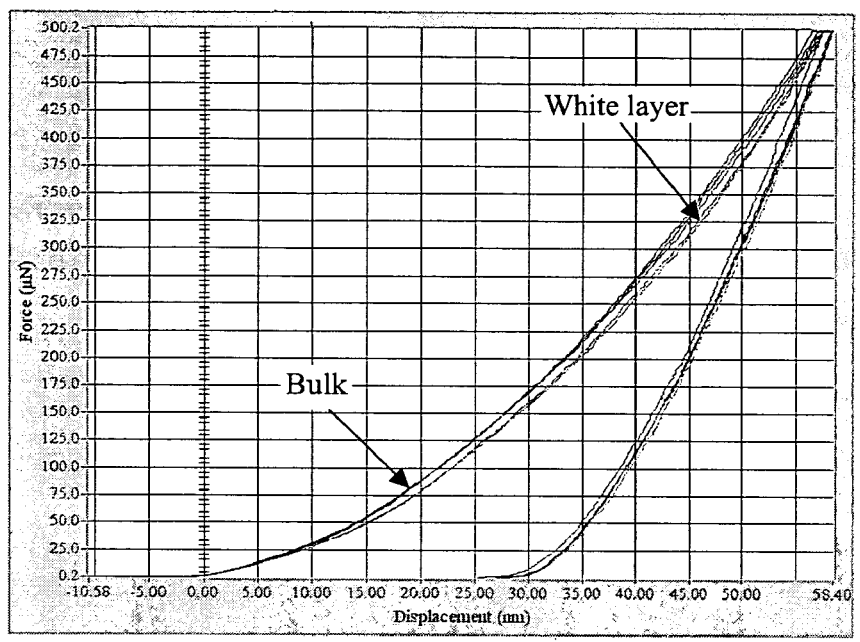

Figure 18. Optical micrographs of the chips obtained from machining with CBN-TiN. (a) sliding side of the chip, (b) polished and etched longitudinal midsection of the chip.
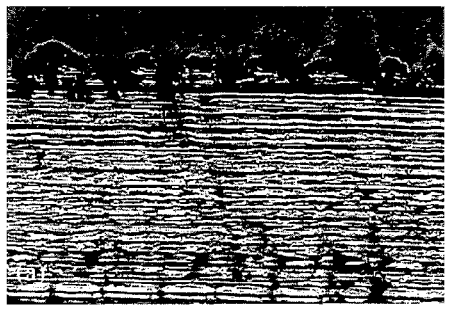
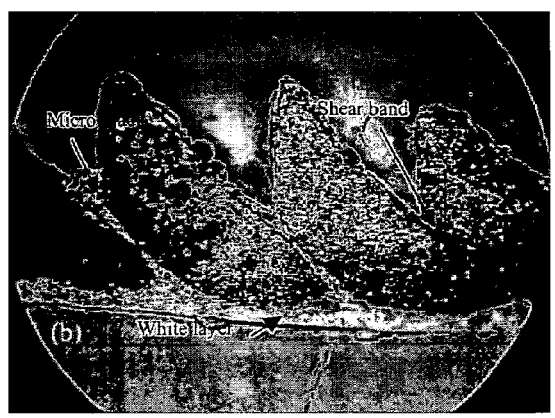

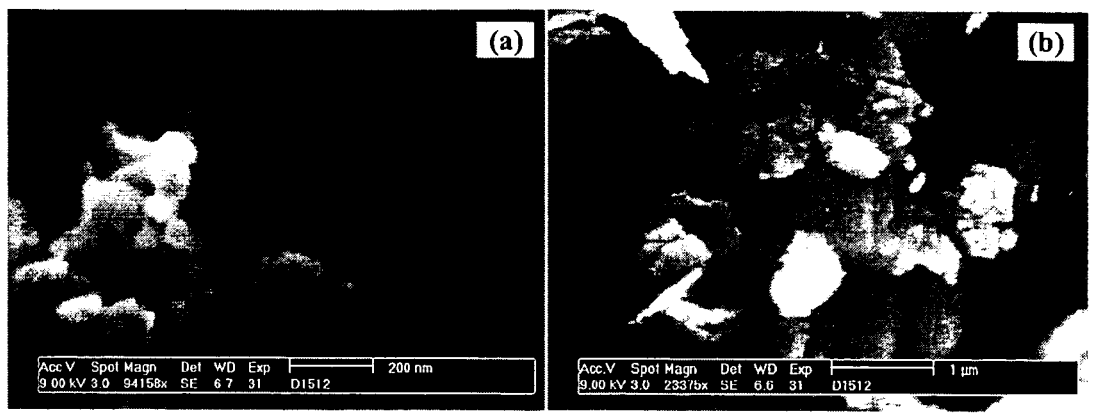
Figure 19. SEM images of as-purchased nanocrystalline (a) ZnO particles and (b) MoS$_2$ particles
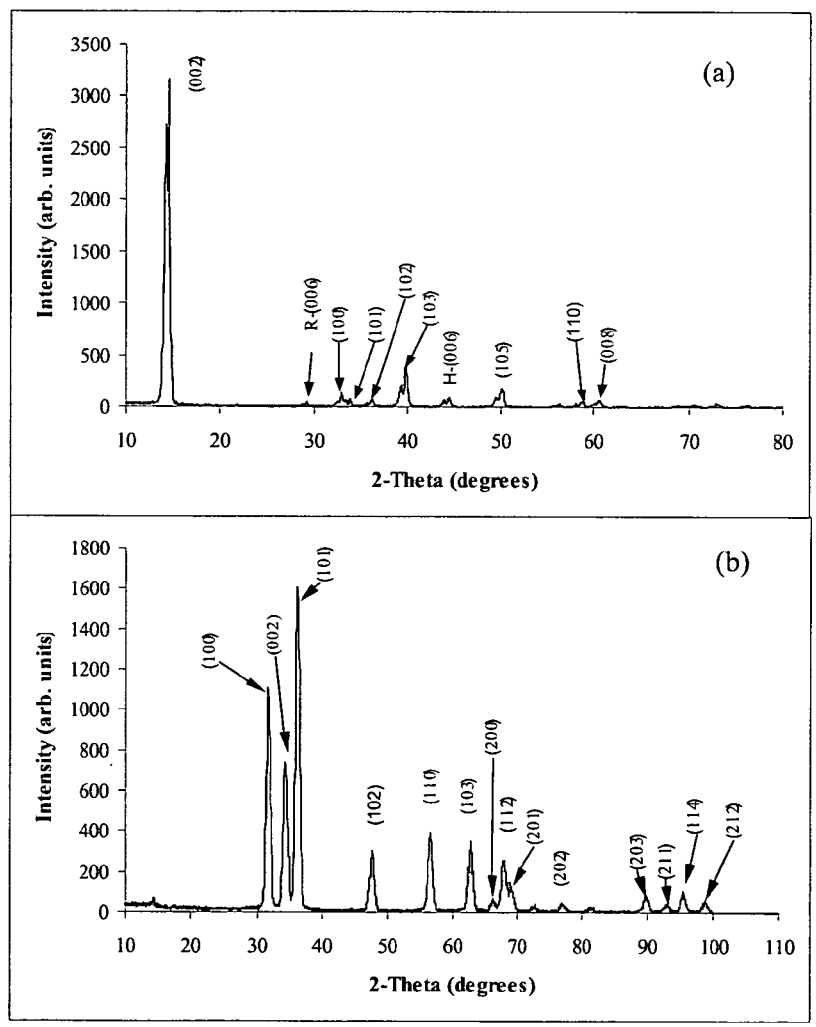
Figure 20. XRD patterns of (a) MoS$_2$ and (b) ZnO powder particles

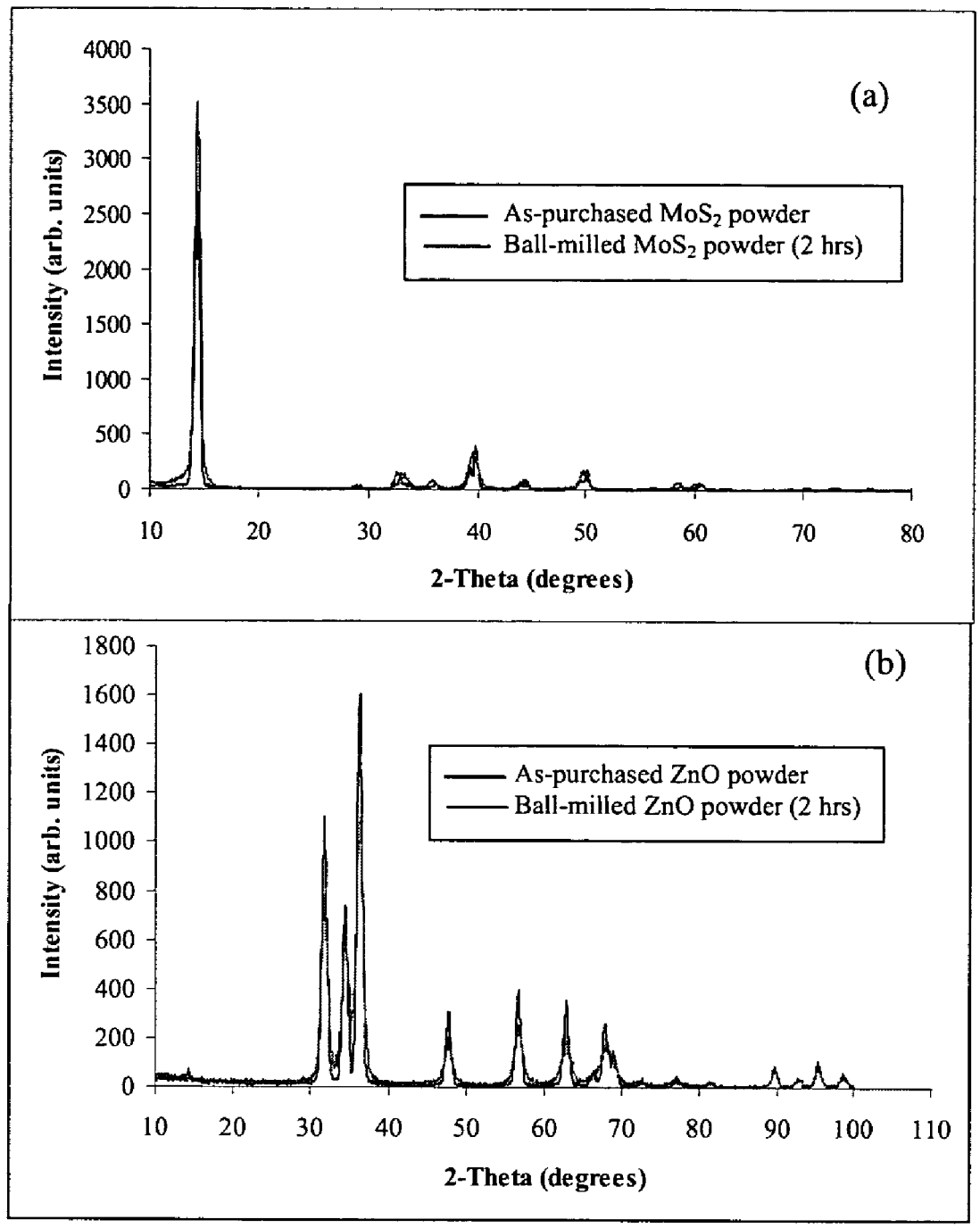
Figure 21. Comparison of XRD patterns for as-purchased powders and ball-milled powders of (a) $MoS_2$ and (b) ZnO

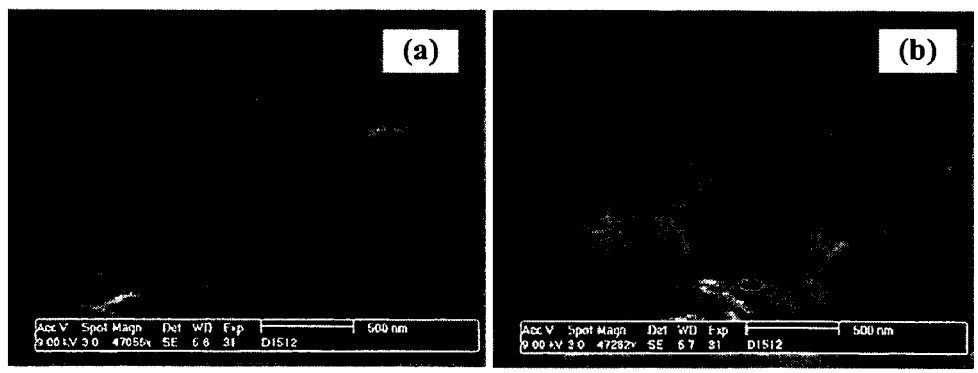
Figure 22. SEM images of particle size of ball-milled and alloyed ZnO and $MoS_2$ powder in volumetric ratio of 1:1 for 2 hours (a) and 5 hours (b) in air
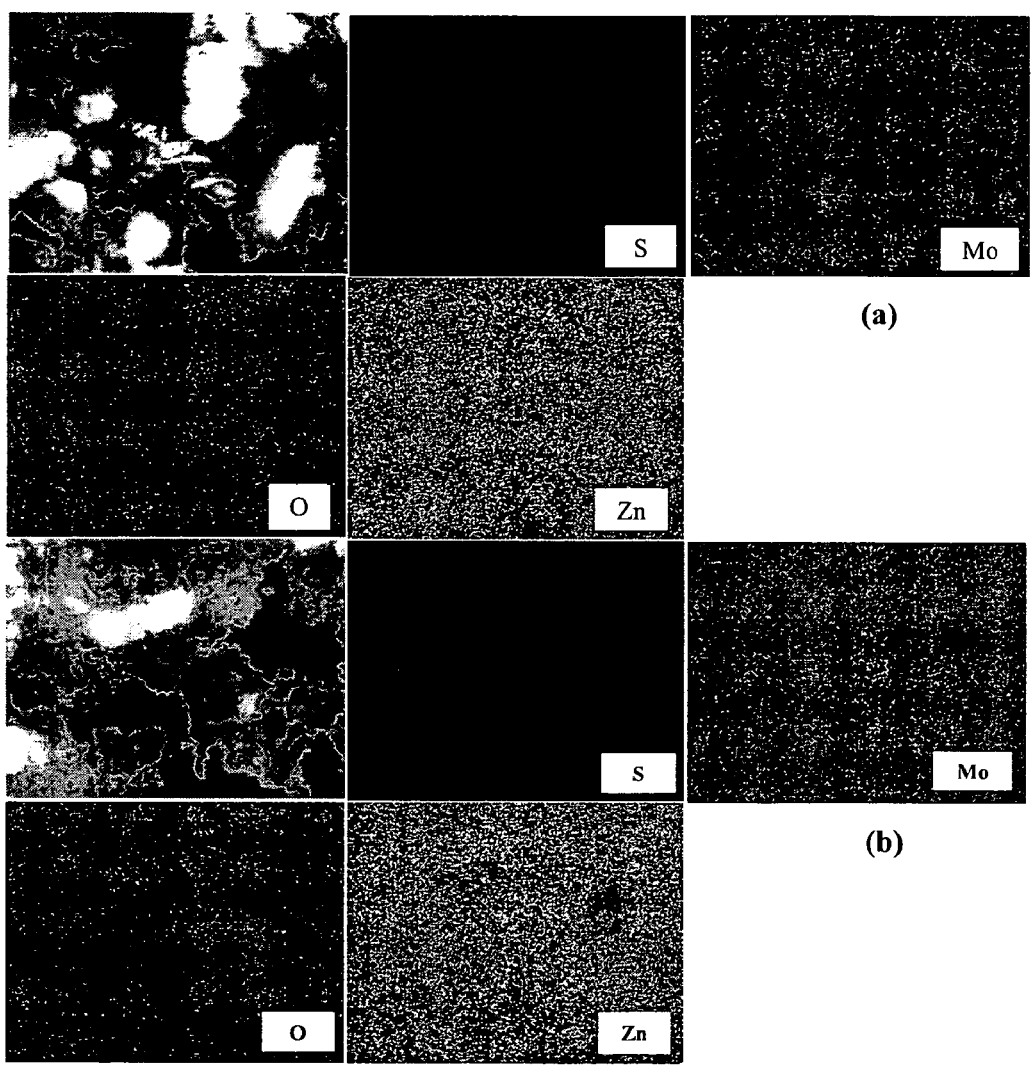
Figure 23. Elemental mapping of milled and alloyed ZnO and $MoS_2$ powder in volumetric ratio of 1:1 for 2 hours (a) and 5 hours (b) in air

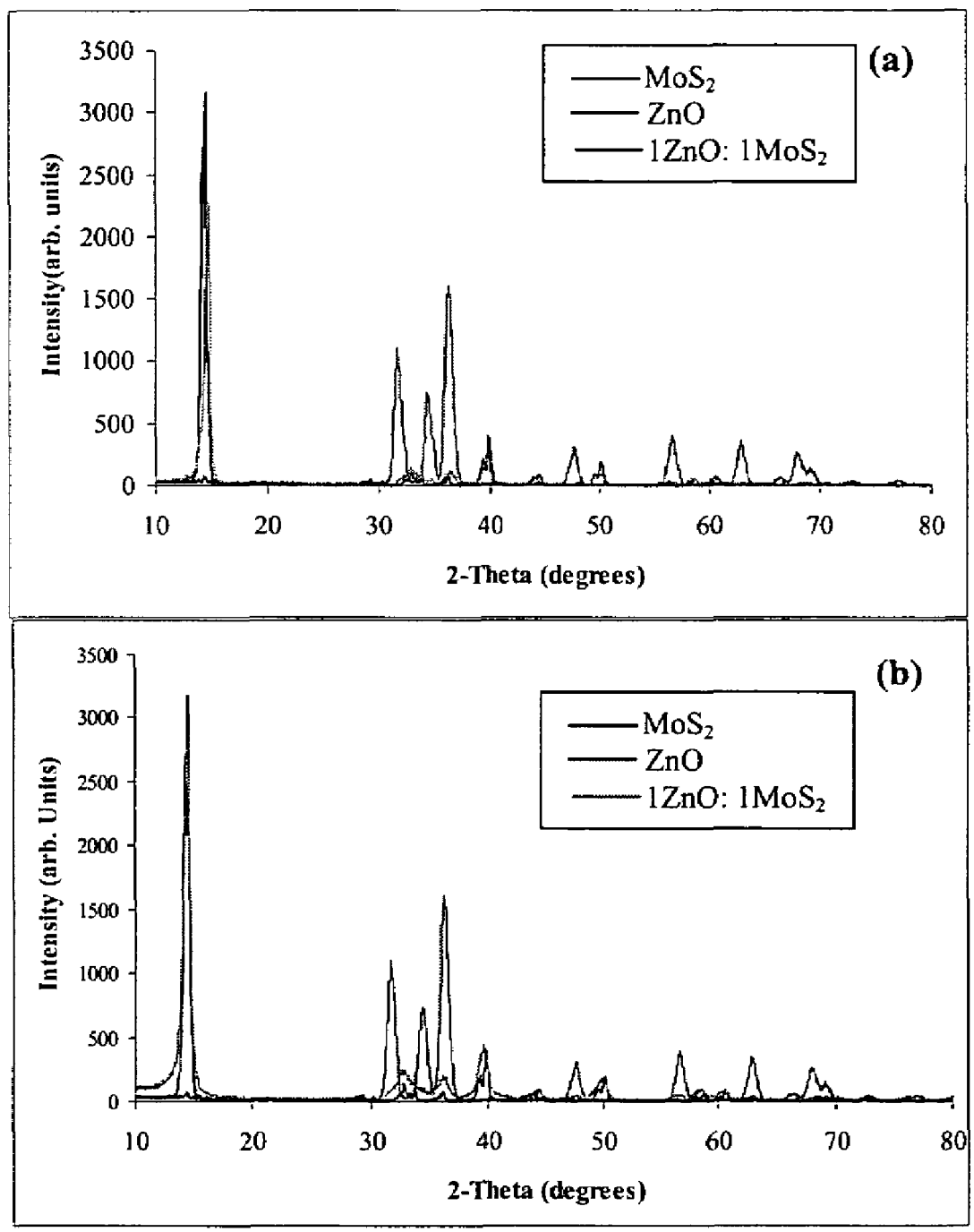
Figure 24. XRD patterns of milled and alloyed ZnO and $MoS_2$ powder in volumetric ratio of 1:1 for 2 hours (a) and 5 hours (b) in air

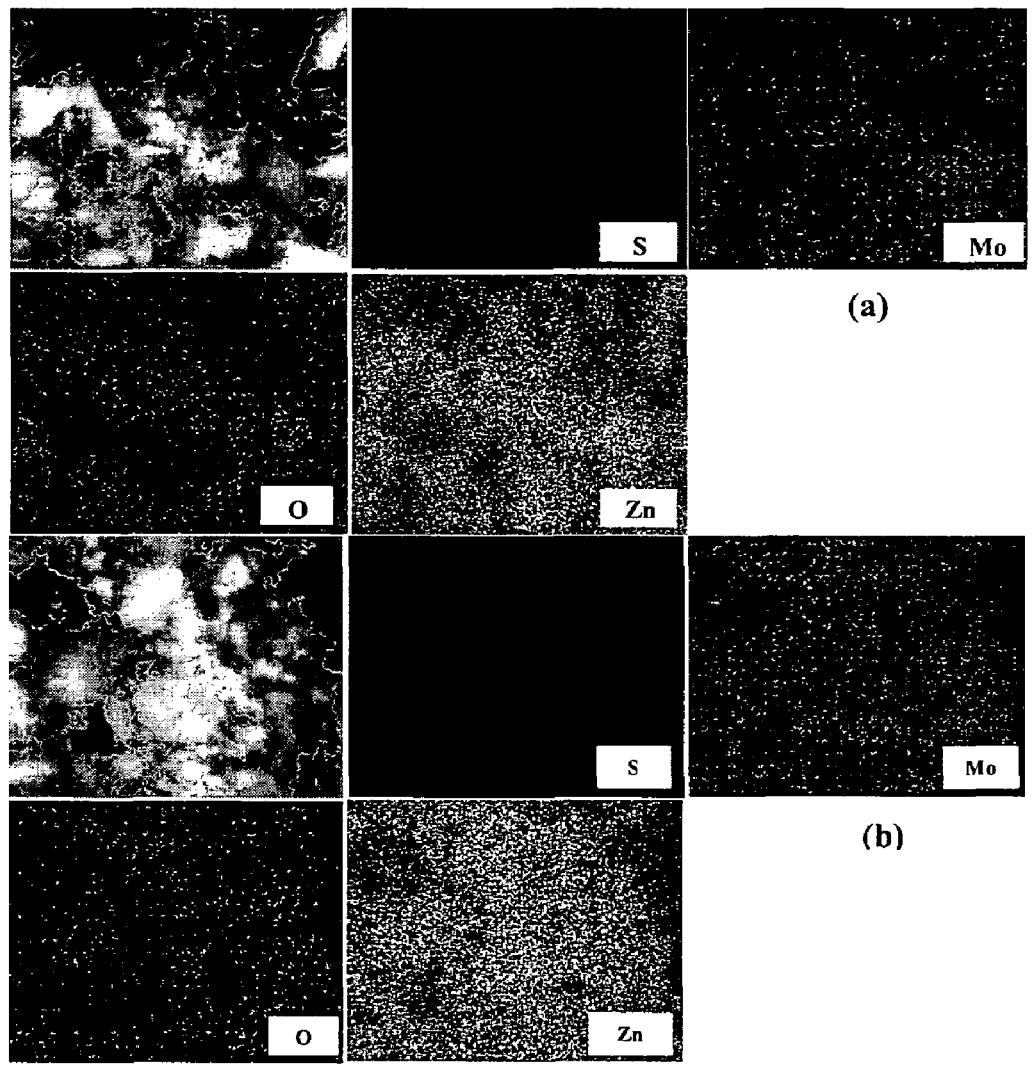
Figure 25. Elemental mapping of milled and alloyed ZnO and MoS$_2$ powder in volumetric ratio of 1:1 for 2 hours (a) and 5 hours (b) in N$_2$

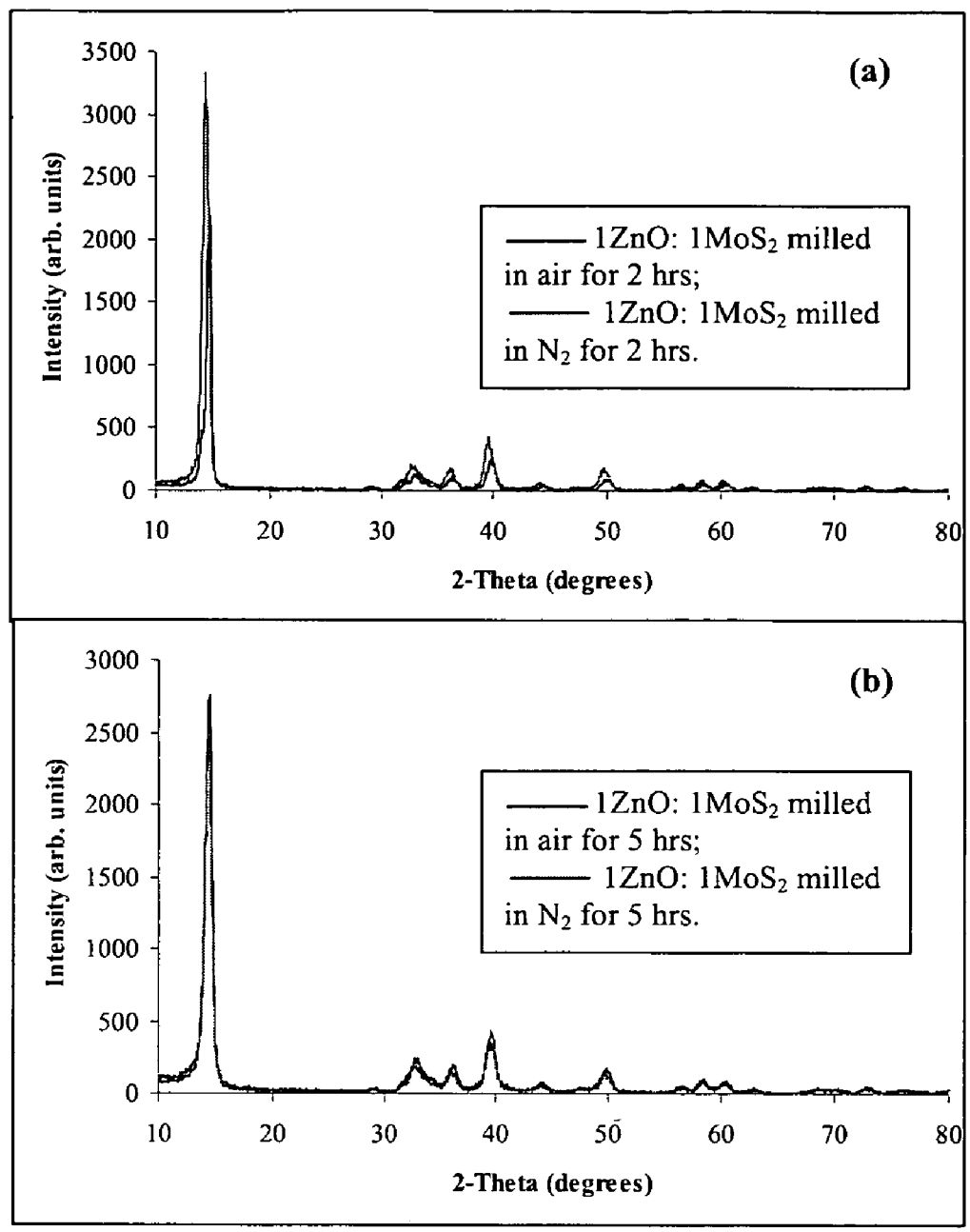
Figure 26. XRD patterns of milled and alloyed ZnO and $MoS_2$ powder in volumetric ratio of 1:1 for 2 hours (a) and 5 hours (b) in $N_2$

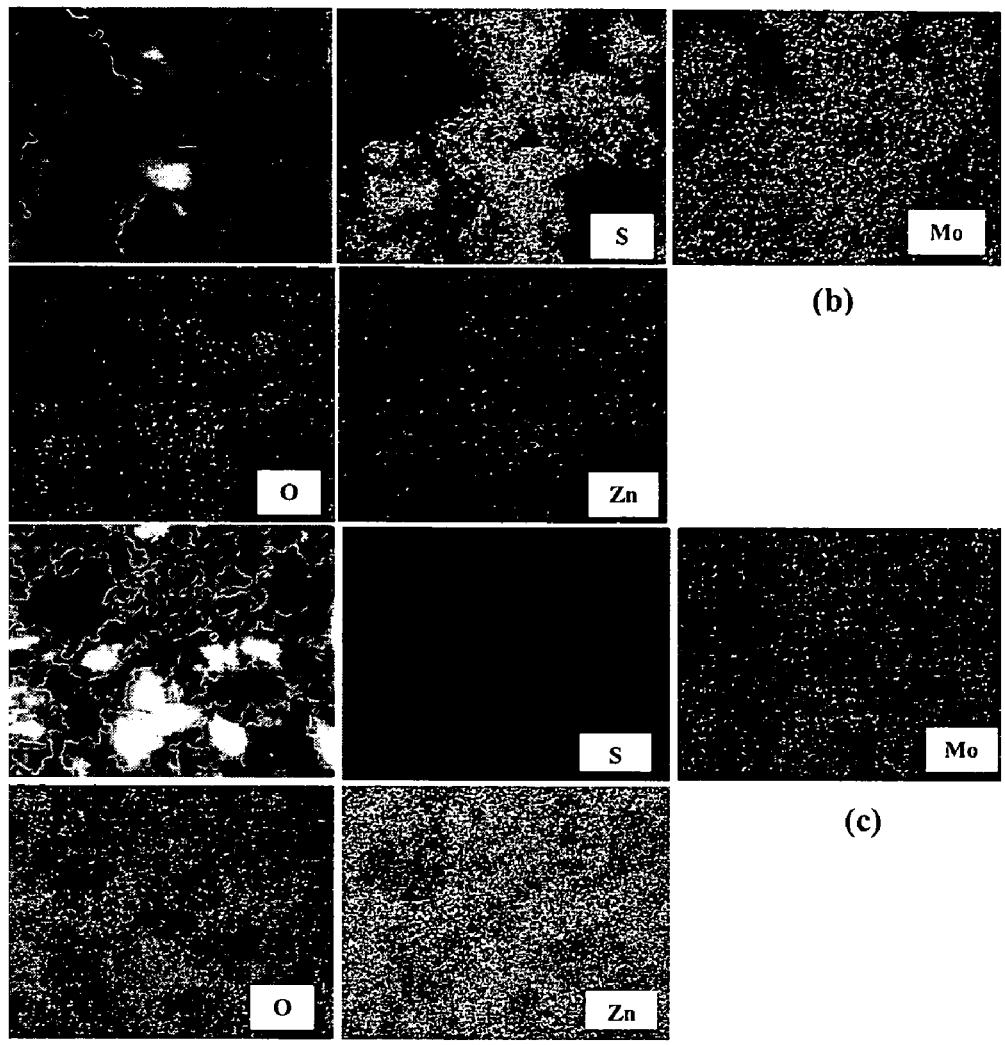
Figure 27. EDS mapping of ball-milled/alloyed powder of ZnO and MoS$_2$ (1:1) heated at (a) 250 °C, (b) 375 °C, and (c) 500 °C

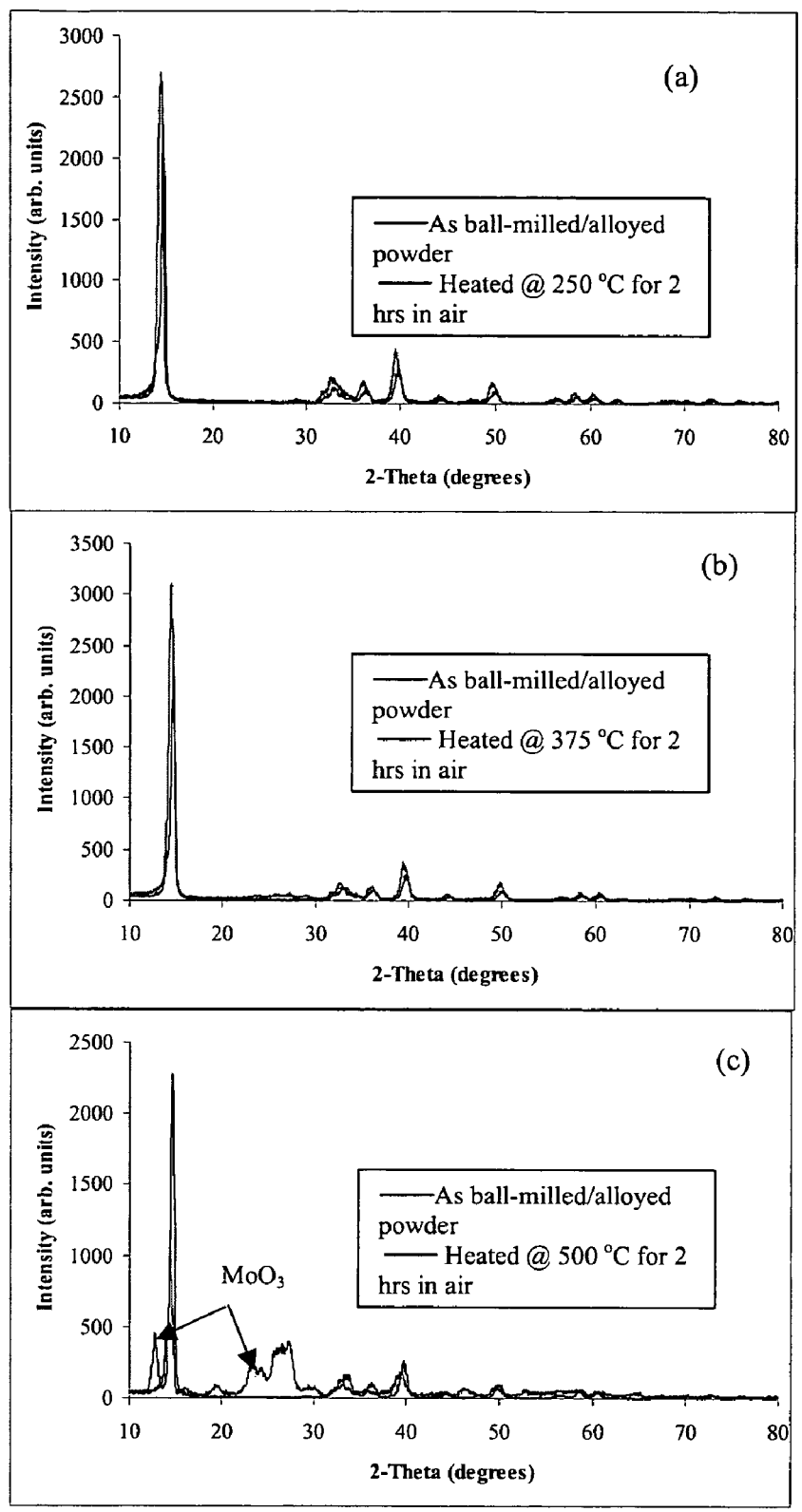
Figure 28. XRD patterns of ball-milled and alloyed powder of ZnO and $MoS_2$ (1:1) heated at (a) 250 °C, (b) 375 °C, and (c) and 500 °C

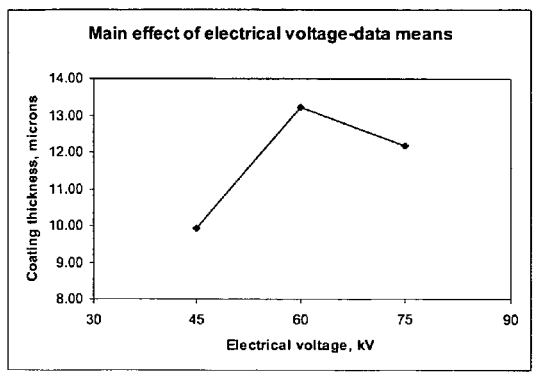
(A)
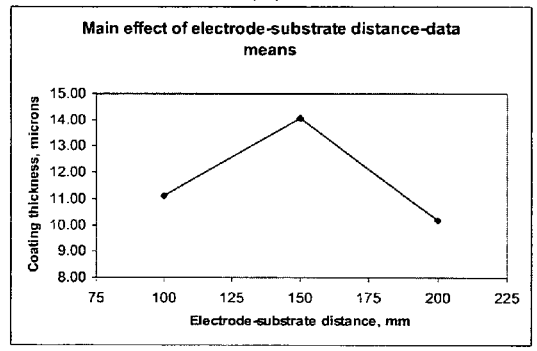
(B)
Figure 29. Main effects of (A) electrical voltage and (B) electrode-substrate distance on coating thickness
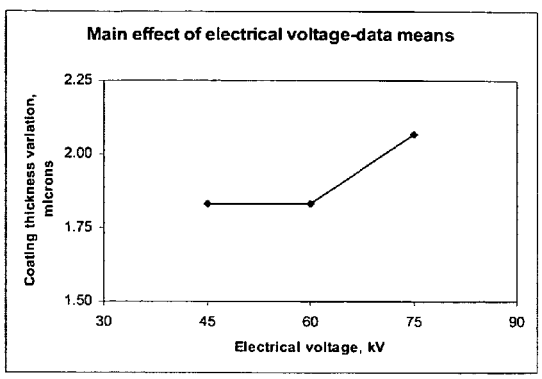
(A)
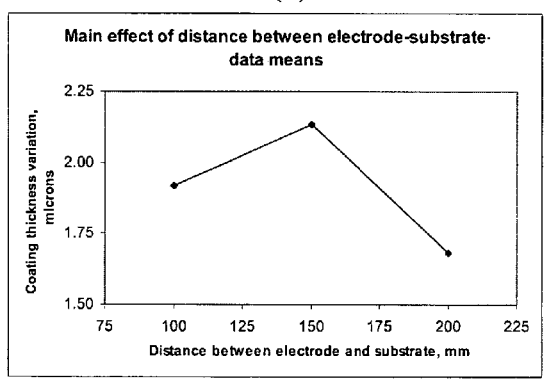
(B)
Figure 30. Main effects of (A) electrical voltage and (B) electrode-substrate distance on coating thickness variation

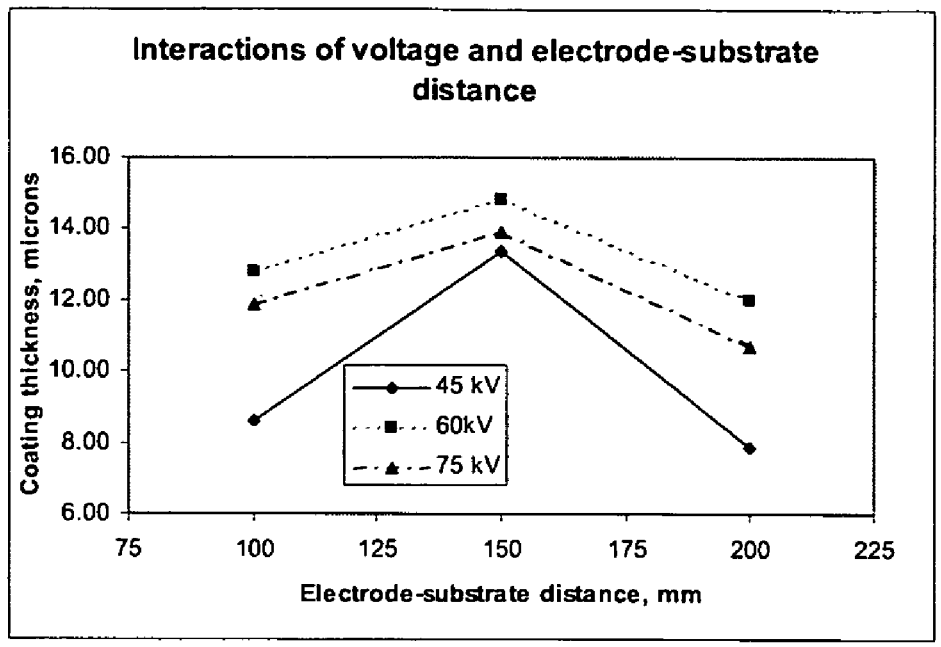
Figure 31. Interaction effects of electrical voltage and electrode-substrate distance
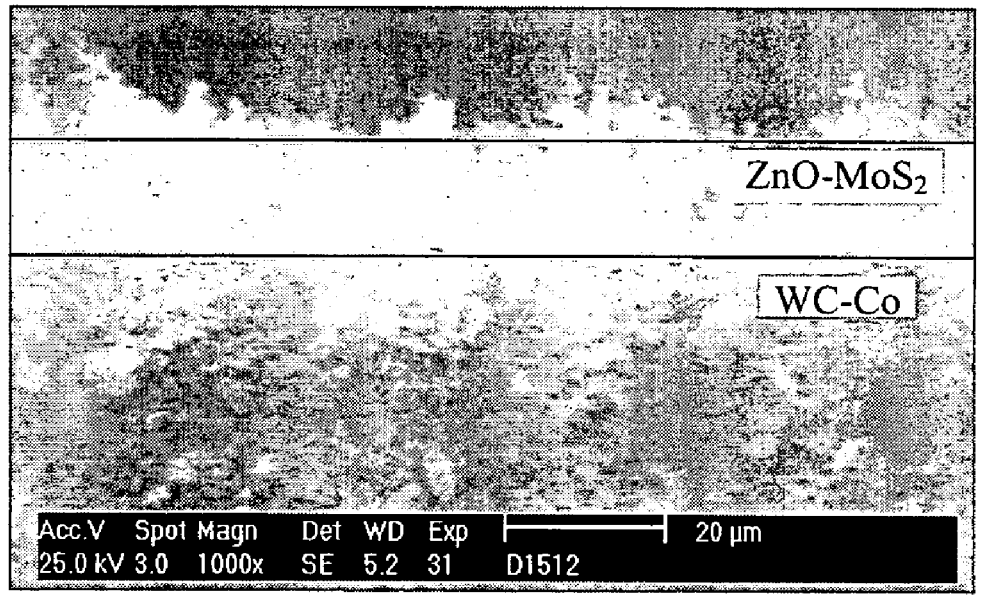
Figure 32. SEM images showing the coating deposited at V=-60 kV, d=150 mm, and P=207 kPa

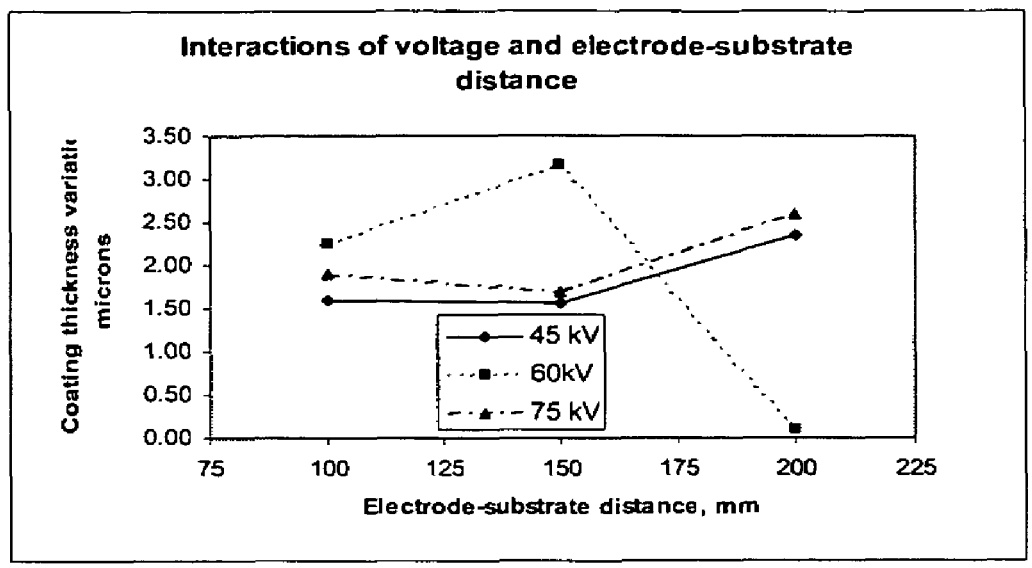
Figure 33. Interaction effect of electrical voltage and electrode-substrate distance on coating thickness
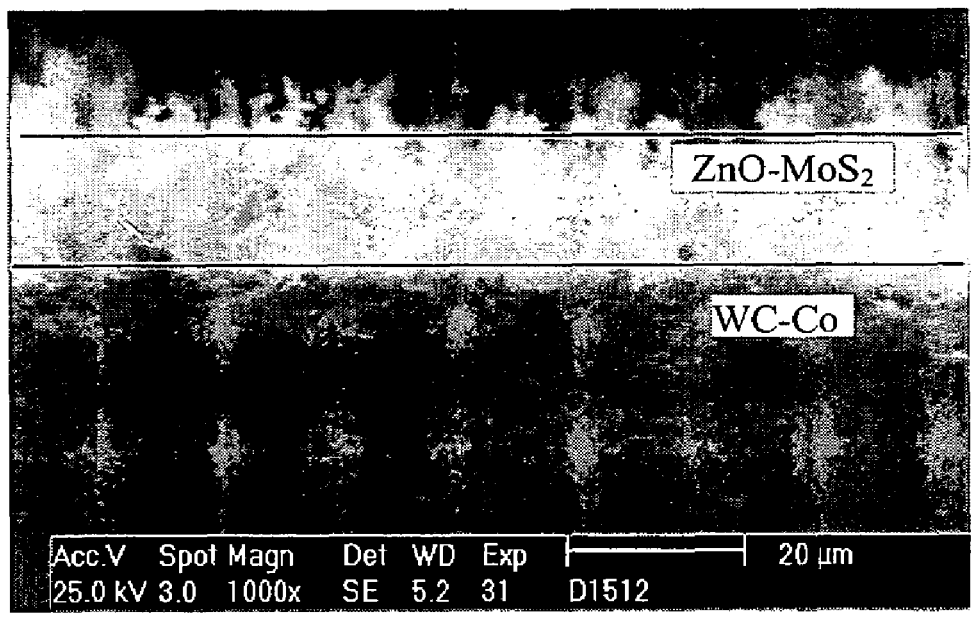
Figure 34. SEM images of a typical deposition at V=-75kV, d=150mm, p=207 kPa

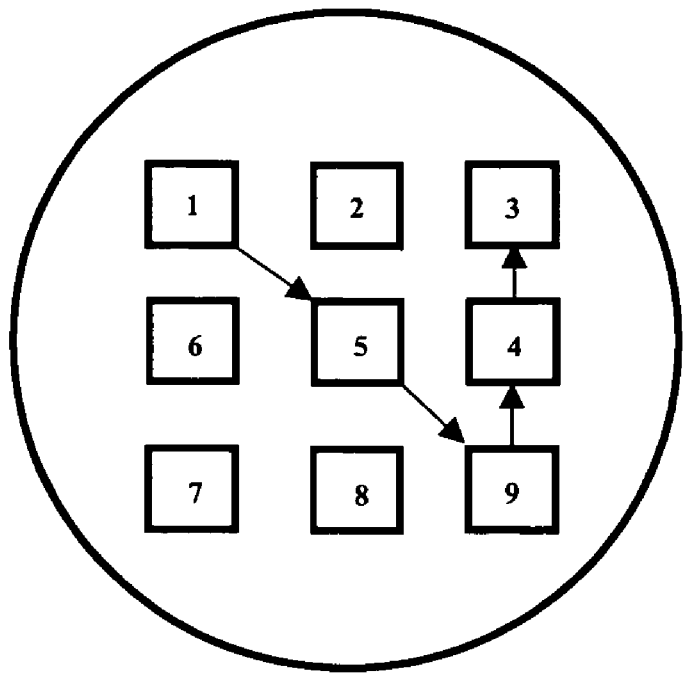
Figure 35. A schematic of the tool inserts configuration for checking coating uniformity
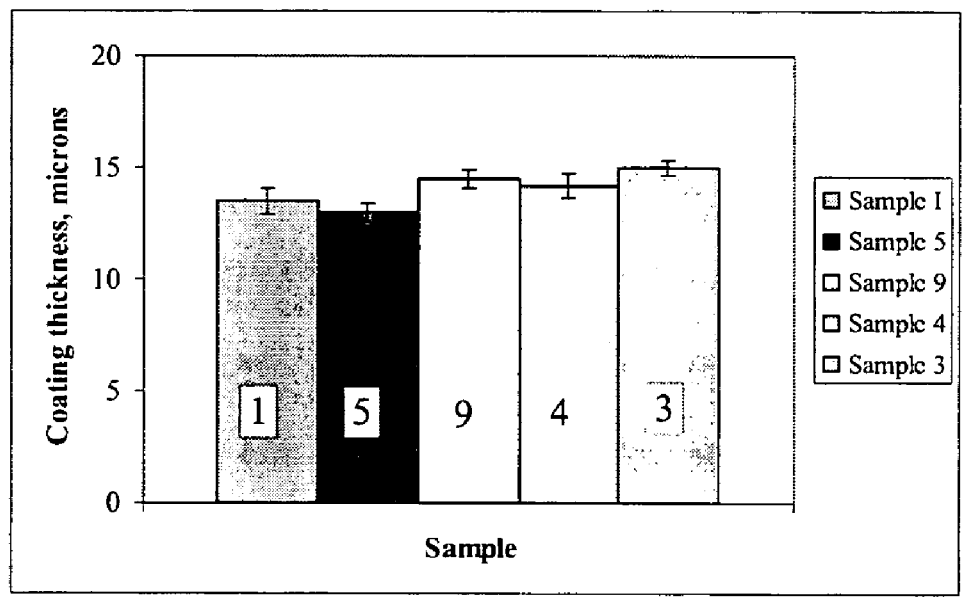
Figure 36. Coating thickness variation from tool insert to tool insert

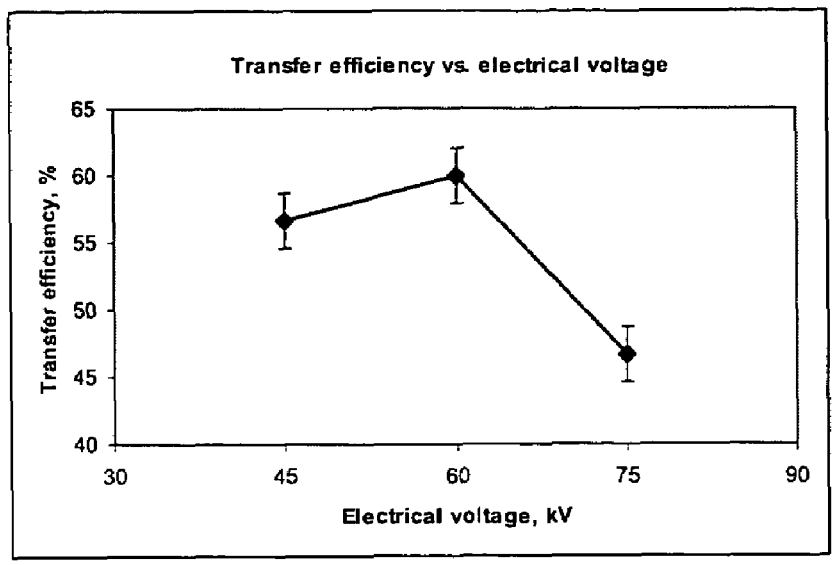
Figure 37. Transfer efficiency variation with electrical voltage
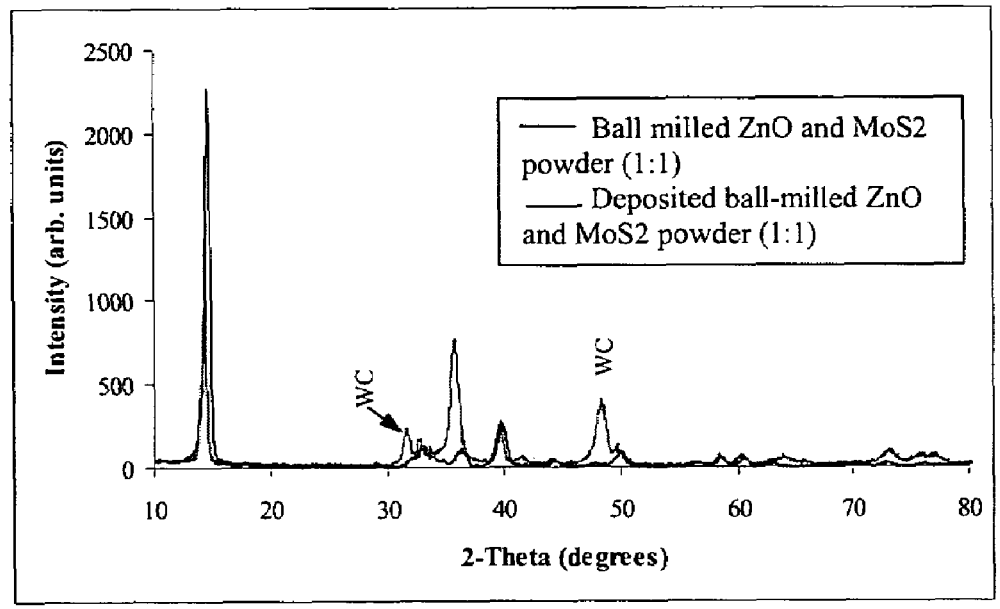
Figure 38. XRD patterns of ESC deposited mixed powder of ZnO and $MoS_2$

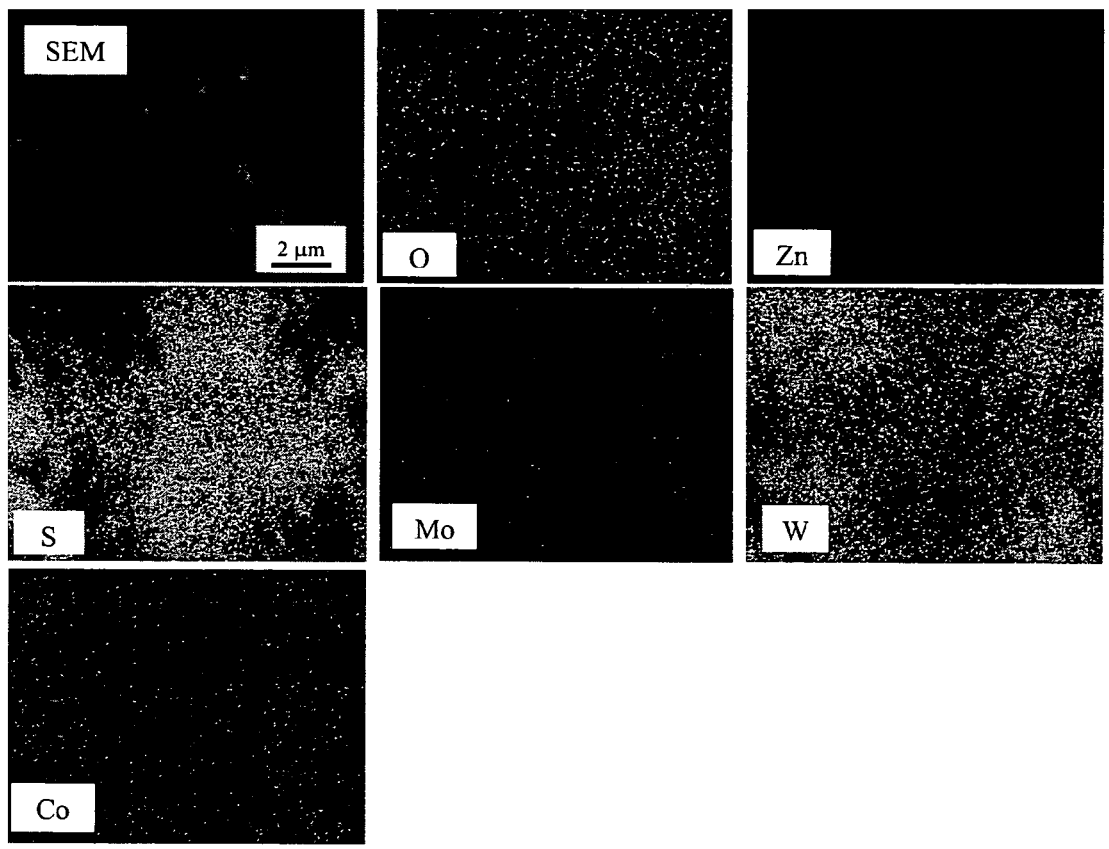
Figure 39. Element mapping (EDX) of the deposition of ZnO and MoS$_2$ (1:1) on WC-Co substrate

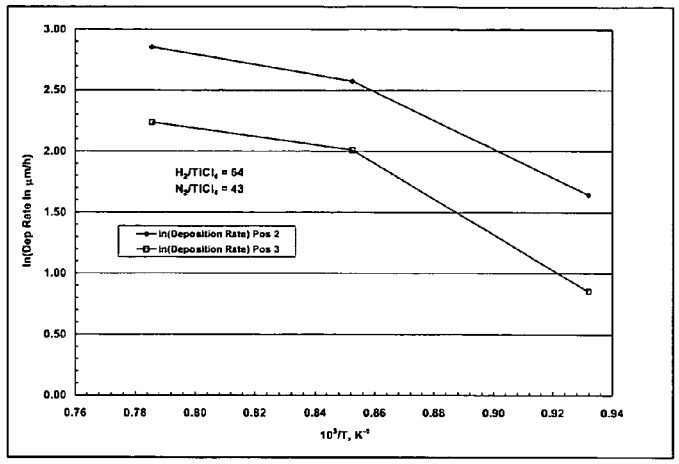
Fig. 40 Deposition rate as a function of temperature, for a precursor gas ratio of $H_2/TiCl_4 = 64$ and $N_2/TiCl_4 = 43$.
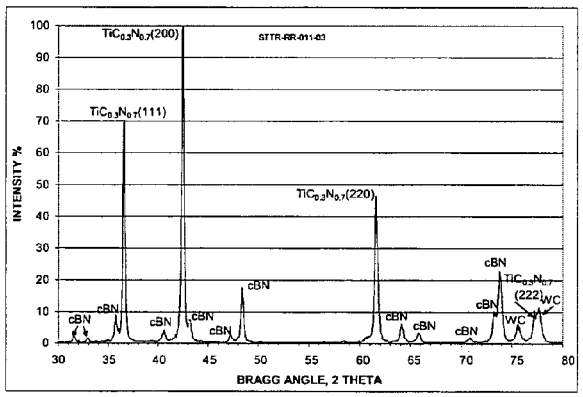
Fig 41. X-ray Diffraction graph of cBN-TiCN coated insert
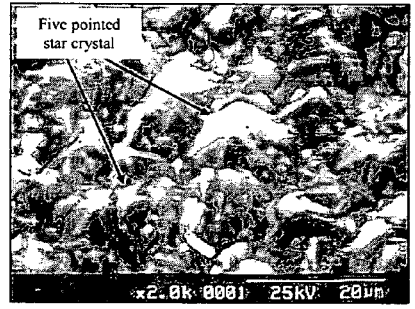
Fig 42. SEM picture of cBN-TiCN coated insert
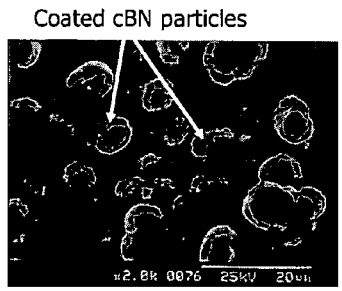
Fig 43. SEM picture of cBN-TiCN coated insert
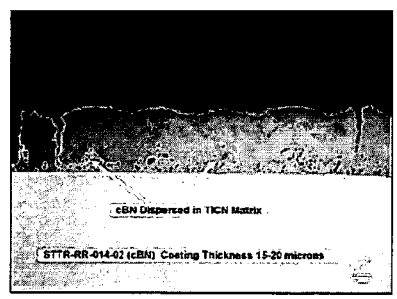
Fig 44. Micrograph of cBN-TiCN coated insert

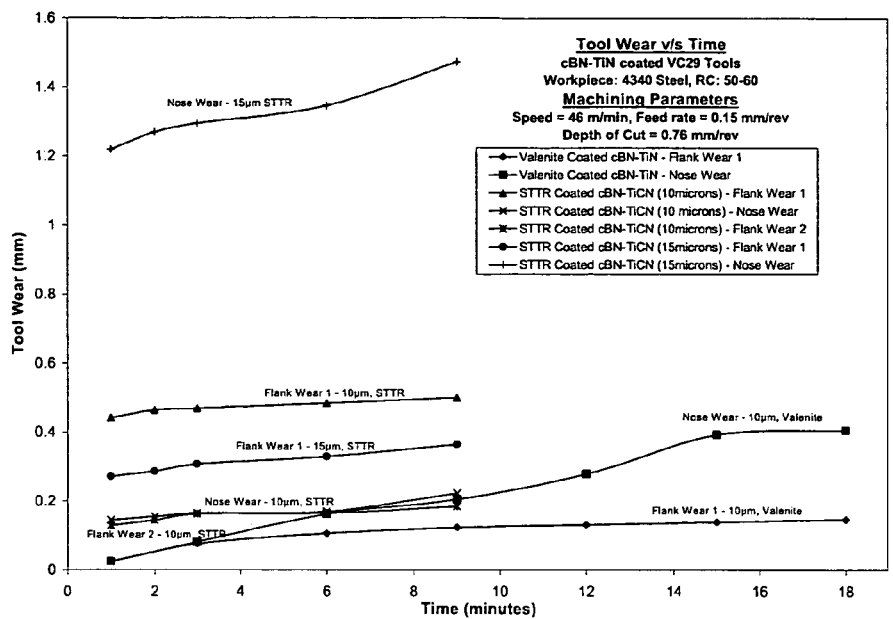

Fig 45 Results of preliminary machining tests on STTR (University of Arkansas, Fayetteville) cBN-TiCN coated carbide inserts in the hard turning of AISI 4340 steel (hardness HRC 50-60). The cutting parameters were recommended by Valenite®, used as benchmark for their cBN-TiN coated tools. For comparison, cBN-TiN coated inserts coated at Valenite® from the same batch as the experimental tools are included.

NANOPARTICLE COMPOSITIONS, COATINGS AND ARTICLES MADE THEREFROM, METHODS OF MAKING AND USING SAID COMPOSITIONS, COATINGS AND ARTICLES

STATEMENT REGARDING FEDERALLY SPONSORED RESEARCH

The present invention was supported by grants NSF-0232544, NSF-0232725, DMI-0115532, and DMI-9713660 awarded by the National Science Foundation, grant EP-D-04-044 awarded by the Environmental Protection Agency, and United States Air Force AFOSR/DODEPSCoR Grant No. 449620-00-1-0268.

BACKGROUND OF THE INVENTION

1. Field of the Invention

The present invention relates to compositions, to coatings and articles made from such compositions, and to methods of making and using such compositions, coatings and articles. In another aspect, the present invention relates to particle compositions comprising at least one of diamond, silicon, nitrides, carbides, steel, carbonitrides, borides, sulphides, chalcogenides, oxides, and silicides, also having present one or more of diamond, silicon, nitrides, carbides, steel, carbonitrides, borides, sulphides, chalcogenides, oxides, and silicides, to coatings and articles made from such compositions, to coatings and articles made from such compositions, and to methods of making and using such compositions, coatings and articles. In even another aspect, the present invention relates to particle compositions comprising overcoated particles comprising at least one of diamond, silicon, nitrides, carbides, steel, carbonitrides, borides, sulphides, chalcogenides, oxides, and suicides, to coatings and coated articles made from such compositions said coatings comprising a nanostructured surface morphology, and to methods of making and using such compositions, coatings and articles.

2. Description of the Related Art

Coatings are commonly used to impart desirable surface properties and function to a substrate. Some examples of functional types of coatings include protective coatings, wear-resistant coatings, corrosion-resistant coatings, thermal barrier coatings, conductive coatings, friction reducing coatings, cutting and machining coatings, hydrophobic coatings, and anti-bacterial coatings, to name but a few.

Often times, it is desired that a coating have multiple properties and/or functions however, it is not always possible to manufacture a coating from a single material to fulfill all the desired properties. In such cases, two or more materials with desired properties are combined, for example in a composite or in a combination, and the combination used for the final coating. It is often necessary to develop specific methods for applying specific coatings in order to achieve the desired functional integrity of the coating.

Many coatings, for example lubricant coatings, are vital to the function of the substrate onto which they are applied. Lubricants and lubricant coatings are utilized in a wide range of applications all of which generally require reducing friction and reducing wear of parts. One example of an industry requiring high performance lubricants being the cutting, grinding and machining of hard materials. The development of harder materials has created the need for both processing techniques, and tools with a work surface capable of shaping and cutting workpieces made of these hard materials.

Cubic boron nitride (cBN) is a man-made material and is the second hardest material next to diamond. Diamond and cBN compacts have been used in the tool industry for machining applications and complement each other in function. Due to the reaction of diamond with iron at high temperatures typically required for cutting processes, diamond cannot be applied effectively to the machining of ferrous alloys. cBN, has outstanding thermal stability and chemical inertness when used for machining ferrous alloys but is conventionally used as polycrystalline cubic boron nitride (PCBN) compacts which have limitations due to structural rigidity and limitations in the forming methods for PCBN compacts. Thus, the development of innovative tool surface coatings are required.

While numerous lubricants and lubricant coatings are known, conventional and currently available lubricating coatings are layered coatings and have a soft lubricant phase deposited over a hard phase. The soft phase quickly wears out leaving behind the hard layer without lubrication. In addition, the currently available lubricating coatings do not offer temperature adaptability. Thus, the development of new lubricant coatings that are effective over a wide range of operating temperatures and have longer life would be of impact not only in the cutting and machining industry, but numerous others such as, for example, the automotive industry, and the tool industry, to name only a few.

U.S. Pat. No. 6,607,782, issued Aug. 19, 2003 to Malshe et al, teaches a coating method comprising an electrostatic spray coating (ESC) step and a chemical vapor infiltration (CVI) step. Although widely used in the paint industry, ESC was previously unexplored in the ceramic and metal coating industry. USP '782 teaches a use of the ESC process for deposition of particles of various oxides, nitrides, and other application-specific materials for the machining industry.

In spite of advancements in the prior art, there is a need for compositions, coatings and coated articles having micron, submicron, and nanostructured surface morphology.

There is another need in the art for methods of making nanostructured compositions, coatings and coated articles.

There is even another need in the art for self-lubricating compositions, coatings and coated articles.

There is still another need in the art for methods of making and methods of using self-lubricating compositions, coatings and coated articles.

There is yet another need in the art for nanoparticle compositions, coatings, and articles coated with same.

There is even still another need in the art for methods of making nanosized particle compositions, coatings, and articles coated with same.

These and other needs in the art will become apparent to one of skill in the art upon review of this specification, including the claims and drawings.

SUMMARY OF THE INVENTION

It is an object of the present invention to provide for compositions, coatings and coated articles having micron, submicron, and nanostructured surface morphology.

It is another object of the present invention to provide for methods of making nanostructured compositions, coatings and coated articles.

It is even another object of the present invention to provide for self-lubricating compositions, coatings and coated articles.

It is still another object of the present invention to provide for methods of making and methods of using self-lubricating compositions, coatings and coated articles.

It is yet another object of the present invention to provide for nanoparticle compositions, coatings, and articles coated with same.

It is still another object of the present invention to provide for methods of making nanosized particle compositions, coatings, and articles coated with same.

It is even yet another object of the present invention to provide for methods of using said nanosized particle compositions, coatings, and articles coated with same.

These and other objects of the present invention will become apparent to those of skill in the art upon review of this specification, including its drawings and claims.

According to one embodiment of the present invention, there is provided a coated article comprising a substrate having a composite layer formed thereon, wherein the composite layer has an textured outer surface morphology. The textured outer surface morphology may comprise a distribution of protrusions and/or concavities, wherein each of said protrusions and/or concavities is between 0.01 and 50 micrometers, wherein said composite layer comprises a base phase and an infiltrate phase, said base phase comprising at least one of the group consisting of diamond, silicon, nitrides, carbides, steel, carbonitrides, borides, sulphides, chalcogenides, oxides, and silicides, and said infiltrate phase comprising at least one of the group consisting of diamond, silicon, nitrides, carbides, steel, carbonitrides, borides, sulphides, chalcogenides, oxides, and silicides.

According to another embodiment of the present invention, there is provided a tool comprising a work surface, wherein the work surface has deposited thereon a composite layer having a textured outer surface morphology. The textured outer surface morphology may comprise a distribution of protrusions and/or concavities, wherein each of said protrusions and/or concavities is between 0.01 and 50 micrometers, wherein said composite layer comprises a base phase comprising at least one of the group consisting of diamond, silicon, nitrides, carbides, steel, carbonitrides, borides, sulphides, chalcogenides, oxides, and silicides, and an infiltrate phase comprising at least one of the group consisting of diamond, silicon, nitrides, carbides, steel, carbonitrides, borides, sulphides, chalcogenides, oxides, and silicides.

According to even another embodiment of the present invention, there is provided a method of coating a substrate comprising the steps of a) depositing solid particles on a substrate to form a base layer wherein said particles are in contact with the substrate and wherein said particles comprise at least one of the group consisting of diamond, silicon, nitrides, carbides, steel, carbonitrides, borides, sulphides, chalcogenides, oxides, and silicides, and step b) infiltrating said base layer with an infiltrate to form a continuous composite layer on the substrate, wherein said composite layer has a substrate surface and an outer surface and the outer surface morphology is textured. Generally the surface comprises a distribution of protrusions and/or concavities, wherein each of said protrusions and/or concavities is between 0.01 and 50 micrometers, wherein said infiltrate comprises at least one of the group consisting of diamond, silicon, nitrides, carbides, steel, carbonitrides, borides, sulphides, chalcogenides, oxides, and silicides.

According to still another embodiment of the present invention, there is provided a method of shaping a workpiece comprising contacting the workpiece with a tool work surface, wherein the work surface comprises a composite layer having a surface comprising a distribution of protrusions and/or concavities, wherein each of said protrusions and/or concavities is between 0.01 and 50 micrometers, wherein said composite layer comprises a base phase comprising at least one of the group consisting of diamond, silicon, nitrides, carbides, steel, carbonitrides, borides, sulphides, chalcogenides, oxides, and silicides, and an infiltrate phase comprising at least one of the group consisting of diamond, silicon, nitrides, carbides, steel, carbonitrides, borides, sulphides, chalcogenides, oxides, and silicides.

According to yet another embodiment of the present invention, there is provided a composition comprising alloyed particles wherein the base particles supports a coating of supplement particles, and wherein the base particles comprise at least one of the group consisting of nitrides, carbides, steel, carbonitrides, borides, sulphides, chalcogenides, oxides, and silicides, wherein the supplement particles comprise at least one of the group consisting of nitrides, carbides, steel, carbonitrides, borides, sulphides, chalcogenides, oxides, and silicides, and wherein the alloyed particles have an average particle size of less than 1 micron. In one embodiment, the oating of supplement particles is a single layer. In another embodiment the layer is a discontinuous layer. The coating of supplement particles may also comprises multiple layers.

According to still even another embodiment of the present invention, there is a provided a coated article comprising a substrate supporting a coating of the invention. In one embodiment, the article is a particle of less than 1 micron. Generally the coating has a textured surface.

According to still yet another embodiment of the present invention, there is provided a method for making a particle composition comprising the step of a) combining base particles together with supplement particles to produce alloyed particles, wherein said alloyed particles have an average particle size of less than 1 micrometer, wherein said base particles comprise at least one of the group consisting of nitrides, carbides, steel, carbonitrides, borides, sulphides, chalcogenides, oxides, and silicides, and wherein said supplement particles comprise at least one of the group consisting of nitrides, carbides, steel, carbonitrides, borides, sulphides, chalcogenides, oxides, and suicides. Generally step a) combining is achieved by depositing said supplement particles on the surface of said base particles to form a coating thereon. The method may further comprise the step of b) treating the alloyed particles to produce a metastable phase. In one embodiment, the supplement particles form a discontinuous layer on the surface of said base particles.

According to yet even another embodiment of the present invention, there is provided a method for coating an article comprising the step a) depositing a layer of a composition of the invention on a substrate to form a coating. The substrate may be any substrate including a particle or an overcoated particle or alloyed particles. The substrate may also be a tool work surface.

These and other embodiments of the present invention will become apparent to those of skill in the art upon review of this specification, including its drawings and claims.

BRIEF DESCRIPTION OF THE DRAWINGS

FIG. 1 is a schematic of a single gun ESC useful in the present invention.

FIG. 2 is a photograph of an ESC set-up useful in the present invention.

FIG. 3 is a SEM of ESC deposited cBN of CNMA 432 (H21).

FIG. 4 is a SEM showing the lotus leaf surface morphology.

FIG. 5 is SEM pictures showing (a) as-purchased submicron MoS2 particles having APS of 700 nm, and (b) ball-milled MoS2 nanoparticles having APS of less than about 100 nm.

FIG. 6 is an optical micrograph (OM) showing the cracks formed in thick deposition (>25 μm) at each deposition cycle (black spots are MoS2)

FIG. 7 is a SEM picture showing the ESC deposition of MoS2-PTFE on SNMA 432 tool insert at optimized condition (thickness less than 12 μm)

FIG. 8 is a picture showing nano MoS2-PTFE deposited on cBN—TiN (with controlled surface morphology) coated tool inserts.

FIG. 9 is an optical micrograph showing the exposed domes and lubricants in the receptacles after plasma etching for 5 minutes.

FIG. 10 is surface roughness profile data for (a) cBN—TiN coated tool with controlled surface morphology, (b) MoS2-PTFE deposited on cBN—TiN, and (c) plasma etched MoS2-PTFE/cBN—TiN.

FIG. 11 is coefficient of friction data of different coatings (listed in the legend) on WC—Co (CNMA 432, HA) against 52100 hardened ball.

FIG. 12 is an SEM micrograph of as-deposited CBN—TiN coating at the cutting tool tip.

FIG. 13 is graph showing the flank wear progression data for cBN—TiN coated carbide tool inserts.

FIGS. 14a-14C provides SEM of worn cBN—TiN coated tool inserts.

FIG. 15 provides the surface roughness (Ra) of the workpiece machined with the cBN—TiN coated tool inserts.

FIGS. 16a and 16b are micrographs showing a) microstructure of surface layer of machined AISI 4340 steel bar (1000×, 5% natal etchant) and b) plastic flow observed in the subsurface.

FIG. 17 a graph of load displacement curves for bulk AISI 4340 and white layer.

FIGS. 18a and 18b are optical micrographs of the chips obtained from machining with cBN—TiN.

FIGS. 19a and 19b are SEM images of as-purchased nanocrystalline a) ZnO particles and b) MoS2 particles.

FIGS. 20a and 20b are XRD patterns of a) MoS2 and b) ZnO powder particles.

FIGS. 21a and 21b are comparison of XRD patterns for as-purchased and ball-milled powders of a) MoS2 and b)ZnO.

FIGS. 22a and 22b are SEM images of particle size of ball-milled and alloyed ZnO and MoS2 powder, 1:1 ratio, for a) 2 hours and b) 5 hours, in air.

FIG. 23 provides elemental mapping data of milled and alloyed ZnO and MoS2 powder, 1:1 ratio, for a) 2 hours and b) 5 hours, in air.

FIGS. 24a and 24b are XRD patterns of milled and alloyed ZnO and MoS2 powder, 1:1 ratio, for a) 2 hours and b) 5 hours, in air.

FIG. 25 provides elemental mapping data of milled and alloyed ZnO and MoS2 powder, 1:1 ratio, for a) 2 hours and b) 5 hours, in N2.

FIGS. 26a and 26b are XRD patterns of milled and alloyed ZnO and MoS2 powder, 1:1 ratio, for a) 2 hours and b) 5 hours, in N2.

FIG. 27 provides elemental mapping data of milled and alloyed ZnO and MoS2 powder, 1:1 ratio, heated at a) 250 b) 375 and c)500 degrees C.

FIGS. 28a, 28b, and 28c are XRD patterns of milled and alloyed ZnO and MoS2 powder, 1:1 ratio, heated at a) 250 b) 375 and c)500 degrees C.

FIGS. 29a and 29b illustrate main effect of a) electrical voltage and b) electrode-substrate distance on coating thickness.

FIGS. 30a and 30b illustrate main effect of a) electrical voltage and b) electrode-substrate distance on coating thickness variation.

FIG. 31 illustrates interaction effects electrical voltage and electrode-substrate distance.

FIG. 32 is SEM image showing coating deposited at V=−60 kV, d=150 mm and P=207 kPa.

FIG. 33 illustrates interaction effect of electrical voltage and electrode-substrate distance coating thickness variation.

FIG. 34 is SEM image showing coating deposited at V=−75 kV, d=150 mm and P=207 kPa.

FIG. 35 is a schematic of tool insert configuration used for checking coating uniformity.

FIG. 36 shows coating thickness variation data from insert to insert.

FIG. 37 is a graph of transfer efficiency variation with electrical voltage.

FIG. 38 is XRD patterns of ESC deposited mixed powder of ZnO and MoS2.

FIG. 39 is element mapping data of the deposition of ZnO and MoS2 (1:1) on WC—Co substrate.

FIG. 40 graphs deposition rate as function of temperature.

FIG. 41 is an XRD graph of a cBN-TiCN coated insert.

FIG. 42 is an SEM image of a cBN-TiCN coated insert illustrating the five pointed star crystals.

FIG. 43 is an SEM image of a cBN-TiCN coated insert illustrating the coated cBN particles.

FIG. 44 is a micrograph of a cBN-TiCN coated insert.

FIG. 45 provides the results of machining tests on STTR cBN-TiCN coated carbide inserts in the hard turning of AISI4340 steel.

DETAILED DESCRIPTION OF THE INVENTION

The present invention provides compositions, coatings, coated articles, methods of making said coatings and articles, and methods of using said coatings and articles. The invention has application in a wide range of industries, such as, for example but not limited to, cutting and machining of hard materials, tool manufacturing, automotive industry, biomedical industry, decontamination industry, material science industry, piezoelectric industry, and nanoparticle industry.

The compositions and coatings of the invention can impart any of a vast range of surface properties such as, for example, reduced friction, self-lubrication, wetting and sheeting, moisture repelling, uniform drying, anti-spotting, anti-staining, anti-filming, self cleaning, self-maintaining, and durability to name but a few. Thus it can be seen that the compositions and coatings of the invention are useful for any of a large number of functional applications which include friction reducing coatings, cutting and machining coatings, hydrophobic coatings, anti-bacterial coatings, protective coatings, wear-resistant coatings, corrosion-resistant coatings, thermal barrier coatings, thermal sensing coatings, and conductive coatings, to name but a few. The compositions and coatings of the invention impart surface modification which can be permanent, long lasting, semi-permanent, temporary, or sacrificial modifications and coatings.

The invention provides for compositions, coating and methods of coating a substrate by depositing particles on the substrate to form a layer thereon. The particles may be deposited to form a single mono atomic layer, or the particles may be deposited in several deposition steps to form multiple layers. Each layer may be continuous or discontinuous. The particles may be deposited from a vapor phase, a liquid phase, a solid phase, and any combinations thereof. For deposition of multiple layers, it is not necessary that for the layers to comprise the same material/particles as one another.

The particles of the deposition steps (i.e., starting material, particles being deposited) may comprise a single material or type of particle, or may comprise multiple materials (a combination of different types of particles). The particles may themselves be coated articles, that is, they maybe overcoated particles.

Substrates useful in the invention may be any substrate having any type of surface, texture, and/or porosity. For example, a substrate surface having crevices and or filled crevices (e.g., filled with particles by an infiltrating coating process of the invention). The substrate includes any particle(s), overcoated particle(s), mixture of particles, or alloyed particles. Thus, when the substrate is a particle or alloyed particles the coated article produced is an overcoated particle(s). The overcoated particles of the invention may be used as the deposition material for a deposition step in a coating method of the invention and thus be deposited on a substrate to form a layer.

The methods of the invention for coating a substrate may further comprise a post processing step providing for in situ processing of the coating, such as, for example, the coating surface is decomposed or altered. Thus, the surfaces of the coatings of the invention may be post and/or in situ processed, such as, decomposed. This post processing event/step may take place as a function of time and/or chemical reaction. For example, the surface of the coating may exhibit a release of agent over times, either a long or short period of time (i.e., slow release or fast release).

The layers and coatings of the invention may be isotropic and/or anisotropic having surfaces with isotropic and/or anisotropic properties. The surfaces of the layers and coatings of the invention may be patterned and/or textured and this patterning and/or texturing may be continuous or discontinuous. With respect to the textures and/or patterns on the surfaces of the inventive coatings, the distribution of the texture/pattern may be random, organized, uniform, or any combinations thereof. The layers and coatings themselves may be continuous or discontinuous. The inventive coatings/layers of the invention may comprise a mono layer, or multiple deposition steps may be carried out to produce multiple layers.

One embodiment of the present invention provides composite coatings and articles coated therewith. With respect to the outer surface of the composite coating, the outer surface morphology has an innovative nanostructured, textured surface. The "inner" surface of the coating/layer is defined herein to be the coating/layer surface in contact with, or proximal to, the substrate, and the "outer" surface is defined to be the coating/layer surface distal from the substrate. The distribution and/or density of the texture on the surface is not a limiting feature of the invention and is governed by many parameters such as the size of the protrusions, the material selected for use in the layer and/or coating, the function/purpose of the coating and/or coated article.

One example of such a textured surface of the invention is a surface comprising a distribution of a plurality of protrusions. It is also possible to describe the textured surface as comprising a plurality of concavities, the concavities being a result of the protrusions extending out from the surface. These concavities need not be continuous or in direct contact with each other, that is, they may be discontinuous relative to one another. The concavities may also be in contact with one another thereby forming valleys, or troughs at that areas of contact. The non-protruding surface area may also comprise non-concave or relatively level, or flat surface regions. Generally each of the protrusions is between 0.01 and 50 micrometers, preferably between 0.1-25 micrometers and more preferably between 0.5-15 micrometers, and even more preferably between 0.5-5 micrometers. There may be variations in the size of the many protrusions of a surface The protrusions may have any shape, such as, elongated, rounded, peaked, dome-like, and any combination of shapes thereof to list but a few. Generally the plurality of protrusions of a surface are of a single general shape, but it is also possible for the surface to comprise protrusions of any two or more shapes (i.e., a mixed population of protrusions). In one particularly preferred embodiment, the protrusions are dome shaped and are referred to as a lotus leaf morphology.

Generally the depth of the reservoirs is typically of a size equivalent or similar to the size of the protrusions. As described previously with respect to the protrusions, the density of reservoirs on the surface is not a limiting feature of the invention and is governed by many parameters such as the size of the protrusions, the material selected for use in the layer and/or coating, the function/purpose of the coating and/or coated article, and the process parameters used in making the surface, to name a few.

The area around the protrusions is referred to herein as concavities but may also be referred to as microcavities, reservoirs, pores, pockets, crevices, valleys, troughs, dimples, indentations, fossa, depressions, and any term conveying the a degree of concavity. One innovative feature of this nanostructured coating is that the concavities of the surface of the inventive coating may serve as reservoirs and thus may be partially filled, fully filled, or covered with an overlay material. The concavities may be partially filled or fully filled with at least one of the group consisting of diamond, silicon, nitrides, carbides, steel, carbonitrides, borides, sulphides, chalcogenides, oxides, silicides, polytetrafluoroethylene, and any combinations thereof. The concavities of the surface of the inventive coating may be entirely covered with, or submerged under a cover, cap or layer comprising at least one of the group consisting of diamond, silicon, nitrides, carbides, steel, carbonitrides, borides, sulphides, chalcogenides, oxides, silicides, polytetrafluoroethylene, and any combinations thereof. Examples of preferred members of this overlay group include, but are not limited to, $MoS_2$, $WS_2$, ZnO, $CaF_2$, graphite, $ZnMoO_2S_2$, $NiMoO_2S_2$, PTFE, and any combinations thereof, such as, a combination of $MoS_2+ZnO$, a combination of PTFE+$MoS_2$, and a combination of PTFE+$ZnO_2AlS_2$.

As with all of the deposition and coating steps of the invention, the deposition thickness is governed by many parameters such as the deposition material, and the intended function/purpose of the coating and/or coated article. As with all of the deposition and coating steps of the invention, if a thick deposition is desired, multiple deposition steps may be carried out.

The coatings of the invention are generally composite coatings comprise a base phase and an infiltrate phase. The base phase comprises at least one of the group consisting of diamond, silicon, nitrides, carbides, steel, carbonitrides, borides, sulphides, chalcogenides, oxides, and suicides, and the infiltrate phase comprises at least one of the group consisting of diamond, silicon, nitrides, carbides, steel, carbonitrides, borides, sulphides, chalcogenides, oxides, and silicides. Preferably, the base phase comprises a nitride, such as cubic boron nitride, and the infiltrate phase comprises a nitride different than the nitride of the base phase. Preferably the infiltrate phase comprises at least one nitride of the group consisting of titanium nitride (TiN), titanium carbonitride (TiCN), titanium aluminum nitride (TiAlN), and any other nitride infiltrate In general terms, the present embodiment includes a composition of a first phase/base phase comprising at least one of diamond, silicon, nitrides, carbides, steel, carbonitrides, borides, oxides, sulphides, chalcogenides, and silicides, present with a second phase/infiltrate phase comprising at least one of diamond, silicon, nitrides, carbides, steel, carbonitrides, borides, oxides, sulphides, chalcogenides, and silicides. The invention includes coatings and coated articles made from such compositions, and also includes methods of making and using such compositions, coatings and articles.

In the practice of the present composition, coatings and coated articles made thereof, the diamond, silicon, nitrides, carbides, steel, carbonitrides, borides, oxides, sulphides, chalcogenides, and suicides utilized in the present invention are nitrides, carbides, carbonitrides, borides, oxides, sulphides, chalcogenides, and silicides of metals.

In the present composition, the second phase(es)/infiltrate phase(es) may be "present" by being in a matrix with the first phase; by being infiltrated, dispersed, distributed, or otherwise incorporated into, within, on, or throughout the first phase; by being positioned adjacent the first phase, such as in adjacent layers, or adjacent sections; or by being co-deposited, co-coated, or otherwise co-applied onto a substrate, or by encapsulating the first phase or particles thereof.

Preferably, the second phase is continuous and includes portions in contact with portions of the surface area of the first phase. More preferably, the second phase is continuous and includes a portion in contact with a substantial portion of the surface area of the first phase. Even more preferably, the second phase is continuous and includes portions in contact with substantially all of the surface area of the first phase.

As described previously, the layers and the coatings of the invention may be isotropic and/or anisotropic, having isotropic and/or anisotropic surfaces. The surfaces of the layers and coatings of the invention may be patterned and/or textured and this patterning and/or texturing may be continuous or discontinuous.

Also as described previously, coatings of the present invention may also be subject to a post processing step or steps for in situ processing of the coating, such as, for example, a step wherein the coating surface is decomposed or altered. Thus, the surfaces of the coatings of the invention may be post and/or in situ processed, such as, decomposed, or polished or ground for example to decrease, lessen or remove the surface texture or protrusions. Post processing event(s)/step(s) may take place as a function of time and/or chemical reaction. For example, the surface of the coating may exhibit a release of agent over time, either a long or short period of time (i.e., slow release or fast release).

Another embodiment of the invention provides a tool comprising a work surface having deposited thereon an inventive coating of the present invention. Thus, the work surface of the tool comprises a distribution of protrusions and/or concavities, wherein each of said protrusions is between 0.01 and 50 micrometers, and comprises a base phase comprising at least one of the group consisting of nitrides, carbides, steel, carbonitrides, borides, sulphides, chalcogenides, oxides, and silicides, and an infiltrate phase comprising at least one of the group consisting of nitrides, carbides, steel, carbonitrides, borides, sulphides, chalcogenides, oxides, and silicides. Generally the first phase comprises a nitride and the second phase comprises a nitride different than the nitride of the first phase.

In one embodiment of the tool of the invention, the concavities of the work surface are partially filled or fully filled with at least one of the group consisting of nitrides, carbides, steel, carbonitrides, borides, sulphides, chalcogenides, oxides, suicides, polytetrafluoroethylene, and any combinations thereof thereby resulting in an inventive self-lubricating tool. It is within the scope of the invention for the concavities of the tool work surface to be entirely covered with, or submerged under a cover, cap or layer comprising at least one of the group consisting of diamond, silicon, nitrides, carbides, steel, carbonitrides, borides, sulphides, chalcogenides, oxides, silicides, polytetrafluoroethylene, and any combinations thereof, thereby resulting in an inventive self-lubricating tool. Examples of preferred members of this overlay group include, but are not limited to, $MoS_2$, $WS_2$, $ZnO$, $CaF_2$, graphite, $ZnMoO_2S_2$, $NiMoO_2S_2$, PTFE, and any combinations thereof, such as, a combination of $MoS_2+ZnO$, a combination of $PTFE+MoS_2$, and a combination of $PTFE+ZnO_2AlS_2$. Generally the concavities are filled or covered by deposition of a layer of a depth of less than 25 micrometers, preferably, less than 20 micrometers, more preferably less than 15 micrometers. AS with all depositing and coating steps of the invention, if a thicker deposition layer is desired, multiple deposition steps may be carried out. The substrate tool onto which the inventive coating is applied may be any tool known in the art for machining and cutting hard material such as metal, and include, for example but not limited to inserts, tips, boring tools, turning tools, and grooving tools to name but a few. A wide range of applications including machining, dry machining, hard turning, cutting, milling, and grinding can be addressed by use of the tools of the invention.

The macrostructure of the cutting edge of the innovative tool is that of a single point tool but the microstructure actually reveals a multiple tip performance surface. The inventive tool has a lower friction coefficient, and extended life in comparison to conventional tools and is discussed in detail in the following section of the specification. In addition, one or more coatings of the invention can be applied to the tool work surface to impart any one or any combination of desired properties to the work surface such as, for example, self-lubrication, thermal barrier, thermal adaptation, corrosion resistance, self-cleaning, hydrophobicity properties, to name a few.

Even another embodiment of the invention provides a method of coating a substrate, the method comprising the step of a) depositing solid particles on a substrate to form a base layer. Generally the particles are deposited as a dry phase and are in contact with the substrate. The base layer comprises at least one of the group consisting of diamond, silicon, nitrides, carbides, steel, carbonitrides, borides, sulphides, chalcogenides, oxides, and suicides. Generally, the particles used in the deposition step have an average particle size (APS) of less than 12 micrometers, preferably an APS of less than 10 micrometers, more preferably an APS of less than 8 micrometers. It is within the scope of the invention to carry out more than one deposition step, i.e., repeat step a) one or more times. It is also within the scope of the invention to use a mixture of powder particles having different APS in the deposition step, or to use a mixture of powder particles that contain a single type of particle (i.e., homogeneous) for the deposition step, or a mixture of any two of more different types of particles (i.e., heterogeneous) for the deposition step, or any combinations of these examples, in order to achieve a desired surface morphology for the base layer.

One of the unique aspects of the layers and coatings of the invention is their nanostructured surface morphology. This surface morphology is controlled by numerous parameters of the coating process and may require repetition of step a. For example, in one preferred embodiment of the method of the invention, the base layer is formed by deposition of particles having APS of 7 microns in a first deposition step, followed by deposition of the same type of particles yet having APS of less than 2 microns in a second deposition step, wherein first deposition and second deposition particles are at a mass ratio of 1:1.

The final thickness of the base layer depends on the desired function and may differ from one type of function compared to another. For example, for use as a coating for a metal machining tool, generally an individual base layer is of a deposition thickness of no greater than 25 micrometers, preferably no greater than 20 micrometers. If a thicker base layer is desired, the deposition step may be repeated any number of times.

The inventive coating method of this embodiment further comprises a step b) infiltrating the base layer with an infiltrate to form a continuous composite layer on the substrate. The surface of the resulting composite layer comprises a distribution of protrusions and/or concavities, wherein each of the protrusions is between 0.01 and 50 micrometers. As with each step of each method of the present invention, it is within the scope of the invention that the step b) infiltrating may be repeated at least one time.

As described previously, the infiltrate/second phase may be "present" in the composite coating/layer, by being in a matrix with the first phase; by being infiltrated, dispersed, distributed, or otherwise incorporated into, within or throughout the first phase; by being positioned adjacent the first phase, such as in adjacent layers, or adjacent sections; or by being co-deposited, co-coated, or otherwise co-applied onto a substrate, or by encapsulating the first phase.

Generally the infiltrate is a gas infiltrate and comprises at least one of the group consisting of diamond, silicon, nitrides, carbides, steel, carbonitrides, borides, sulphides, chalcogenides, oxides, and silicides. Generally the gas is in contact with particles of the base layer, and the gas is in contact with portions of the substrate at regions between particles of the base layer.

Generally, the base layer comprises a nitride and the infiltrate comprises a nitride different than the nitride of the first phase. Cubic boron nitride is especially preferred for the base phase. Preferred infiltrates comprise at least one of the group consisting of titanium nitride, titanium carbonitride, and titanium aluminum nitride.

While any deposition method known in the art is useful for the step a) depositing step of the invention, preferably the base layer is formed by electrostatic spray coating (ESC). A non-limiting example of a ESC system suitable for the present invention is shown in FIGS. 1 and 2 and described in detail in the following section of the specification. The ESC deposition process can be carried out with a single spraying gun or adapted to accommodate multiple guns. Additional ESC parameters useful in the present inventive method include: i) voltage in the range of −25 kV to −150 kV, with voltages in the range of −50 kV to −85 kV being preferred; ii) distance between the electrode and substrate of no greater than 300 mm, preferably no greater than 250 mm, more preferably no greater than 2000 mm, with 150 mm being preferred in a particular embodiment; iii) flow rate air pressure in the range of 150-250 kPa, preferably in the range of 175-225 kPa, more preferably in the range of 190-210 kPa; iv) atomizing air pressure in the range of 100-200 kPa, preferably in the range of 115-180 kPa, more preferably in the range of 125-150 kPa.

The infiltrating step may be achieve by any such method known in the art such as, chemical vapor infiltration (CVI), plasma enhanced CVI, physical vapor deposition (PVD), reactive PVD, but not restricted to their spin-offs and/or hybrids. In one preferred embodiment, the infiltrate phase is formed by the process of chemical vapor infiltration (CVI). CVI is similar to its common counterpart, chemical vapor deposition. The chemistry is the same for both processes, but deposition or growth rates are controlled in a different manner. In CVI, the rate of deposition must be slowed down so that pores can be filled before they are sealed by the growing film, leaving voids in the coating. Proper filling is assured if the rate of diffusion of the reactants within the porous body, either in the gas phase or as surface species, is greater than the rate of growth of the film. Diffusion rates and growth rates are both a function of temperature, so just reducing temperature is not a satisfactory method for developing a CVI process. It is better to control the rate of the reaction chemically so that heat can still be a driving force for the diffusion processes.

Any CVI reactor may be used such as for example, a Bemex vertical reactor. Generally the CVI is carried out in two steps: 1) slow deposition of infiltrate to encapsulate particles of the base layer, and 2) a fast deposition to fill large pores and to form a capping layer of infiltrate, generally less than 7 micrometers, preferably less than 5 micrometers. To achieve proper adhesion and the inventive surface morphology, the following parameters are useful: in step 1: temperature in the range of 700-1000° C., H2/TiCl4 in the range of 25-50, preferably 30-40, N2/TiCl4 in the range of 5-20, preferably 7-15, HCl/TiCl4 in the range of 1-10, preferably 1-5, and TiCl4 flow rate in the range of 0.1-1.0 ml/min, preferably in the range of 0.3-0.8 ml/min, and chamber pressure in the range of 100-175 mBar, preferably in the range of 125-150 mBar; step 2: temperature in the range of 700-1000° C., H2/TiCl4 in the range of 30-90, preferably 60-75, N2/TiCl4 in the range of 10-50, preferably 20-30, with TiCl4 flow rate in the range of 0.1-1.0 ml/min, preferably in the range of 0.3-0.8 ml/min, and chamber pressure in the range of 100-300 mBar, preferably 150-250 mBar.

The method may further comprise the step c) of depositing onto said composite layer at least one of the group consisting of diamond, silicon, nitrides, carbides, steel, carbonitrides, borides, sulphides, chalcogenides, oxides, silicides, polytetrafluoroethylene, and any combinations thereof, with the goal of forming an "overlay" on said composite layer. Examples of members of this overlay group include but are not limited to MoS2, WS2, ZnO, CaF2, graphite, ZnMoO2S2, NiMoO2S2, PTFE, chloride soaked MgO, silver particles, and any combinations thereof, such as, a combination of MoS2+ZnO, a combination of PTFE+MoS2, and a combination of PTFE+ZnO2AlS2. In one preferred embodiment of the invention, the deposition thickness of this overlay is generally a deposition thickness less than 25 micrometers, preferably less than 20 micrometers, more preferably less than 15 micrometers. If a layer of greater thickness is desired, multiple deposition steps can be performed. As with all deposition steps of the invention, the deposition thickness is governed by the deposition process, deposition material and function of produce, to list but a few. It is possible that any subsequent overlay deposition step(s) use an overlay material different from the first overlay. Generally the particles of this overlay group are present in the overlay layer as nanosized particle and are generally less than 1.0 micrometer.

The method may further comprise the step d) of adhering/securing said overlay onto said composite layer. This step may be required to ensure proper adhesion of the overlay to the composite layer. This is generally carried out by any heat treatment or curing process known in the art such as, for example, dehydrating, baking, sintering, and any combination thereof. Generally the temperature used in the curing process should be lower than the oxidation temperature of the overlay material. For example, if MoS2 is used for the overlay, the curing temperature should not exceed 400 degrees C. A preferred adhering/securing curing treatment for step d is a curing process comprising the following steps: i) dehydrating via use of IR lamp for 10-120 seconds, ii) baking in a furnace for 10-45 minutes, and iii) sintering in a furnace for 20-360 minutes. The times required for each step of the curing process is dependent upon the thickness of the composite, the thickness of the overlay, and also the material selected for use therein.

The method may further comprise the step of selectively removing portions of the cured overlay from the composite layer. This can be achieved by any means known in the art for removing, texturing and/or etching a surface, and includes laser texturing and plasma etching. The purpose of this step is to selectively remove overlay in order to expose or reveal desired portions of the underlying composite layer. The amount of etching carried out depends on the desired function of the coated article. For example, when the method is for making a self-lubricating tool, it may be desired to expose only the domes/protrusions such that the overlay (i.e., lubricant) remains only in the concavities/reservoirs. The surface roughness Ra value of the final coating depends upon the desired function of the coating or coated article. For example, for use as a cutting tool, it may be desired that the Ra have a value less than 7, preferably less than 5, more preferably less than 3 micrometers.

As stated previously, all of the coating methods of the present invention may also provide a post processing step or steps for in situ processing of the coating, such as, for example, a step wherein the coating surface is decomposed or altered. Thus, the surfaces of the coatings of the invention may be post and/or in situ processed, for example but not limited to, decomposed, polished or ground to lessen or remove the surface protrusions, decomposed or etched to create crevices, concavities, or pores. Post processing event(s)/step(s) may take place as a function of time and/or chemical reaction. For example, the surface of the coating may exhibit a release of agent over time, either a long or short period of time (i.e., slow release or fast release).

In further embodiments of any of the above embodiments, the first phase comprises a nitride and the second phase comprises a nitride different that the nitride of the first phase.

In even further embodiments of any of the above embodiments, the first phase comprises cubic boron nitride.

In still further embodiments of any of the above embodiments, the first phase comprises cubic boron nitride, and the second phase comprises at least of titanium nitride (TiN), titanium carbonitride (TiCN), titanium aluminum nitride (TiAlN), and any other nitride infiltrate.

Still another embodiment of the invention provides a method of shaping a workpiece comprising contacting the workpiece with a tool of the invention. As described above, the inventive tool work surface comprises a distribution of protrusions and/or concavities, wherein each of said protrusions is between 0.01 and 50 micrometers, and comprises a base phase comprising at least one of the group consisting of diamond, silicon, nitrides, carbides, steel, carbonitrides, borides, sulphides, chalcogenides, oxides, and silicides, and an infiltrate phase comprising at least one of the group consisting of diamond, silicon, nitrides, carbides, steel, carbonitrides, borides, sulphides, chalcogenides, oxides, and silicides. Generally the first phase comprises a nitride and the second phase comprises a nitride different than the nitride of the first phase. Surprisingly, the present inventors found that the use of the inventive tool to shape a workpiece results in an improved finish on the workpiece, as compared to one achieved by use of conventional tools. Therefore, with use of the tool of the invention, the conventional step of polishing the workpiece is not required and can be omitted.

Yet another embodiment of the invention provides nanoparticle-based compositions, coatings made from such compositions, and coated articles made from such coatings and compositions. The inventive nanoparticle-based compositions possess characteristics determined by the nature of the particles therein. For example, a preferred composition of the invention has temperature adaptive character. The nanoparticle-based compositions and coatings of the present embodiment may have any one of a number of functions which is at least partially dependent on the particles of the composition as well as the substrate onto which they are deposited. For example, a particularly preferred embodiment of the nanoparticle composition and coating is a temperature adaptive nanoparticle composition for use as a dry lubricant and for application as a lubricating coating onto a substrate or work surface, wherein the composition comprises $MoS_2$ and $ZnO$. Generally, the particles of the inventive nanoparticle composition comprise at least one of the group consisting of diamond, silicon, nitrides, carbides, steel, carbonitrides, borides, sulphides, chalcogenides, oxides, and silicides. Examples of specific members of this group applicable in the present invention include, but are not limited, to $MoS_2$, $WS_2$ $ZnO$, $CaF_2$, graphite, $ZnMoO_2S_2$, $NiMoO_2S_2$, PTFE, chloride soaked MgO, silver particles, and any combinations thereof such as, a combination of $MoS_2+ZnO$, a combination of $PTFE+MoS_2$, a combination of $PTFE+ZnO_2AlS_2$. In a particular embodiment of the nanoparticle composition, the composition comprise a combination of $MoS_2+ZnO$.

In one embodiment of the composition, the compositions comprise a base or dominant particle having supplemental or coating particles deposited thereon. That is, the compositions comprise alloyed particles wherein a base particle is overcoated or encapsulated with supplemental/coating particles. In the preferred embodiment referenced above where the compositions comprises a combination of $MoS_2+ZnO$, the base particles are $MoS_2$ and the supplement/coating particles are $ZnO$. Generally the alloyed particles of the composition have an APS in the nano scale range and thus have an APS of less than a micron. With respect to the size of the base particles and the supplement/coating particles used to make the composition, they may be any size so long as the end product alloyed particles are in the desired size range of APS less than a micron. Typically, the APS of both the base particles and supplement particles is less than 2 microns, preferably under 1 micron, and more preferably the base and supplement particles are nanosized particles having APS in the nanometer range/scale. Generally, the size of the base particles and coating particles differ by an order of 10. For example, the base particle may have APS of a few hundredths, and the coating particle may have APS of a few tenths. The size ratio of the base particles and coating particles is not intended to be construed as a limiting feature of invention. The compositions may comprise any combination of particles and selection thereof is dependent on the intended purpose or function. The supplemental particles may cover any to all of the surface area of the base particle, with surface coverage ranging anywhere from 1% to 100% coverage. Thus, the overcoating may be continuous/conformal, or it may be discontinuous. The overcoating may be a single monolayer or it may comprise multiple layers. In addition, the overcoating may be permanent, long lasting, semi-permanent, temporary, or sacrificial in nature and "life" span. The many advantages of the inventive overcoated particles and methods for making same include: 1) multilayering of coating in dispersion matrix; 2) combinatorial dispersion of phases over various dimensional scales; and 3) addition of functional promoters to the dispersion matrix.

The resulting metastable phase alloyed particles can be used as deposition material and deposited on a substrate to form a layer/coating thereon. The resulting metastable phase alloyed particles may be subject to further deposition steps in order to produce an overcoating on the alloyed particles. The overcoated alloyed particle can then be used as deposition material and deposited on a substrate to form a layer/coating of thereon.

Even still another embodiment of the invention provides a method of making the inventive nanoparticle-based compositions, wherein the method comprises combining two or more different types of particles to create an alloy. Generally the method comprises a step of depositing a layer of coating particles on a base particle substrate to produce alloyed particles. The deposition thickness is determined by the desired function of the composition but is generally in the range of 0.1 nm to micrometers, preferably 1 nm-1 micrometer, more preferably in the range of 1 nm-500 nm. In a particularly preferred embodiment, the deposition thickness is 5-10 nm. As described above for the inventive nanoparticle composition, the base layer may cover any portion to all of the surface area of the base particle ranging from 1-100%, and may thus be continuous/conformal, or may be discontinuous. The base layer may be a single monolayer, or subsequent depositions may be carried out thus forming multiple layers within the base layer. Thus, in some embodiments of the method, step a) depositing may be repeated one or more times to achieve the desired base layer. If a subsequent deposition is carried out, the same alloyed particles or a different type of alloyed particles may be deposited. That is, the layers of the multiple layers need not be of the same chemical composition. In addition, the base layer may be permanent, long lasting, semi-permanent, temporary, or sacrificial in nature and "life" span.

Any deposition method know in the art may be used herein and include: i) vapor phase deposition methods such as, CVD, PVD, plasma deposition; ii) liquid phase deposition (LPD) methods; and iii) solid phase deposition methods such as ball milling, air jet milling, and electrostatic spray coating of powder particles. In a preferred embodiment of the invention, solid phase deposition methods are used, specifically ball milling.

The parameters of the solid phase deposition step include: ratio of base particle to coating particle generally in the range of 10:1 to 1:10, preferably 5:1 to 1:5, more preferably in the range of 1:3 to 3:1, alloying time of 0.5-10 hours, preferably 1-5 hours, environment of air or dry nitrogen. In one preferred embodiment of the invention, a 1:1 ratio of base particles to coating particles is mechanically alloyed for 2 hours in a N2 gaseous environment. As stated above, step a) depositing may be repeated at least once if necessary to obtain the desired base layer.

The method may further comprise a step b) treating the first stage alloyed particles to produce annealed alloyed particles in a metastable phase. Any method known in the art to be useful for stabilizing a composition or alloy may be used. Generally the treating step comprises heating the alloyed particles. Heating may be carried out using any method known in the art such as in a furnace and is generally carried out at a temperature below the oxidation temperature of the particles. Annealing conditions include: temperature in the range of 100-1000 degrees C., ambient or dry N2 environment.

While the average particle size of the starting material is important, it is not as important as the APS of the finished material/alloyed particles. As described previously, the overcoated/alloyed particles of the invention have an APS in the nano scale range and thus have an APS of less than a micron. A preferred APS of the overcoated particles is less than 600 nm.

Yet still another embodiment of the invention provides a method of making the inventive nanoparticle-based coatings, and coated articles. Generally the method comprises the step a) depositing alloyed particles (inventive nanoparticle composition) of the invention on a substrate to form a base layer. Generally it is preferred that the deposition of the layer on the substrate is uniform, but it may also be desired that the layer not be uniform. The layer may cover any portion to all of the surface area of the substrate ranging from 1-100%. Thus, the layer may be continuous/conformal, or it may be discontinuous. The layer may also be a single monolayer or subsequent depositions may be carried out thus forming multiple layers within the base layer. Thus, for some embodiments of the method, step a) depositing may be repeated one or more times to achieve the desired base layer. If a subsequent deposition(s) is carried out, the same alloyed particles or a different type of alloyed particles may be deposited. In other words, the layers of the multiple layers need not comprise the same alloyed particles or chemical composition as one another.

Any deposition method known in the art can be used. One preferred method is electrostatic spray coating. A non-limiting example of a ESC system suitable for the present invention is shown in FIGS. 1 and 2 and described in detail in the following section. The ESC deposition process can be carried out with a single gun or multiple guns. Additional ESC parameters useful in the present inventive method include: i) voltage in the range of −25 kV to −150 kV, with voltages in the range of −50 kV to −85 kV being preferred; ii) distance between the electrode and substrate of no greater than 250 mm, preferably no greater than 200 mm, more preferably no greater than 150 mm; iii) flow rate air pressure in the range of 150-250 kPa, preferably in the range of 175-225 kPa, more preferably in the range of 190-210 kPa; iv) atomizing air pressure in the range of 100-200 kPa, preferably in the range of 115-180 kPa, more preferably in the range of 125-150 kPa.

The desired coating thickness depends on the desired function of the product but is generally determined by the desired function of the composition but is generally in the range of 0.5 to 50 micrometers, preferably 1 to 25 micrometers, more preferably in the range of 5-15 micrometers.

Still even another embodiment of the invention provides a tool having a work surface. Generally the tool work surface has deposited thereon a coating comprising the nanoparticle-based composition of the invention. The desired coating thickness is generally in the range of 0.5 to 50 micrometers, preferably less than 30 micrometers, more preferably less than 25 micrometers, even more preferably less than 20 micrometers.

As described previously in the present specification, the substrate tool onto which the inventive coating is applied may be any tool known in the art for machining and cutting hard material such as metal, and include, for example inserts, tips, boring tools, turning tools, and grooving tools to name but a few. A wide range of applications including machining, dry machining, hard turning, cutting, milling, and grinding can be addressed by use of the tools of the invention.

Still yet another embodiment of the invention provides a method of shaping a workpiece comprising contacting the workpiece with a tool of the invention.

In further embodiments of any of the methods of the invention for coating a substrate, any step of the method may be repeated at least once prior to performing the subsequent step if necessary to produce the desired layer and/or coating.

EXAMPLES

Example 1

Synthesis of a cBN—TiN Coating on WC—Co Tool Inserts—Coating having Lotus Leaf Surface Morphology The present example demonstrates one embodiment of the present invention, that is, the synthesis of a hard coating cBN—TiN on WC—Co tool inserts wherein the formation of the surface morphology of the coating is a controlled process and results in the inventive surface morphology, specifically a morphology referred to herein as "lotus leaf". The present embodiment of the invention is useful in many applications such as, for example, dry machining of steels, cast irons, stainless steel, aluminum alloys, nickel, and titanium alloy.

A significant amount of experimentation with experiment parameters was required in order to produce the inventive surface morphology. A systematic approach was taken which included maximizing effectiveness of the powder material (starting material) as well as the processing techniques (ESC and CVI). This example describes: the design of the coating surface morphology; procurement of process specific cBN particles; ESC deposition of the cBN particles at optimized conditions; chemical vapor infiltration of TiN; and characterization of the surface morphology of the coating.

1. Coating Design and Procurement of cBN Particles and Tool Inserts

The inventive surface morphology follows a biomimetic pattern, more specifically, the design pattern referred to as a lotus leaf which features reservoirs surrounded by protruded domes. The reservoirs serve as ideal receptacles for materials such as a solid lubricants, for example, when the sub-coating and the domes are hard phases. The inventive lubricant coating can refresh the surface with lubricant consistently and continually, a feature which is significantly different from that of solid lubricant of conventional layered structure. cBN—TiN composite coatings have proven to be effective for cutting tool applications and the inventors thus chose to experiment with cBN—TiN for use as a hard phase for the coating of this example. MoS2 (molybdenum disulfide) and PTFE (polytetrafluoroethylene) are widely used as solid lubricants for various industrial applications such as drilling and sliding operations, and were utilized for the lubrication phases in the present example.

With respect to the cBN powder starting material, because powder particles with a wide range of sizes are effective in controlling the gloss and texture of powder coated films, the inventors elected to experiment with a combination of cBN powder particles having various APS (average particle size). cBN powders with APS of less than 2 μm and cBN powders with APS between 5 to about 10 μm were obtained from GE Superabrasive, and were characterized as submicron (<2 μm) and micron (APS~7 μm) powders. The WC—Co uncoated tool inserts utlized in the present example are SNMA 432 (HA grade). The tools used in this example were purchased from Stellram, a Tennessee-based tool manufacturer for metal cutting industries.

1.2 ESC Deposition of Combined cBN Particles at Optimized Conditions for Desired Surface Morphology Generally, electrostatic spray coating (ESC) involves physical spraying of particulates onto a substrate by utilizing a static electric field to guide the charged particles to an electrically grounded substrate surface. The particulates can be from either dry powder or a particulate dispersed solution (mist). The particles can be deposited uniformly on a given surface due to the electric field lines, which terminate over the entire surface area of the electrically grounded substrate. The working mechanism for this ESC process is corona charging, which is a high-voltage process in which gaseous ions transfer their charges to the powder particles by kinetic interactions. A schematic of a single gun ESC setup is shown in FIG. 1.

In general, deposition of powder particles in the submicron and nanometer size range is much more complicated than that of microsized particles. Submicron and nanosized particles belong to ultrafine particles (Geldart-C), which have extremely high surface energy and thus, in the transport and disposition process, they tend to clump with each other or to stick to the boundary of contact to minimize the surface energy. The agglomeration of the particles with reduced sizes significantly increases the difficulty for conventional powder delivery and deposition process. However, due to corona charging in the ESC process, particles are charged unipolarly and repel each other, thus reducing the chance for cluster formation and providing opportunity to obtain uniform deposition. Since the charged particles follow the field lines emanating from the entire surface of the grounded substrate, the spray coating is formed all over the substrate surface, which is a significant advantage for coating surfaces having a complex geometry.

ESC deposition is affected by many factors, which include (1) the process parameters such as electrical potential at the electrode, electrode-substrate distance, and main air pressure; (2) physical properties such as particle size and distribution, particle shape, and electric resistivity of the powder particles. In addition, a flexible configuration of the deposition system is desired for tailoring various applications.

FIG. 2 is a photograph of the ESC setup used in this example. For this setup a laboratory-scale electrostatic spray coating system was set up in order for the inventors to carry out the optimization of process parameters for depositing cBN particles of various sizes. As shown in FIG. 2, the present setup consists of seven major units including: (1) powder feeder, (2) powder delivery pump, (3) powder spray gun, (4) grounded substrate holder, (5) deposition chamber, (6) powder recycling unit, and (7) control unit. This ESC setup has provided an important technical platform for the realization of the present inventive surface morphology comprising controlled cBN deposition to achieve a controlled surface morphology and the follow-up MoS2-PTFE deposition.

The present setup can also be reconfigured in order to increase the scale of the system which is useful in order to increase the number of tools produced, and/or to increase the variety of tool geometry. For example, the setup can be automated for batch processing. The ESC setup can also comprise more than one spray gun and can even comprise multiple guns.

Referring now to the deposition of the cBN particles to produce a controlled surface morphology, four major groups of deposition were designed as indicated in Table 1. The experimental designs included: i) adjusting the electrical voltage (−33 kV, −60 kV, −100 kV) at the electrode; ii) applying contact masks of controlled size on the tool inserts to achieve controlled deposition pattern; iii) and modifying the combinations of cBN powders in the submicron and micron sizes (experimenting with different APS).

Based on the SEM (carried out via ESEM, XL 30 Philips) characterization of all the depositions, it was found that deposition of the cBN particles of micron APS followed by deposition of the cBN particles of submicron APS (in a mass ratio of 1.0:0.75, deposition 3 in Table 1) at electrical voltage of −60 kV, electrode-substrate distance of 150 mm, flow rate air pressure of 207 kPa, and atomizing air pressure of 138 kPa, produced promising surface morphology (FIG. 3). FIG. 3 is an SEM of ESC-deposited cBN on SNMA 432 (HA) using: (a) submicron cBN deposited at −60 kV; and (b) micron cBN deposition followed by submicron cBN deposition (in a mass ratio of 1:0.75) at −60 kV. The deposition had a thickness of about 15 μm, with average pores size of 2~4 μm. Since this deposition was not a self-assembly process, the domes on the surface were statistically similar to a lotus leaf. This deposition was expected to form domes with average size of about 3~6 microns.

(cBN—TiN) to that of lotus leaf: (a) surface morphology of lotus leaf; (b) surface morphology of the synthesized cBN—TiN coating.

Example 2

ESC Deposition of MoS2 Nanoparticles Dispersed in PTFE onto the cBN—TiN Coating having a controlled Surface Morphology)

The purpose of this example was to apply a lubricant phases onto the cBN—TiN hard phase synthesized in Example 1. Specifically the aim was to apply lubricant phase into the reservoirs between the lotus leaf domes of the cBN—

TABLE 1

Design of depositions for the creation of biomimetic surface morphology

| Deposition No. | Configuration | Purpose |
|---|---|---|
| 1 | Submicron cBN particles deposited at electrode-substrate distance of 150 mm, flow rate air pressure of 207 kPa, atomizing air pressure of 138 kPa, but electrode voltage of −33 kV, −60 kV, and −100 kV, respectively. | Modification on the bias of the substrate for different surface morphology. |
| 2* | Starting with the deposition of submicron cBN and then caped with micron cBN particles. Their mass ratio was 1:1 and 1:0.75, respectively. | Deposition of submicron cBN as the first layer for improved adhesion, caped layer of micron cBN for desired surface morphology. |
| 3* | Starting with the deposition of micron cBN and then caped with submicron cBN particles. Their mass ratio was 1:1 and 1:0.75, respectively. | Deposition of micron cBN as the first layer for desired surface morphology, caped layer of submicron cBN for more flexible surface texture. |
| 4* | Deposition of submicron cBN on substrates with contact masks | Controlled deposition pattern by the use of contact masks. |

(*2, 3, and 4 were deposited at electrode voltage of −60 kV with the other conditions the same as those used in 1.)

Following the ESC step, chemical vapor infiltration (CVI) was used to introduce the binder phase, TiN, for the formation of the functional composite hard coating (cBN—TiN), while retaining the surface morphology created in the above step, ESC deposition of cBN. In addition, the CVI process secures the adhesion between cBN particles, hard-phase coating and the substrate which is also critical. In general, CVI process parameters include: temperature and its distribution along reaction tube, gas pressure (partial pressure of gas components, in this case, H2, N2, Ar, and HCl) inside the tube, and linear velocity. These parameters affect not only the adhesion, but also the surface morphology. In the present example, the infiltration of TiN was carried out in a Bemex vertical reator in two steps: 1) slow deposition of TiN to encapsulate cBN particles, and 2) a fast deposition to fill large pores and to form a capping layer (of <2 μm) of pure TiN. Considering the adhesion and surface morphology requirements of the invention, the following parameters were used: step 1: temperature, 100° C., H2/TiCl4=36, N2/TiCl4=11, HCl/TiCl4=2.2, with TiCl4 flow rate of 0.6 ml/min, and chamber pressure of 133 mBar; step 2: temperature 1000° C., H2/TiCl4=72, N2/TiCl4=26, with TiCl4 flow rate of 0.5 ml/min, and chamber pressure of 200 mBar. SEM (XL 30, Philips).

Characterization of the surface morphology of the resulting cutting inserts revealed statistically arranged patterns which were strikingly similar to that of a lotus leaf. FIG. 4 shows SEM pictures showing the similarity of the surface morphology of the inventive synthesized hard coating TiN phase, thereby realizing the innovative integration of hard phases and lubricant phases of the invention.

MoS2 nanoparticles in a PTFE nanoparticle dispersion was chosen for use as the lubricant phase. The technical approach followed was: ultrasonic vibration for a uniform dispersion of the MoS2 in PTFE; ESC deposition of the dispersion; and multi-step curing of the deposition. This example involves the procurement of MoS2 nanoparticles and PTFE nanoparticle dispersion, dispersion of the MoS2 in the PTFE, deposition of the dispersion using ESC, and curing of the deposition.

2.1 Procurement of MoS2 Nanoparticles and PTFE Nanoparticle Dispersion

It was desired that the MoS2 particles utilized herein have an average particle size (APS) of less than 100 nm, which is a size the inventors felt would facilitate the dispersion of the $MoS_2$ particles into the PTFE. However, MoS2 particles of this size were not available as an off-the-shelf product. MoS2 particles less than 100 nm are available as a custom order but time constraints allowed only for procurement of the off-the-shelf MoS2 particles. Thus, MoS2 particles with average particle size of about 700 nm were purchased from Alfa-Aesar® for this example. Scanning electron microscope examination on the as-purchased MoS2 particles showed an average size of approximately 700 nm, shown in FIG. 5(a).

In order to achieve $MoS_2$ particles having the desired APS of about or less than 100 nm, a ball milling process was employed. Ball milling is an effective process to reduce particle size. In this investigation, a charge load of 15 g MoS2 with average particle size of 700 nm was dry-milled in a 8000 D mixer/mill (hardened steel vials, Spex CertiPrep) for 6 hours. SEM characterization of the ball milled MoS2 indicated that the size of the as-purchased MoS2 particles was significantly reduced from 700 nm down to the desired nano-size of about 100 nm, as shown in FIG. 5(b).

The production of nanaoparticles via ball milling is another embodiment of the present invention, and brings new opportunity to the realm of nanostructured materials.

The PTFE nanoparticle dispersion used in the present example was obtained from Dyneon™, a 3M company. The dispersed PTFE particles have an average particle size of about 225 nm.

In order to uniformly disperse the ball-milled MoS2 particles in PTFE for subsequent use in ESC deposition, a mass percentage of 8% and 15% of MoS2 particles was mixed with the corresponding mass of PTFE and dispersed with the assistance of an ultrasonic vibrator for 20 to about 30 minutes. The rationale for selecting such mass percentages was to balance the required lubrication property and the uniformity of dispersion. Optical microscopy (OM) examination on the resulting dispersion showed that ball-milled MoS2 particles having APS of about 100 nm dispersed more uniformly in PTFE than the as-purchased MoS2 particles having APS of 700 nm.

Deposition of MoS2-PTFE on CBN—TiN Hard Phases:

This task was carried out using the same ESC setup as was used in example 1 for depositing cBN particles. However, since the MoS2-PTFE was in dispersion mode, the difficulty to control the thickness and the coverage was significantly increased in comparison to the deposition of dry powders. If the deposition is above a threshold value, it tends to form numerous cracks, as shown in FIG. 6, which will affect the functionality of the deposited lubricant phases. FIG. 6 shows via optical micrograph, the cracks formed in thick deposition (thick defined here as greater than about 25 µm) at each deposition cycle (black spots are MoS2). This study also revealed that the deposition thickness has critical effect on the formation of cracks in the following curing process.

In order to reduce the chance of crack formation, deposition thickness has to be limited to about 10~12 µm for each deposition cycle. If a thick deposition is needed, a multiple deposition step is preferred. This study revealed that the optimized deposition condition for MoS2-PTFE was: electrode voltage, −75 kV, electrode-substrate distance, 150 mm, flow rate gas pressure, 207 kPa, and atomizing air pressure, 207 kPa. A typical deposition of 15% MoS2 in PTFE at this optimized condition is illustrated in FIG. 7, which shows no cracks are formed using the above parameters for deposition. Specifically FIG. 7 shows a SEM picture showing the ESC deposition of MoS2-PTFE on SNMA 432 tool insert at optimized condition (thickness less than 12 µm). The present setup can also be reconfigured in order to increase the scale of the system which may be useful for increasing output.

The next step was to cure the MoS2-PTFE coating and was carried out by a multiple-step curing process comprising dehydrating, baking, and sintering at different temperature. The curing process ensures proper adhesion of the lubricant phases to the tool insert. It is important to note that the curing temperature has to be lower than the oxidization temperature of MoS2 which is approximately 400° C. With respect to the function of the different steps of the curing process, the dehydrating step is to remove the water involved in the PTFE dispersion and was achieved by placing the MoS2-PTFE deposited tool insert underneath an IR lamp for 20~60 seconds, depending on the thickness of deposition. The baking step of the process was to further remove the residual water in the MoS2-PTFE deposition and was carried out in a furnace (Fish Scientific Isotemp® Muffle Furnace 750 series, model: Cat. No. 10-750-58) at 295° C. for 25 minutes. The sintering step of the process was performed in the same furnace used for baking but at a temperature of 390° C. and a time of 240 minutes. The reason to keep the coated tool inserts in the furnace for this amount of extended time was to oxidize the carbonaceous residue, thus improving the tenacity of the coating on the tool insert surface. FIG. 8 is a picture showing the cured nano MoS2-PTFE deposited on the hard phase cBN—TiN (having a controlled surface morphology) coated tool inserts.

Importantly, in-depth study on the chemistry after the curing will help to understand the tribological behavior in the real application of the coated tools. The present system can also be scaled up to increase production. For example, the furnace presently holds about 75 pieces of the present tool inserts per batch although the capacity can be expanded with the design of a multi-shelf holder for baking and sintering. For example, by using three shelves, each with a capacity to hold 75 tool inserts, 225 pieces could be accommodated in one furnace batch.

2.3. Laser Texturing/Plasma Etching

The purpose of this task was to selectively remove the lubricant phases (MoS2-PTFE) from the domes (cBN—TiN) and reinforce the adhesion of the lubricant phases to the hard phases using an Excimer laser with a wavelength of 248 nm. Lasers are known in the art to be effective tools for texturing the surfaces for various applications. As these studies proceeded, it was realized that PTFE is almost transparent to Excimer lasers with wavelength of 193 and 248 nm. The only possible option in the Excimer laser category is F2-Excimer laser with wavelength of 157 nm, which was unavailable to the inventors at the present time. Thus a transversely excited atmospheric (TEA) CO2 laser (10.6 µm) was selected for use. The specifications of the TEA laser are: laser power, 45 Watt; repetition rate, 300 pulses/second. A CO2 laser has proved an efficient tool in processing PTFE film. A contact mask (30×30 mm2) with arrays of through holes of 250 µm in diameter and 400 µm in center-to-center distance was designed and fabricated to facilitate the laser texturing process. The processing conditions used for the laser processing were: energy density, 20 J/cm2; exposure, 3 pulses (0.01 s). Optical microscopy examination showed that the MoS2-PTFE was successfully and selectively etched from the hard phase domes as desired.

In addition, an oxygen plasma etching process was explored for its readiness in processing PTFE. The oxygen plasma etching process would allow for scaling-up the system and the process is easily developed into a standard continuous/batch process with low cost, high uniform surface properties, high reproducibility and high productivity. The processing conditions used were: excitation frequency, 13.56 MHz; power, 100 W; pressure, 2 Pa; gas flow, 8 cm3/min; etching time, 5 minutes. The time used for etching was based on the initial testing with 2 minutes, 5 minutes, and 10 minutes. Optical examination of the region around the cutting tips displayed that a portion of the deposited MoS2-PTFE was selectively removed (FIG. 9). FIG. 9 is an optical micrograph showing the exposed domes and presence of lubricant in the receptacles after plasma etching for 5 minutes. Considering the benefits associated with plasma etching process (e.g., low cost, easy to process PTFE, and readiness for scale up), the following characterization and tribological testing were all focused on the plasma etched tools.

Characterization of the Coating

The purpose of this task was to characterize the surface morphology using SEM and measure the surface roughness (Ra) using a surface profilometer. High resolution SEM (XL 30, Philips) characterization indicated that surface morphology is very similar to that shown in FIG. 9. Surface roughness was measured using a surface profilometer (Veeco Dektak 3030) on the following tools: i) coated tool having a cBN—TiN coating with controlled surface morphology; ii) coated tool with MoS2-PTFE deposited on cBN—TiN; and iii) plasma etched MoS2-PTFE/cBN—TiN tool. The measurement was carried out around the cutting tip region of each tool at two randomly selected directions, which were consistent for all three tools. The surface roughness, Ra, was in the range of 2~3 μm, and did not show marginal change for all the three tools. However, the MoS2-PTFE deposited and plasmas etched tool insert displayed much less valley peak (negative value), indicating that the "reservoirs" were filled with lubricant phases. FIG. 10a-10c provides the measured surface roughness profiles for: FIG. 10a) coated tool having a cBN—TiN coating with controlled surface morphology; FIG. 10b) coated tool with MoS2-PTFE deposited on cBN—TiN; and FIG. 10C) plasma etched MoS2-PTFE/cBN—TiN tool.

Tribological Studies on the Coating

The objective of this task was to initially evaluate the developed coating in terms of its lubrication properties and resistance to wear in a ball-on-disc mode. For reference, two tools of the invention (a tool coated with cBN—TiN with controlled surface morphology, and a plasma etched MoS2-PTFE/CBN—TiN coated tool) were tested on the same tribometer with the same testing condition with a conventional tool (a MoSTTM coated tool). The conventional MoSTTM coating was applied on SNMA 432 (HA grade) in a conventional layered structure using a PVD process, and has a conventional smooth surface morphology.

The mass of each tool was weighed prior to and after testing using a high resolution balance (0.0001 g) for the evaluation of resistance to wear. If an insert gains weight, it wears the ball; if an insert loses weight, it is worn away by the ball. The testing conditions were as follows:

Ball-on-disc, with the tool as disc, 52100 hardened steel ball (6 mm in diameter);
Environmental conditions: 62±1% RH and 26° C.;
Radius of rotation: 4.5 mm;
Sliding speed: 200 rpm;
Load: 100 g;
Test time: 600 S;
Data acquisition rate used was 50 data points/second.

The coefficient of friction with test time for all the tested tools is shown in FIG. 11 and also Table 2 which provides a summary of the tribological results.

TABLE 2

Coefficient of friction and mass gain/loss of the tested tools

| Tool insert | CBN—TiN coated with lotus leaf morphology | PTFE-MoS2 deposited on CBN—TiN coated and etched | MOSTTM coating coated tool (layered structure) (conventional tool) |
|---|---|---|---|
| Coefficient of friction, μ | ~0.32 | ~0.17 | ~0.21 |
| Mass gain (+)/ loss (−)*, g | +0.002 | +0.001 | −0.001 |

As indicated, the inventive PTFE-MO2 cBN—TiN coating (PTFE-MOS2 deposited on cBN—TiN coated and etched) clearly showed lower friction coefficient (~0.17) than the conventional tool MoSTTM layered structured coating (~0.21). In addition, both of the inventive tools having the inventive coating gained moderate weight in the test period, while the conventional tool coated with MoSTTM in layered structure lost weight, indicating the inventive coating developed herein has better resistance to wear than the conventional coating of the conventional coated tool.

Example 3

Hard Turning Application of cBN—TiN Composite Coated Carbide Cutting Tool

The purpose of this example was to investigate properties of the cBN—TiN coating having controlled surface morphology in hard turning application. The results revealed that the as-deposited cBN—TiN coated tool inserts produced machined parts having a surface roughness comparable to those achieved by surface-finishing process such as grinding and honing. Thus, unlike conventional tools, with the inventive tool the finishing step of polishing the workpiece is not required.

For this example, thoroughly hardened AISI 4340 (~53 HRC) steel was chosen as the workpiece material due to its wide applications in automobile and aerospace industries. It has typical chemical composition of 0.44% carbon, 1.91% nickel, 1.25% chromium, 0.34% molybdenum, 0.68% manganese, and 0.38% silicon. The workpieces (bars) had a diameter of 65 mm and a length of 610 mm. To ensure the hardness and microstructure consistency of the workpiece material from surface to the center of the bar, circular discs were cut from different bars with electrical discharge machining (EDM) for microstructural examination.

Standard grade of WC—Co (6% of Co) with chip breakers (SNMG 432, square shape with nose radius of 0.8 mm, Valenite Inc.) was used as substrate for coating with CBN—TiN. The selection of chip breaker tools is based on the fact that as machining speed goes up, more heat will be produced and few cracks will be initiated, even in hard turning leading to the formation of long chip segments. The segments may cause scratch to the surface of the machined part. To this situation, tools with chip breakers will help.

The cBN—TiN coating tested in this example was synthesized as described in detail in example 1 by depositing cBN particles having APS of less than or equal to 2 μm (from GE Superabrasives) on the tool inserts to form a porous preform with thickness of 10~20 μm, followed by CVI with TiN. The cost of the coated tools is typically close to that of TiN coated tools, and much lower than the cost of PCBN bulk or tipped tools. This is but one of the significant advantages of the coating. Also, in contrast to PCBN coatings, the present inventive coating can facilitate tools of complex geometry such as, for example, chip breakers.

The tool inserts were rigidly mounted on a left hand style tool holder, DSRNL854D, with a side cutting edge angle (SCEA) of 15°, back rake angle of −5°, and side rake angle of 15°, and tested in machining of hardened AISI 4340 steel (as a reference, PCBN tool inserts were also tested).

Previous finish hard turning studies have demonstrated that tools with low cBN content perform better than tools with high cBN content. The cBN—TiN composite coating of the present example contains low cBN percentage (about 40~45% volumetric). Therefore, machining parameters were chosen in accordance with those recommended in the art for low cBN content tools. A wide range of cutting speeds, feed rates, and depth of cut have been used or suggested in the art for finishing hard turning. Typically, when turning hardened steels (above 45 HRC) with PCBN tools, the cutting speeds are between 80 to 200 m/min, depending upon the feed rate and depth of cut. To reduce the white layer thickness and the amplitude of residual tensile stress that is unfavorable for cyclic fatigue, and to keep the machining conditions as close to those suggested in the art, a relatively low surface speed of 100 m/min, a high depth of cut of 0.508 mm, and a feed rate of 0.2 mm/rev were selected. Longitudinal turning of the workpiece using the coated tools were carried out on a CNC lathe (Leblond Makino Baron 60) under dry cutting conditions. Prior to the machining experiments, the oxidized layers were removed using a cBN—TiN coated tool insert. In the machining process, the surface speed was held constant, and the aspect ratio of length-to-diameter (L/D) was maintained to less than 10 in accordance with related standard, ISO 3685.

FIG. 12 is an SEM micrograph of as-deposited CBN—TiN coating at the cutting tool tip. It can be observed that the coating is uniformly distributed over the rake and flank surfaces of the tool. No major surface defects such as cracks were observed in the microscopic analysis. Further, no "dog-bone effect" due to coating was observed at the tip of the tool. As compared to typical CVD TiN deposited carbide tool, relatively higher surface roughness was anticipated due to the presence of cBN particle clusters. The coating surface roughness value ($R_a$) was found to be ~5 microns. The cBN—TiN coating was observed to be dense (little or no observed cavities) when studied using cross-sectional SEM.

XRD spectra were recorded for the starting material cBN powder and composite CBN—TiN coating on WC—Co substrate of interest (data not shown). The results clearly demonstrated signatures of measurable and stoichometric cBN and TiN phases in the composite coating. Major signatures of the CVI infiltrated TiN are retained in the composite matrix. The analysis was performed on various regions of the tool. It is concluded that the infiltration of TiN phase does not cause degradation of cBN particles, which could be potentially harmful for achieving good machining results. The cBN particles are estimated to be about 40~45% by volume in the composite coating.

Adhesion tests were also performed wherein the loading rate was set as 10 N/mm (data not shown). A scratch of 10 mm length was produced as the diamond indenter was drawn across the coated surface. The onset of the coating failure was determined by a combination of optical microscopy (OM) and acoustics emission (AE). The results showed that the cBN—TiN coated tool did not expose its substrate in the scratching process up to a normal load of 45 N, indicating good adhesion of the coating to the substrates. In addition, the nature of the process is also able to demonstrate qualitatively the adhesion between particulates and the binding matrix. In real machining tests, it was observed that the particulates were held very well in TiN matrix under the selected operating conditions.

Hardness and Microstructure of the Workpiece

The circular discs cut from as heat-treated workpieces were prepared for metallographic analysis, and then examined for the consistency of hardness and microstructure from surface to the center for different bars. The hardness was consistent across the circular sections and along the longitudinal direction with an average value of approximately 53 HRC. Further examinations of the microstructures of the pieces demonstrated uniform needle shaped martensite phase with retained austenite, which is in support with the early high hardness observation.

Tool Wear

Tool wear experiments were conducted and tool wear data was collected in accordance with the ISO 3685 standard. According to the standard, the time at which the tool ceases to produce workpieces of desired size and surface quality usually determines the end of useful tool life. In finish hard turning, the end of useful tool life is based on a predetermined deterioration level of machined surface. In this study, the deterioration level was surface roughness pre-determined by conventional grinding process, (Ra)=1.6 µm. To keep consistent surface finish, which can be comparable to general grinding, $V_{bmax}$=0.2 mm, instead of 0.6 mm, is chosen as flank wear evaluation criterion.

Tool flank wear affects the quality of the machined surface significantly. It is closely associated with tool material, geometry, workpiece material, cutting parameters, and dry/wet conditions. Under the chosen cutting conditions, both flank wear and crater wear were observed for the cBN—TiN coated tool inserts. Tool wear started on the flank side. This type of wear appeared to dominate the whole machining process. FIG. 13 shows the typical tool flank wear values for the cBN—TiN coated WC—Co tool inserts. In tool wear measurement, we observed flank wear proceeded in stages: onset of wear, followed by gradual wear, and finally the abrupt stage of wear. A similar observation was reported in the art for other coated carbide tools in machining AISI 4340 steels.

The constant flank wear is attributed to the formation of crater on the rake face. The flank wear up to the ending point was less than 0.2 mm based on selected tool wear criterion ($V_{bmax}$=0.2 mm). The tool life established on the selected flank wear value was measured to be 9 minutes 20 seconds for the cBN—TiN coated tools. Though the machining time of each cutting edge of the cBN—TiN coated tool is not as long as that of PCBN, the accumulated machining time of the four cutting edges is significantly longer than that of PCBN (without regrinding or refurbishing operation to PCBN) under the same conditions.

The wear pattern of CBN—TiN tool inserts, as shown in FIGS. 14 (a) and (b), indicates abrasive wear resulting from rubbing of tool cutting edge and flank with work-piece material during cutting. Crater wear was also observed, which can be attributed to the sliding of chips across the rake face (i.e. the top surface) of the tool. Columnar built-up edge (BUE) was noted for the cBN—TiN coated insert No 3, shown in FIG. 14(c), but had no catastrophic effect on the coating life. The formation of columiar BUE without pull-off of the coating clearly implies that the adhesion between the coating and the substrate is excellent.

The abrasive wear patterns and the consistent progression of the wear of cBN—TiN coated carbide tools reveal that cBN particles are held rigidly in place by the TiN matrix, though the cutting tool-workpiece interface did experience significant heat. However, as previously stated, the cBN—TiN coating has low content of CBN particles, leading to lower thermal conductivity. Without wishing to be bound by theory, we suggest that the heat produced at the interface was partially 'pushed back' to the workpiece and chips, retaining the integrity of the TiN binding phases. Notch wear, which usually degrades surface finish, was not observed for the cBN—TiN coated cutting tools. Further, the cBN—TiN coating did not show delamination or spalling, which is caused by poor adhesion of coating to the substrate, thus reinforces the above findings.

Surface Roughness of Workpiece

Surface roughness is one of the important indices representing the surface integrity of machined parts. In this case, it also serves as the control criteria for tool failure. As known in the art, surface roughness is correlated with tool wear. As machining time prolongs, tool sharpness deteriorates and leads to a degraded surface roughness.

The surface roughness observed from use of the cBN—TiN coated tool inserts, have average values ranging from 1.44 to 1.6 mm (provided in FIG. 15). The measured surface roughness is close to the theoretically estimated value from classical equation, $$h_{CLA} = \frac{f^2}{18\sqrt{3}\,R}$$

(where $h_{CLA}$ is the $R_a$ value, f is the feed, 0.2 mm/rev, R is the nose radius, 0.8 mm), based on the machining parameters and cutting tool geometry used in this investigation.

As stated in the opening paragraph of this example, it is important to note that the present inventive coating on the selected carbide tool inserts produces parts with surfaces equivalent to those produced by a surface-finishing grinding process. Typically, the surface-finishing process though grinding and honing yields surfaces with $R_a$ in a range of 0.1 mm to 1.6 mm.

Ideally, in a single point cutting process, tool-workpiece interface is limited to one spot. Microscopically, for particulates based coating, an array of cBN particles in this case serve as closely spaced and active multi-tip interfaces for materials removal. Though not to be bound or limited by theory, we hypothesize that cutting tools with coarse particles may offer a rougher surface than tools with closely spaced fine particles. If desired, surface roughness can be improved by polishing the cBN—TiN coated tools, tool polishing being a common practice in the tool industry.

The importance of the white layer in chips during hard turning of steels has been recognized in the art. In this study, the focus is on the white layer on machined surface due to its direct impact on the performance of the machined component. To examine the white layer formed in the turning process, samples were prepared by first sectioning a small piece along the circumference of the workpiece, and then mounting in Bakelite mould so as to minimize edge round off. The samples were then polished using 220, 240, and 320 grit SiC papers, followed by fine polishing with 15 μm, 6 μm, and 3 μm diamond suspensions on Buehler Ultrapad and Texmet 2000 polishing cloth. Polishing steps were carried out on an automatic polisher (Buehler ISOMET) using constant downward force of 66.7 N (15 lbf) at constant spindle speed of 90 rpm. The samples were etched using 5% nital solution for approximately 15 sec, and then characterized with a Nikon Epiphot Microscope and SEM, respectively.

From the optical micrograph shown in FIG. 16(*a*), a thin white layer is observable followed by dark region of overtempered layer, indicating that intensive heat was experienced at the workpiece-tool interface due to the high specific cutting energies in the process. The heat is sufficient to result in phase changes in the skin of the machined parts. Because of the rapid cooling from the combined action of conduction (sub-surface as heat sink) and convection (rotation of the workpiece), the white layer consisting of untempered martensite and austenite was formed. SEM micrographs show that the white layer is approximately 1 μm thick. The observed white layer in this study is consistent with that reported for traditional PCBN compacted cutting tools, where a thin white layer and plastic flow were also observed on the machined part of AISI 4340 steel at feed rates higher than 0.15 mm/rev. In addition, sub-surface plastic flow in the circumferential direction of the workpiece was observed, as illustrated in FIG. 16(*b*). The flow was caused by excessive shear associated with the negative rake angle (−5°) and nose radius (0.8 mm) of the tooling in hard turning. To this case, hardness measurement was performed to understand the effect of microstructural changes.

Microhardness can help to identify metallurgical changes in white layers and sub-regions below machined surface. However, it is reported that the hardness reading may vary significantly due to very thin thickness (in the order of a few microns. Despite studies showing increased hardness readings in white layer formed in turning hardened steels, Chou and Evans [34] have reported of approximately the same hardness as bulk material in their investigation on turning of hardened AISI 52100 steel (59~61 Rc). To obtain a reliable measurement of the hardness profile of white layer, it is necessary that the thickness of the layer be sufficiently larger than the indent size. In this study, the thickness of the white layer was characterized as only about 1 μm so that it is almost impossible to get a reliable hardness number by conventional microhardness measurement. Therefore, nanomechanical testing system for hardness measurement was explored.

Steel sample cut from the surface region was prepared to a surface roughness of ($R_a$) 0.002 μm. A nanoindentor (UBI-1, Hysitron Inc.) with Berkovich indenter was used. A load of 500 μN was applied, resulting in a final indentation of 350 nm in diameter, and depth of about 30 nm. FIG. 17 shows load-displacement curves obtained in the white layer and bulk for the hardness measurement, which was 6.84 GPa in white layer and 6.89 GPa in bulk without discernible differences in hardness number. This observation was in agreement with observations reported in the art. One possible explanation for this observation is that, though there was microstructural change in the white layer, the change in microstructures was not significant to lead to any measurable increase in hardness.

In machining hard materials, continuous chip formation is observed at high cutting speeds and low to moderate feed rates, which justifies the needs for cutting tools with chip breakers. However, at higher feed rates "saw-tooth" chips are produced. FIG. 18(*a*) shows a typically similar saw-tooth flow chip for the cutting tools. The chips were heavily burnished with deep color, which indicates that, during cutting with cBN—TiN coated tools, the chips experienced excessive stresses and high heat due to shear. An examination of the polished and etched longitudinal midsection of the chip, shown in FIG. 18(*b*), shows microcracks at the teeth root, intensive shear band, and white layer. The observed white layer at the chips indicates the other important path dissipating the heat produced in the machining process.

cBN—TiN coated tool of the invention has shown superior performance in machining hardened steel (AISI 4340, hardness of 50~53 HRC) in comparison to a conventional TiAlN coated tool typically recommended for hard turning. Table 3 summarizes data of a comparison of a tool life of cBN—TiN coated tool, a TiAlN coated tool, and a PCBN solid compact tool in machining AISI 4340 hardened steel at V=125 m/min, f=0.15 mm/rev, and DoC=0.254 mm.

TABLE 3

Comparison of tool life in machining of
AISI hardened steel, Vbmax = 0.2 mm.

| Tool Insert | cBN-TiN coated tool | TiAlN (PVD) coated tool | PCBN solid compact tool |
|---|---|---|---|
| Tool life, minutes | ~7 | ~18 | ~38 |

Example 4

Synthesis of a MoS2-ZnO metastable phase

The purpose of this example was to mechanically mix nanocrystalline ZnO and MoS2 powders, uniformly, to form a metastable phase. The study involved: procurement and characterization (XRD, SEM) of the nanosized ZnO and MoS2 powder particles; mixing of the nanocrystalline ZnO and MoS2 powders uniformly; and heat treatment of the alloyed powders.

Procurement and Characterization of Process Specific Particles

Nanocrystalline ZnO and MoS2 powder particles were obtained from Alfa Aesar®. Scanning electron microscope (XL30 ESEM, Philips) analysis, data provided in FIG. 19, shows that the ZnO nanoparticles are relatively uniform (FIG. 19a), with average particle size of around 50 nm. MoS2 particles are mostly in rolled sheet shape with average size approximately 700 nm, shown in FIG. 19(b).

MoS2 particles having an APS of 50 nm were desired for the present example. However, MoS2 particles of this size were not available as an off-the-shelf product. MoS2 particles less than 100 nm are available as a custom order but time constraints allowed only for procurement of the off-the-shelf MoS2 particles. Thus, the off the shelf MoS2 particles with average particle size of about 700 nm were used for this example.

X-ray diffraction (XRD, Philips X'Pert dual goniometer; Cu Ka1 line at 1.54059 Å and Ni filter) shows that hexagonal crystal structures dominate the two powders, as shown in FIG. 20, which provides the XRD patterns of a) MoS2 and b) ZnO powder particles. This type of structure is well suited for lubrication applications. MoS2 particles crystallize in the hexagonal structures, in which a sheet of Mo atoms is sandwiched between two hexagonally packed S layers. The crystallite size was estimated to be 14.5 nm (based on full width at half maximum). The bonding within the S—Mo—S is covalent, however, the MoS2 packed "sandwiches" are held by Van der Waals forces, resulting in a weak interplanar interaction. For ZnO particles, their crystallite size was calculated as 11.3 nm. It is very interesting from a physical/chemical point of view due to the mixed covalent/ionic bonding aspects of ZnO. It has an open structure and flexibility to accommodate external atoms as substitutes, which provides ZnO excellent potential for wear and friction control. Also, the addition of a second phase such as ZnO in MoS2 has demonstrated superior lubrication properties for wide temperature ranges.

Several options are available for uniformly mixing these powders. Mechanical alloying is one of the options that not only produces refined structures, but also possibly forms new phases.

Mechanical Alloying of the Application-specific Powders and Analysis

Mechanical alloying is widely used for producing powders with fine microstructures and for alloying materials. It involves two concurrent processes, fracturing of powder particles under collision and cold welding of particles that are continuously impacted by the balls. The combined action of these processes creates new atomically fresh surfaces and minimizes the diffusion distance. A balance between fracturing and cold-welding is essential for a successful mechanical milling or alloying. The specific effect of a ball milling process on powders depends on the physical and chemical properties of the powders, and the environment (vacuum, gaseous, or liquid) in which the operation is conducted. In addition, the temperature experienced by the powders undoubtedly has a profound influence on mechanical milling and alloying process, such as alloying and intermediate phase formation. Also, local surface temperature can be important in adhesion events.

A vibratory mill (8000-D Dual mixer/mill, SPEX CertiPrep) was employed to mill and alloy the powders. In In this system, the balls and powder charges (powder mass) were placed in two vials (hardened steel vial set, 8001, SPEX CertiPrep) with four steel balls (8001B, SPEX CertiPrep, 2 balls of 12.7 mm in diameter, four balls of 6.35 mm in diameter), respectively, which are agitated at a high frequency in a complex cycle and involve motion in three orthogonal directions. The rotational speed of the mill is 1000 rpm, and the amplitude is approximately 50 mm, leading to a very high ball-velocity (on the order of 5 m/s), and consequently an unusually great ball impact force. The maximum kinetic energy from the balls for each impact was estimated to be 0.26 J. Normally, about 5% of the impact energy is absorbed by the powder, the leftover is in the form of heat and taken away by the cooling medium.

In the milling and alloying process of this example, the ambient temperature was kept constant (23° C.). The temperature of the vials was monitored using a reversible liquid crystal temperature label (RLC-80-0/100, Omega® on the outside surface of the vials. It was measured by means of thermal couple and temperature readout. The obtained average temperature was approximately 50° C.

In this study, the following parameters were analyzed: i) the effects of three volumetric ratios of ZnO to MoS2, ii) different milling and alloying times, and iii) milling and alloying environment on the powder particle size and chemical composition. Microstructural refinement and diffusion requirement were the two criteria for determining the optimal process parameters.

Ball Milling of MoS2 and ZnO Powder, Respectively, at Ambient Environment

Experiments with ball milling of MoS2 and ZnO powder were carried out to study the effect of ball-milling induced stress on the peak shift and broadening in XRD characterization. The charge ratio (CR) which is defined as the ball mass over powder mass, for ZnO and MoS2 was approximately 1:1 and 1:3, respectively. The respective powder was milled continuously for 2 hours and characterized using XRD. The time used for the milling is within the range estimated for brittle and ductile materials. FIG. 21 provides the XRD pattern for as-purchased powders (blue line) and ball-milled powders (pink line) of a) MoS2 and b) ZnO. The results showed that the peak shift due to the induced stress exists, with maximum shift of 0.25 and 0.15 degrees (2-theta) for ZnO and MoS2 powder, respectively, as shown in FIG. 21. Peak broadening was observed after ball milling the powders. As seen in FIG.

21, the peak shift of ZnO powder is more than that of MoS2. The calculated crystallite size is 6.23 nm for the milled ZnO, and 12.15 nm for milled MoS2 powder. The reduced crystallite size was obtained after the ball milling.

Ball Milling and Alloying of Powder Mixture ZnO and MoS2 at Ambient Environment

Based on the requirement of MoS2 coverage on ZnO powder and previous published results, powders with volumetric ratios of ZnO to MoS2 (3:1, 1:1. 1:3), and milling/alloying time period of 2 and 5 hours were experimented to investigate the effects in terms of particle size and uniformity of the mixture. Table 4 provides the experimental parameters used for six different test powder mixtures labelled A-F. In each run, 20 ml powder mixture was applied. The resulting mixture could be applied for the follow-up electrostatic spray coating process (ESC) about 140 times (100 mg for each deposition) and coating for 1260 tool inserts in total. Therefore, the amount of powder from each run of milling is adequate for a scaled-up ESC deposition, if desired.

TABLE 4

Powder charge and gaseous operating environment

| Test No. | Volumetric ratio of Zn to MoS2 | Mixing &alloying time, hour | Charge ratio, CR | Gaseous environment |
|---|---|---|---|---|
| A | 3:1 | 2 | 1.52 | Air |
| B | 3:1 | 5 | 1.52 | Air |
| C | 1:1 | 2 | 1.05 | Air |
| D | 1:1 | 5 | 1.05 | Air |
| E | 1:3 | 2 | 0.79 | Air |
| F | 1:3 | 5 | 0.79 | Air |

All the powder samples were analyzed for particle sizes, chemical composition (elemental mapping), and crystal structures using an environmental scanning electron microscope and x-ray diffraction, respectively. In terms of particle size after ball milling and alloying, all the ball-milled and alloyed samples showed feature size of approximately 500 nm, though agglomeration existed. Obtaining milled-powder particles of approximately 500 nm was one of the goals in this feasibility study. In terms of uniformity and diffusion, a powder mixture of 1:1 was better than the other two whether they were milled and alloyed for 2 hours or 5 hours. Therefore, powder mixture of ZnO and MoS2 with ratio of 1:1 was chosen for further investigation.

FIG. 22 is an SEM displaying the typical particle size, approximately 500 nm, of the powder mixture (1ZnO: 1MoS2) after 2 and 5 hours ball milling and alloying. More clusters were observed when the particles were milled for 5 hours than at 2 hours, shown in FIG. 22(b). This phenomenon was also observed for the other powder mixtures used in this investigation, indicating that milling and alloying time of 2 hours would be appropriate for achieving the goals because cold-welding induced clusters became a concern with extended milling. FIG. 23 provides elemental mapping data of milled and alloyed ZnO and MoS2 powder (1:1) for a) 2 hours and b) 5 hours, both in air. Typical elemental mapping indicated that nanosized ZnO particles dispersed uniformly in the matrix of MoS2 particles, as shown in FIG. 23.

XRD characterization of the powder showed that most of the major peaks of ZnO powders in the milled and alloyed powder mixture disappeared, while many of the peaks of MoS2 remained as shown in FIG. 24. FIG. 24 provides XRD patterns of alloyed ZnO and MoS2 powder in volumetric ratio of 1:1 milled for a) 2 hours, and b) 5 hours, both in air. However, they are not in exactly the same position as MoS2. In addition, no major broadening peaks appeared at around 20° (2-theta). Thus the possibility of conversion of crystal structure to amorphous was excluded. The above observation was true for the powder mixture E and F. But for powder mixture of A and B, all the major peaks of ZnO still existed. No discernible peak shift was observed except for a slight peak broadening due to the absorption of mechanical energy from the impact of the balls, indicating that the powder mixtures A and B were ZnO rich. Taking the stress-induced peak shift (less than 0.3° in 2-theta) into consideration and the fact that ball milling of nanosized ZnO powder did not cause any loss of peaks except for the observed slight peak broadening (discussed above), it is believed that the formation of a compound containing Zn, Mo, O, and S (may not be exactly stoichiometry) happened on the powders in the ball milling and alloying process. To confirm the formation of the compound, further in-depth investigation using tribo-chemical analysis as a function of cutting tool (substrate) temperature will be needed.

Ball Milling and Alloying of Powder Mixture of ZnO and MoS2 (1:1) at Dry N2 Environment The powder mixture of specific volumetric ratio was prepared in a glove box (Labconco) filled with dry nitrogen and milled and alloyed for two 2 and 5 hours, respectively. The milled and alloyed powders were characterized using SEM and XRD for chemical composition and crystal structures. FIG. 25 is elemental mapping data of milled and alloyed ZnO and MoS2 powder (1:1) for a) 2 hours and b) 5 hours, in N2. Compared to the elemental mapping results from the powder prepared in air, it was found that the mixing was more uniform in the N2 environment (compare FIGS. 23 and 25). The uniformity is indicated by the similarity of patterns of the other elements (Zn, O) to that of S and Mo (FIG. 25). In terms of the effect of oxygen on the process, powder mixture prepared in dry N2 environment did not show significant difference from that in air. FIG. 26 provides XRD patterns of milled and alloyed ZnO and MoS2 powder (1:1) for a) 2 hours and b) 5 hours, both in N2. In accordance to the XRD results (FIG. 26), compared to the powder milled and alloyed in air, a peak shift was observed for the powder milled in air at milling period of 2 hours. However, no XRD peak shift was observed fro the powders prepared in air and N2 fitted for a milling period of 5 hours. Therefore, to achieve required microstructual size and dispersion uniformity the following parameters are preferred: powder ratio of ZnO to MoS2 of 1:1, milling and alloying time of 2 hours, and N2 gaseous environment.

Heat Treatment of the Ball-milled and Alloyed Powder in Air and Dry Nitrogen

Heat treatment of the milled and alloyed powders (ZnO/MoS2, 1:1) was carried out in a Fisher scientific Isotemp® muffle furnace (Model 58, cat. No. 10-750-58), which has a PID microprocessor control at operating temperature up to 1125° C. (2057° F.). This furnace is also equipped with a ⅜" gas inlet for heating in an environment other than air. The heat treatment was performed at the conditions listed in Table 5. The powder sample was placed in an alumina boat obtained from VWR. Dry nitrogen was used, when needed, with a flow rate of 0.02832 m3/h (2 SCFH). For heating the sample in nitrogen, dry nitrogen gas flow was geared to purge any air inside the furnace before the sample was placed inside the furnace. This process lasted for 75 minutes.

The determination of the temperature was based on the intended applications, starting oxidation temperature of MoS2, and the possible temperature to form metal molybdates. The heated powder samples were characterized using EDS mapping for chemical composition and XRD for phase analysis.

TABLE 5

Temperature and gaseous environment for the powder heat treatment

| Powder sample | Temperature, °C. | Gaseous environment |
|---|---|---|
| ZnO/MoS2 (1:1 | 250 | Dry Air |
| ZnO/MoS2 (1:1 | 250 | Dry N2 |
| ZnO/MoS2 (1:1 | 375 | Dry Air |
| ZnO/MoS2 (1:1 | 375 | Dry N2 |
| ZnO/MoS2 (1:1 | 500 | Dry Air |
| ZnO/MoS2 (1:1 | 500 | Dry N2 |
| MoS2 | 500 | Dry Air |

In terms of chemical composition, analysis results from the powder heated in dry N2 environment did not show significant difference from that heated in dry air, except for relatively higher oxygen content present in the powder. Without wishing to be bound by theory, this could be explained by the agitated heat convection induced by N2 gas flow, leading to the activation of the oxygen from the residual air affiliated to the liner of the furnace. However, no difference in the XRD patterns was observed between the powders from two different environments. FIG. 27 is EDS mapping data of ball-milled/alloyed powder of ZnO and MoS2 (1:1) heated at: a) 250° C., b) 375° C., and c) 500° C. As shown in FIG. 27, with the increase of temperature, the oxygen was also increased, indicating two possibilities: 1) oxidization (formation of $MoO_3$) initialized in the heat process; or 2) formation of compounds such as $ZnMoO_2S_2$ or $ZnMnO_4$. According to the EDS mappings results, the mapping of Mo and Zn were more consistent with O than with S, inferring a high possibility of the formation of $ZnMnO_4$ below 500° C.

FIG. 28a-28c provides XRD patterns of ball-milled and aloyed powder of ZnO and MoS2 (1:1) heated at: a) 250° C., b) 375° C., and c) 500° C. In comparison to the XRD patterns from the ball-milled and alloyed powder (1ZnO: 1MoS2), the peaks from the heated powders at 250 and 375° C. shifted slightly to the left side, shown in see FIGS. 28(a) and 28(b), indicating the effect of ball milling-induced stress did exist in the powders. At the same time, XRD patterns also showed that there was no oxidation happening in the powder heated at 250 and 375° C., respectively. This conclusion is consistent with the conclusion on the formation of Zn and Mo compounds (the peak concurs with that existing peaks), rather than oxidization, drawn early in this section. However, at 500° C., oxides such as $MoO_3$ were observed by XRD analysis, as shown in FIG. 28(c). XRD characterization of MoS2 powder heated at 500° C. also illustrated asimilar pattern. Therefore, in terms of heat treatment of the powder, a temperature of around 400° C. in air is beneficial.

Example 5

Deposition of Nanoparticles in Combinations of $MoS_2$ and ZnO by Electrostatic Spray Coating For powder particles of reduced size, fluidization is helpful for a continuous and uniform powder particle delivery. Since the ZnO and $MoS_2$ powders used in this investigation are ultrafine particles, it was originally thought that it would be necessary to fluidize the mechanically alloyed powders so as to break the large clusters possibly formed in the alloying process for better fluidity and uniform coating. However, it was found that the ZnO and MoS2 and their alloyed powder flowed continuously and smoothly from the powder sources with the assistance of the customized powder delivery pump. The powder particles are charged in the same electric polarity in this corona charging setup. The same sign of polarity helps to repel particles tending to aggregate for minimized surface energy. A uniform deposition was achieved without the fluidization of the powders.

Optimization of ESC for Deposition of Mechanically Allowed ZnO and $MoS_2$ Powders As discussed, many factors including the physical properties of the powder materials and process parameters affect the deposition in an ESC process. At a specified deposition condition, the outputs for this process are usually coating thickness, coating uniformity, pores, and particulate clusters. Coating uniformity refers to the thickness variation across the surface of a substrate (e.g., tool insert), and the variation from substrate to substrate (e.g., sample to sample).

Some of the important process parameters are electrical voltage applied to the electrode, distance between the electrode and (electrically) grounded tool insert, and air pressure. Based on the early experiments carried out for this feasibility study, it was found that electrical voltage and the distance affect the process influentially, and the other parameters are of much lesser importance. In addition, in many cases, uniform deposition occurred at the process window of electrical voltage from −75 to 45 kV, and of distance from 100 to 200 mm. This early observation is consistent with that observed from the ESC deposition of other ceramic materials. Therefore, the optimization of the process was carried out within this window.

To optimize these parameters in accordance with the criteria of 1) controlling the thickness, and 2) achieving uniformity across the substrate, the Taguchi method, a well-established experimental design approach, was implemented. The control factors were gun voltage (A) and substrate (tool insert)-electrode distance (B), which are considered as three levels of change (Table 4). The responses were coating thickness and its variation. Taking their interactions into consideration, an orthogonal array $L_9$ ($3^4$) was used for the optimizing process as listed in Table 6.

TABLE 6

Control factors and their levels

| No. | Control Factor | Level 1 | Level 2 | Level 3 |
|---|---|---|---|---|
| 1 | A (electrical voltage), kV | −45 | −60 | −75 |
| 2 | A (electrode-substrate distance), mm | 100 | 150 | 200 |

TABLE 7

$L_9$ ($3^4$) orthogonal array set

| Experimental No. | A | B | A × B | A × B |
|---|---|---|---|---|
| 1 | 1 | 1 | 1 | 1 |
| 2 | 1 | 2 | 2 | 2 |
| 3 | 1 | 3 | 3 | 3 |
| 4 | 2 | 1 | 2 | 3 |
| 5 | 2 | 2 | 3 | 1 |
| 6 | 2 | 3 | 1 | 2 |
| 7 | 3 | 1 | 3 | 2 |
| 8 | 3 | 2 | 1 | 3 |
| 9 | 3 | 3 | 2 | 1 |

The test parameters and their arrangement are shown in Table 6. A repetitive ESC deposition at the same conditions was arranged. Two pieces of carbide tool inserts [SNMA 433A (VC 831)] were used for each deposition. All the tool inserts were thoroughly cleaned by following a standard procedure using an ultrasonic cleaner starting with soft detergent cleaning, followed by deionized water cleansing, then by acetone cleaning, and drying before their deposition. In each deposition, 100 mg of alloyed powder of ZnO and $MoS_2$ (volumetric ratio 1:1) was used. The main air pressure was kept constant at 207 kPa (30 psi) in light of the early experimental study for this project. The deposition was set in only 2 seconds, which is one of the unique features of this technology. For the coating thickness and the uniformity measurement, three spots across the same tool insert (substrate) were imaged (1000×) using an ESEM (XL30, ESEM, Philips, University of Arkansas). Coating thickness (T) and its variation (Δ) were then measured three times at different positions on the image for minimized measurement errors. The measured coating thickness and variation are also listed in Table 8. For 100 mg feed alloyed powder of ZnO and $MoS_2$ (1:1), the achievable maximum coating thickness could be 15 microns (9 samples), which is desirable for cutting tools. A thick coating, if needed, can be achieved by increasing the feed powder mass accordingly.

TABLE 8

List of the parameters for ESC deposition and their responses

| Expt No. | Electrical voltage | Electrode-substrate distance | Test 1 T, μm | Test 1 Δ, μm | Test 2 T, μm | Test 2 Δ, μm |
| --- | --- | --- | --- | --- | --- | --- |
| 1 | 45 | 100 | 8.64 | 1.0 | 8.58 | 2.2 |
| 2 | 45 | 150 | 12.81 | 1.4 | 13.95 | 1.7 |
| 3 | 45 | 200 | 8.12 | 3.3 | 7.59 | 1.4 |
| 4 | 60 | 200 | 12.65 | 2.8 | 12.96 | 1.7 |
| 5 | 60 | 150 | 15.43 | 2.8 | 14.26 | 3.5 |
| 6 | 60 | 100 | 12.04 | 0.2 | 11.98 | 0.0 |
| 7 | 75 | 100 | 12.5 | 2.1 | 11.27 | 1.7 |
| 8 | 75 | 150 | 13.95 | 1.0 | 13.89 | 2.4 |
| 9 | 75 | 200 | 11.11 | 2.5 | 10.28 | 2.7 |

Standard analysis of variance (ANOVA) was carried out, and the results are provided in Tables 7 and 8. In term of coating thickness, it was observed that the effects from the distance and voltage are significantly greater than the interaction effects. However, it is shown that, as far as the coating variation is concerned, the interaction effect of electrical voltage and distance on coating thickness variation plays far more influential role than the distance and voltage.

TABLE 7

ANOVA - coating thickness

| Sources | Degree of freedom (DF) | Sum of squares (SS) | Mean sum of squares (MS) | F, ratio of $MS_{source}$ to $MS_{error}$ |
| --- | --- | --- | --- | --- |
| A | 2 | 33.47 | 16.73 | 57.37 |
| B | 2 | 48.88 | 24.44 | 83.78 |
| A × B | 4 | 6.21 | 1.56 | 5.32 |
|  | 9 | 2.63 | 0.29 |  |

TABLE 8

ANOVA - coating thickness variation

| Sources | Degree of freedom (DF) | Sum of squares (SS) | Mean sum of squares (MS) | F, ratio of $MS_{source}$ to $MS_{error}$ |
| --- | --- | --- | --- | --- |
| A | 2 | 0.22 | 0.11 | 0.22 |
| B | 2 | 0.61 | 0.30 | 0.61 |
| A × B | 4 | 10.91 | 2.73 | 5.43 |
|  | 9 | 4.52 | 0.50 |  |

Effects of Electrical Voltage and Electrode-substrate Distance

The effects of electrical voltage and electrode-substrate (tool insert) distance on coating thickness are shown in FIG. 29. With an increase of gun voltage from 45 kV to 60 kV, coating thickness tends to increase, so it can be concluded that 60 kV offers higher powder transfer efficiency than the other two voltage levels tested. However, coating thickness decreases as the gun voltage continues to increases, so it can be concluded that 60 kV offers higher powder transfer efficiency than the other two voltage levels. The same trend was observed for the effect of electrode-substrate distance, with 150 mm as a turning point. When distance was at 100 mm, the powder particles with relatively high velocity may bounce back, leading to low deposition efficiency. However, if the distance is too far from the electrode, for example, 200 mm, electrostatic field is weaker than that around the near field of the electrode, also yielding low deposition efficiency. In addition, the effect of buoyancy on the particles offsets their tracks toward the substrate. All these factors contribute to the relatively small thickness of coating at distance of 100 and 200 mm.

As far as coating thickness variation across the same tool insert is concerned, voltage and electrode-substrate (tool insert) distance do not affect it significantly, as indicated in FIG. 30.

Interaction Effect of Electrical Voltage and Electrode-substrate Distance

As shown in FIG. 31, for all levels of electrical voltage, coating thickness at distance of 150 mm is more than that at other two distances. Obviously, the interaction effect of electrical voltage and the distance on coating thickness is not as significant as themselves. It can be concluded that, if obtaining maximum coating thickness for specific products is the goal of optimization, the optimized process parameters will be: electrical voltage: −60 kV, electrode-substrate (tool insert) distance: 150 mm. A typical deposition under this condition is shown in FIG. 32.

If the coating thickness variation is of interest, the interaction effects of the two control factors on the coating thickness variation are significant (FIG. 33). If both coating thickness and its variation are the focus, then the optimized process parameters are: electrical voltage: −75 kV, electrode-substrate distance: 150 mm. At this deposition condition, the coating formation had almost the same thickness as that deposited at the above condition (−60 kV and 150 mm). However, its uniformity is slightly better (FIG. 34).

Deposition Uniformity

This study was designed to check the thickness variation across the same tool inserts and from tool insert to sample. Nine pieces of carbide tool inserts [SNMA 433A (VC 831)] with dimensions of 12.5×12.55 $mm^3$ were configured as in FIG. 35. The spacing between the samples was 5 mm uniformly across all the samples. The powder feed mass was 100 mg. The coating was deposited at the following optimized conditions: electrical voltage, −60 kV, electrode-substrate distance, 150 mm, and main pressure for carrier gas (dry air), 207 kPa (30 psi).

The coating thickness and its variation for samples 1, 5, 9, 4, and 3 were examined under a scanning electron microscope (SEM, Hitachi, model S-2300, Arkansas Analytical Laboratories). The coating thickness for each sample was measured in three repeated experiments at three different points.

Uniformity at a Typical Location of the Same Tool Insert

Thickness measurement was made on the SEM images taken from a typical position of tool inserts (1,5,9,4,3). Results indicated that, at a typical location, that thickness variation was less than 1 micron.

Uniformity of Various Locations of the Same Tool Insert

SEM images were taken at three different positions of the same tool insert for measuring thickness variation. The measured change of thickness is shown in Table 9.

TABLE 9

Coating thickness variation (avg thickness 14 mm)

| Tool inserts | Thickness variation, mm |
| --- | --- |
| 1 | 1.2 |
| 5 | 0.8 |
| 6 | 0.9 |
| 4 | 1.1 |
| 3 | 0.7 |

Uniformity from Tool Insert to Tool Insert

The measured coating thickness variation from tool insert to tool insert is illustrated in FIG. 36. A maximum variation of coating thickness of 1.5 mm (average thickness=14 mm) was observed from tool insert to tool insert.

Variation between inserts at different locations in the coating region was somewhat larger than the variation at different locations on the same insert but this can be addressed by using multiple spray guns or by using more specifically defined coating regions.

FIG. 37 illustrates the change of transfer efficiency (defined as the ratio of effective deposition to the feed powder mass from powder sources) with electrical voltage. The transfer efficiency was calculated based on the measurement of mass difference before and after deposition using a balance of high repeatability (0.001 g). According to the results, voltage of 60 kV yielded the highest transfer efficiency in terms of the three levels of voltage used in this investigation. This observation is consistent with the results obtained in process parameters optimization in terms of coating thickness.

Phase, Structural, and Chemical Analysis of the Coating of Mechanically Alloyed and Annealed Powder on Tool Inserts In addition to the characterization of coating thickness, coating thickness variation using scanning electron microscope (ESEM/SEM, Philips/Hitachi, XL 30/model S-2300, Arkansas Analytical Laboratories), x-ray diffraction (XRD, Philips X'Pert dual goniometer; Cu Kα1 line at 1.54059 Å and Ni filter) was used to determine the crystal structures of the deposition, and energy-dispersive x-ray spectroscopy (EDS, Philips ESEM) was applied for the chemical composition of the deposition. FIG. 38 illustrates the XRD results. The peaks and their position are consistent with the alloyed powder. However, two WC peaks were observed in the pattern. A possible explanation is that the scanning beam was right on the pores among the powder particles or clusters.

FIG. 23 illustrates the element mapping of the deposited powder. Clearly, the mapping of Zn and O elements follow the configuration of S and Mo elements, which indicates that the nanosized ZnO powder particles are uniformly dispersed in the $MoS_2$ matrix. According to the element mapping of W, there were some bright areas indicating that potion of the tool inserts was not fully covered by the coating or where pores were located. The pores have a size of 2~3 microns. The pore size can be reduced if desired, for example, through the use of smaller MoS2 particles. A close SEM examination of the coating shows that the deposition has mixed features of discrete particle and clusters.

Example 6

Synthesis of cBN—TiCN Hard Coating on WC—Co Tool Inserts

The purpose of this example was to develop a novel class of coating for hard turning cutting tool applications, specifically to develop a cubic boron nitride-titanium nitride (cBN—TiCN) micro-particulate composite coating using a combination of electrostatic spray coating (ESC) of cBN powder and chemical vapor infiltration (CVI) of TiCN into a porous bed of cBN coating. A first step was to develop of the physical setup and establishment of process parameters for the CVD of TiCN.

An open flow hot-wall CVD system was used for the process and its flow characteristics were studied to optimize the coating. The gas ratios were varied from the selected baseline to observe its influence on the coating characteristics. The fixturing of the substrates was altered to improve the uniformity of the coating. The linear velocity of the gas was adjusted to reduce the boundary layer and control the deposition rate. Characterization of the developed coating was carried out leading to an optimized coating for machining tests, within the scope of this research. The flow rate of the gases was controlled before entering the furnace using float-type flowmeters. The hot wall CVD deposition reactor for the CVD of TiCN coating was a Lindberg horizontal resistance tube furnace consisting of a ceramic (alumina/mullite) furnace tube, with water-cooled end flanges at both ends. For the deposition of TiCN, the precursor liquid used was $TiCl_4$ with a small amount (~10%) of $CCl_4$. Temperature profiles for the furnace were carried out at 700, 800, 900, and 1000° C. The reaction zone was selected within the length where the temperature would be close to the set temperature of the furnace. All experiments were carried out at 1 atmospheric pressure. The reaction gases exiting from the CVD furnace were routed through suitable plumbing into a scrubber system where they were diluted and neutralized by a water shower containing 5% caustic soda solution. The scrubbed gases (mostly excess hydrogen and unreacted nitrogen) were then exhausted to the atmosphere.

The adhesion and to a certain extent also the morphology of the coating is determined by interface between the CVD deposit and the substrate. The inserts were ultrasonically cleaned for 10 minutes using isopropyl alcohol and dried under the flow of hot air. The thickness of the coating was calculated using gravimetric analysis by measuring the weights of the inserts before and after the deposition experiments.

The baseline data for the experiments used for optimizing the equipment during the first few experiments were set at $H_2/TiCl_4=64$ and $N_2/TiCl_4=43$. The duration for the experiments was 1 hour and total flow was 1.2 slpm. The baseline parameters for initial experiments were successful in determining the optimal coating conditions.

In this study, the aim was to produce a composite coating of uniform thickness of 15-20 mm. With this in mind, three different cBN layer thicknesses were selected for study: 5, 10 and 15 mm. Tool inserts of simple geometry (SNMA-432, CNMA-432) were ESC-coated with a porous cBN coating, which were then used for coating trials. Some of the cBN-coated tools were also coated at Valenite® using an optimized TiN coating CVD process.

Three different gas flow rates were investigated, in order to study the effect of total flow rate on coating thickness uniformity over the length of the deposition zone. These were: 50, 100 and 200 cm/min at standard temperature (300K) and pressure (1 atm.). These values have been used to set the initial flow parameters from which to develop the optimized process conditions. A low flow velocity can cause depletion of precursors downstream, and a high velocity can prevent adequate coating formation leading to significant thickness non-uniformity. Given the target cBN coating thickness range of 10-15 μm, it was observed that a deposition time of 1 hour at a linear velocity of 50 cm/min is adequate.

Initially, the deposition temperature was kept constant at 1000° C. However, at this temperature, a high deposition rate was observed at various precursor concentration ratios. Typical deposition rate for CVD coatings in tool reactors is on the order of 1-2 mm/h. At 1000° C., deposition rates were considerably higher (10-18 mm/h), approaching almost an order of magnitude greater value. Therefore, in the matrix of experiments conducted, temperature was also investigated as a variable, in the range of 700-1000° C.

To develop a suitable set of coating conditions for the current setup, a matrix of experiments was conducted using the following parameters: four different temperatures (700, 800, 900 and 1000 degrees C.), and using three different gas ratios (for the H2/TiCl4 gas, ratios tested were 58, 64 and 70; for the N2/TiCl4 gas, ratios tested were 50, 43 and 38). For the 10 experiments of test matrix, the following were held constant: linear gas velocity of 50 cm/min, bubbler temperature of 35 degrees C., and duration of 1 hour.

The growth rate as a function of deposition temperature was plotted and is shown in FIG. 40. A trend appears to emerge in the deposition behavior in that it appears the deposition mechanism might be changing at 900° C., based on a sharp change in the slopes of the Arrhenius plots. The slopes suggest that, above this temperature, mass transport is rate-limiting, while below this temperature, surface kinetics controls the process. Assuming that this is a real trend, apparent activation energies were calculated for the two regimes, as shown in Table. The activation energy of deposition process, under ideal conditions, is not a function of precursor concentration, unless reaction kinetics play a strong role. The calculated values of Q clearly show the strong influence of gas ratios; this dependence is also manifested in other properties.

X-ray Diffraction (XRD) analysis technique was used to identify the composition of the coating, and its preferred orientation since the orientation and texture of a coating plays a role in determining its characteristics and machining performance. CVD coatings typically exhibit a strong texture, when long, columnar grains are formed during deposition. FIG. 41 shows the X-ray diffraction graph of the cBN—TiCN coated insert.

The C/(C+N) ratio was calculated using a procedure developed at Valenite®, Inc., Madison Heights, Mich. (Jagner, 1990). The lattice parameter can be obtained by combining Bragg's Law, with the equation of the lattice parameter.

$$d_{hkl} = \frac{a_o}{\sqrt{(h^2 + k^2 + l^2)}}$$

The calculated values of C/(C+N) ratio, based on the lattice parameter determined from the matched $TiC_xN_y$ peak positions, ranged from 0.35 to 0.65.

The texture coefficient is a normalized indicator of preferred orientation, with respect to the random powder pattern and was measured by the equation of Barret and Masalski, 1980, known in the art. The Texture Coefficient ($TC_{220}$) values ranged from 2.73 to 4.5.

The tool samples were examined by optical and scanning electron microscopy, to study the morphology of the deposited coating, as well as for the study of microstructure of the cross-section of the coated tools. In addition, selected samples were also analyzed using the energy-dispersive X-ray spectrometry (EDS) to determine the composition and distribution of certain elements in the coating. These studies also allowed a preliminary determination of the coating morphology, and "grain" size.

One of the expected outcomes (based on previous studies on TiN) was the likelihood of formation of icosahedral crystal morphology in TiCN. The tendency of TiN, TiCN and other cubic phases to exhibit a five-fold symmetry around the zone axis has been observed by several researchers, and these crystals are now termed as "quasi-crystals." In several of our experiments, we observed the five-fold crystal morphology, which manifests itself in the form of a 5-pointed star shape. The SEM photograph (FIG. 42) shows the surface morphology of $TiC_xN_y$ coating, deposited on a cemented carbide tool insert having the faceted crystal morphology, some with icosahedral geometry. The samples previously coated with ESC-cBN were included in the deposition tests to show that individual cBN particles or particle clusters can be effectively coated by CVD in the deposition apparatus in consideration (FIG. 43).

Metallography analysis was conducted in order to determine the thickness and uniformity of the coating. The mounts were prepared using a standard procedure from Buehler™. The micrographs show that the coating in the samples was fairly uniform. The thicknesses of the coatings observed was in the range of 12-15 microns (FIG. 44). The cracks in the coating are due to the stress developed in the coating arising from difference in the coefficient of thermal expansion of the coating and the substrate. Cracks could also have been caused in the preparation of the mount for metallography.

The microhardness measurements were conducted using a Knoop indenter and 100 gf load on the coated samples. The microhardness of the coating, observed is >2500 HK confirming the formation of TiCN.

Deposition was carried out on a set of tool inserts using selected deposition parameters based on the results of deposition rate and texture. These tools were previously coated with 10 and 15 microns thick cBN coating. The optimized parameters for coating were: deposition temperature=900° C., linear gas velocity=50 cm/min, $H_2/TiCl_4$=64 and $N_2/TiCl_4$=43 and duration=1 hour. Some of the cBN-coated tools from this set were also coated at Valenite®, using an optimized TiN and TiCN processes, to be used as a benchmark for machining. Tools from both the sources having same cBN coating thickness of 10 microns were examined. Some machining tests were carried out with 15 microns cBN coating. The machining parameters used for the analysis are: Speed=46 m/min, Feed rate=0.15 mm/rev, Depth of Cut=0.76 mm/rev. The results are shown in FIG. 45.

A significant result from this study is that the wear rate of the experimental tools is similar to the optimized tool, although the initial amount of wear at the start of the test is higher in all cases. None of the TiCN-coated tools exhibited delamination of the coating, indicating acceptable adhesion. While the experimental TiCN-coated tools did not perform as well as the optimized tool, this is neither surprising nor discouraging.

The final gas velocity was selected as 50 cm/min with gas ratio $H_2/TiCl_4=64$, and $H_2/TiCl_4=43$, to improve the uniformity of the coating and reduce the boundary layer thickness. The temperature was varied from 1000° C. to 800° C. The deposition rate at these conditions was in the desired range of 12-15 μm/hour and was selected as the optimum coating conditions to be used for infiltration of cBN coated tools followed by machining tests which showed a comparable tool wear rate to that of an optimized coating process.

While the illustrative embodiments of the invention have been described with particularity, it will be understood that various other modifications will be apparent to and can be readily made by those skilled in the art without departing from the spirit and scope of the invention. Accordingly, it is not intended that the scope of the claims appended hereto be limited to the examples and descriptions set forth herein but rather that the claims be construed as encompassing all the features of patentable novelty which reside in the present invention, including all features which would be treated as equivalents thereof by those skilled in the art to which this invention pertains.

We claim:

1. A coated article comprising a substrate having a composite layer formed thereon,
    wherein said composite layer comprises an outer surface having a texture comprising a periodic distribution of protrusions, wherein each of said protrusions is between 0.01 micrometer and 50 micrometers,
    wherein said composite layer comprises a base phase and an infiltrate phase, said base phase contacting said substrate and comprising at least one of the group consisting of silicon, nitrides, steel, carbonitrides, borides, sulphides, chalcogenides, oxides, and silicides, and said infiltrate phase comprising at least one of the group consisting of diamond, silicon, nitrides, carbides, steel, carbonitrides, borides, sulphides, chalcogenides, oxides, and suicides.

2. The coated article of claim 1, wherein the base phase comprises a nitride and the infiltrate phase comprises a nitride different than the nitride of the base phase.

3. The coated article of claim 2, wherein the base phase comprises cubic boron nitride.

4. The coated article of claim 1, wherein the base phase comprises cubic boron nitride, and the infiltrate phase comprises at least one nitride of the group consisting of titanium nitride, titanium carbonitride, and titanium aluminum nitride.

5. The coated article of claim 1, wherein said outer surface of the composite layer has deposited thereon an overlay comprising at least one of the group consisting of nitrides, carbides, steel, carbonitrides, borides, sulphides, chalcogenides, oxides, silicides, polytetrafluoroethylene, and any combination thereof, wherein at least the endmost region of each protrusion is free of said overlay.

6. The coated article of claim 1, wherein the coated article is a tool comprising a work surface, and wherein the work surface is the substrate.

7. The coated article of claim 6, wherein said base phase comprises a nitride and said infiltrate phase comprises a nitride different than the nitride of the base phase.

8. The coated article of claim 7, wherein the base phase comprises cubic boron nitride.

9. The coated article of claim 7, wherein the base phase comprises cubic boron nitride, and the infiltrate phase comprises titanium nitride, titanium carbonitride, and titanium aluminum nitride.

10. The coated article of claim 7, wherein said outer surface has deposited thereon an overlay comprising at least one of the group consisting of nitrides, carbides, steel, carbonitrides, borides, sulphides, chalcogenides, oxides, suicides, polytetrafluoroethylene, and any combination thereof, wherein at least the endmost region of each protrusion is free of said overlay.

11. The coated article of claim 10, wherein said outer surface has deposited thereon an overlay comprising at least one of the group consisting of $MoS_2$, ZnO, polytetrafluoroethylene (PTFE), a combination of $MoS_2+ZnO$, a combination of $PTFE+MoS_2$, and a combination of $PTFE+ZnO_2A_1S_2$, and any combination thereof, wherein at least the endmost region of each protrusion is free of said overlay.

12. The coated article of claim 11, wherein said tool is a metal machining tool.

13. A coated article comprising a substrate and a coating, said coating comprising individually-over-coated particles, the individually-over-coated particles having an average particle size of less than 1 micron and the individually-over-coated particles comprising base particles coated with supplement particles,
    wherein said base particles comprise at least one of the group consisting of nitrides, carbides, steel, carbonitrides, borides, sulphides, chalcogenides, oxides, and suicides, and
    wherein said supplement particles comprise at least one of the group consisting of nitrides, carbides, steel, carbonitrides, borides, sulphides, chalcogenides, oxides, and silicides.

14. The coated article of claim 13, wherein said article is a particle.

15. The coated article of claim 13, wherein said coating comprising individually-over-coated particles has a textured outer surface.

16. The coated article of claim 13, wherein said article is a tool, and wherein said base particles are ZnO and said supplement particles are $MoS_2$.

17. The coated article of claim 13, wherein the base particles are coated with a continuous layer of supplement particles.

18. The coated article of claim 13, wherein the base particles are coated with a discontinuous layer of supplement particles.

19. The coated article of claim 13, wherein the base particles are coated with multiple layers of supplement particles.

20. The coated article of claim 13, wherein the coating comprises more than one type of individually-over-coated particle.

21. A coated article comprising a substrate having a composite layer formed thereon,
    wherein said composite layer comprises an outer surface having a texture comprising a periodic distribution of protrusions, wherein each of said protrusions is between 0.01 micrometer and 50 micrometers,
    wherein said composite layer comprises a base phase and an infiltrate phase, said base phase contacting said substrate and comprising at least one of the group consisting of diamond, silicon, nitrides, carbides, steel, carbonitrides, borides, sulphides, chalcogenides, oxides, and suicides, and said infiltrate phase comprising at least one of the group consisting of, silicon, nitrides, steel, carbonitrides, borides, sulphides, chalcogenides, oxides, and suicides.

* * * * *